(12) United States Patent
Chen et al.

(10) Patent No.: US 10,400,547 B2
(45) Date of Patent: Sep. 3, 2019

(54) METHODS FOR ANALYZING AND DESIGNING BOTTOM HOLE ASSEMBLIES

(71) Applicant: Smith International, Inc., Houston, TX (US)

(72) Inventors: Wei Chen, Spring, TX (US); Yani Dong, Beijing (CN); Richard Harmer, Surrey (GB); Yuelin Shen, Spring, TX (US); Sujian Huang, Beijing (CN)

(73) Assignee: SMITH INTERNATIONAL, INC., Houston, TX (US)

(*) Notice: Subject to any disclaimer, the term of this patent is extended or adjusted under 35 U.S.C. 154(b) by 1029 days.

(21) Appl. No.: 14/252,726

(22) Filed: Apr. 14, 2014

(65) Prior Publication Data
US 2014/0309978 A1    Oct. 16, 2014

Related U.S. Application Data

(60) Provisional application No. 61/811,507, filed on Apr. 12, 2013.

(51) Int. Cl.
*E21B 10/00* (2006.01)
*E21B 41/00* (2006.01)
*E21B 44/00* (2006.01)

(52) U.S. Cl.
CPC .......... *E21B 41/00* (2013.01); *E21B 10/00* (2013.01); *E21B 44/00* (2013.01)

(58) Field of Classification Search
CPC .......... E21B 41/00; E21B 10/00; E21B 44/00
USPC .......................................................... 703/7
See application file for complete search history.

(56) References Cited

U.S. PATENT DOCUMENTS

| | | |
|---|---|---|
| 6,516,293 B1 | 2/2003 | Huang et al. |
| 6,785,641 B1 | 8/2004 | Huang |
| 6,873,947 B1 | 3/2005 | Huang et al. |
| 7,020,597 B2 | 3/2006 | Oliver et al. |
| 7,139,689 B2 | 11/2006 | Huang |
| 7,464,013 B2 | 12/2008 | Huang et al. |
| 7,693,695 B2 | 4/2010 | Huang et al. |
| 7,844,426 B2 | 11/2010 | Huang |
| 7,953,586 B2 * | 5/2011 | Chen .................. E21B 7/00 175/45 |
| 8,401,831 B2 | 3/2013 | Tang et al. |
| 9,482,055 B2 | 11/2016 | Huang |
| 2004/0143427 A1 | 7/2004 | Huang et al. |
| 2005/0197777 A1 | 9/2005 | Rodney et al. |

(Continued)

OTHER PUBLICATIONS

International Search Report and Written Opinion issued in corresponding International Application No. PCT/US2014/034053, dated Aug. 18, 2014 (20 pages).

(Continued)

*Primary Examiner* — Saif A Alhija

(57) ABSTRACT

A method for selecting a bottomhole assembly, including performing a first dynamic simulation of a first bottomhole assembly, performing at least a second dynamic simulation of the first bottomhole assembly, in which the at least a second dynamic simulation includes a different constraint than the first dynamic simulation, and outputting results for both the first dynamic simulation and the second dynamic simulation, in which the results include at least one output showing performance as a function of position along the bottomhole assembly.

22 Claims, 104 Drawing Sheets

Simulation Capabilities

| Drilling, Reaming | Objective | Modeling Factors |
|---|---|---|
| 1. Cutting Tool Design/Selection | Stability (Vibrations) | Cutting Structures: PDC Bits, RC bits, BI-Center Bits, Reamers, etc.<br>Power Tools: Straight hole Motor, Straight hole Turbine |
| 2. BHA Optimization | Steerability | Steering Tools: Steerable Motor, Steerable Turbine, Push the Bit RSS, Point the Bit RSS, Hybrid Push-Point RSS |
| 3. Drilling Parameter Map | Efficiency (ROP) | Tubulars: DP, HWDP, DC, Flex Joints<br>Stabilizing Tools: 3D Stabilizers, Roller Reamers, VDS<br>Speciality BHA Tools: AST, Shock Sub, Hydra Thrust |
| 4. Drilling Trouble Shooting | Durability | Operating Parameters: WOB, RPM(Constant or Varying)<br>Drilling Mode: Sliding, Rotating, Steering, Neutral, Backward/Forward Reaming, Rotating off bottom |
| 5. Well Planning | T&D, Well Trajectory | Wellbore Properties: Trajectory, Tortuosity, Hole Size, Friction |
| 502 | Measurement Quality | Formation Properties: Inter-Beds, Anisotropy, Dip, Strike, In-Homogeneity |
| | 504 | 506 |

(56) References Cited

U.S. PATENT DOCUMENTS

| | | | |
|---|---|---|---|
| 2005/0205300 A1* | 9/2005 | Mathiszik | E21B 47/026 175/48 |
| 2005/0273302 A1 | 12/2005 | Huang et al. | |
| 2006/0195307 A1 | 8/2006 | Huang et al. | |
| 2007/0067147 A1* | 3/2007 | Huang | E21B 10/00 703/7 |
| 2007/0192071 A1 | 8/2007 | Huang et al. | |
| 2011/0214878 A1 | 9/2011 | Bailey et al. | |

OTHER PUBLICATIONS

First Office Action and Search Report issued in Chinese Patent Application No. 201480020646.4 dated Jul. 31, 2017, 18 pages.
International Preliminary Report on Patentability issued in International Patent Application No. PCT/US2014/034053 dated Oct. 22, 2015, 14 pages.

* cited by examiner

Simulation Capabilities

| Drilling, Reaming | Objective | Modeling Factors |
|---|---|---|
| 1. Cutting Tool Design/Selection | Stability (Vibrations) | Cutting Structures: PDC Bits, RC bits, BI-Center Bits, Reamers, etc. |
| 2. BHA Optimization | Steerability | Power Tools: Straight hole Motor, Straight hole Turbine |
| 3. Drilling Parameter Map | Efficiency (ROP) | Steering Tools: Steerable Motor, Steerable Turbine, Push the Bit RSS, Point the Bit RSS, Hybrid Push-Point RSS |
| 4. Drilling Trouble Shooting | Durability | Tubulars: DP, HWDP, DC, Flex Joints |
|  |  | Stabilizing Tools: 3D Stabilizers, Roller Reamers, VDS |
|  |  | Speciality BHA Tools: AST, Shock Sub, Hydra Thrust |
| 5. Well Planning | T&D, Well Trajectory | Operating Parameters: WOB, RPM(Constant or Varying) |
|  |  | Drilling Mode: Sliding, Rotating, Steering, Neutral, Backward/Forward Reaming, Rotating off bottom |
|  |  | Wellbore Properties: Trajectory, Tortuosity, Hole Size, Friction |
|  | Measurement Quality | Formation Properties: Inter-Beds, Anisotropy, Dip, Strike, In-Homogeneity |

| Component | OD (in) | ID (in) | MaxOD (in) | Length (ft) | Cum Len (ft) |
|---|---|---|---|---|---|
| 6-5/8" 27.70 DPS, 10% Wear | 6.5530 | 5.9010 | 8.5000 | 5478.576 | 6000.000 |
| 8 x 6 5/8" HWDP | 6.6250 | 4.5000 | 8.5000 | 246.391 | 521.424 |
| Hydra Jar | 8.5000 | 3.0000 | 8.5000 | 32.901 | 275.033 |
| 3 x 6 5/8" HWDP | 6.6250 | 4.5000 | 8.5000 | 92.356 | 242.126 |
| XO | 8.5000 | 3.0000 | 8.5001 | 3.543 | 148.770 |
| Filter Sub | 9.5001 | 4.0000 | 9.5001 | 7.940 | 146.227 |
| NM HWDP | 7.5000 | 3.5000 | 9.0625 | 30.643 | 138.287 |
| NM HWDP | 7.5000 | 3.5000 | 9.0625 | 29.823 | 107.644 |
| 16 3/4" NM Stabilizer | 9.5000 | 3.0000 | 16.7500 | 7.579 | 77.821 |
| Crossover | 9.3751 | 4.2500 | 9.3751 | 1.379 | 70.242 |
| LWD | 9.1250 | 4.2500 | 9.1250 | 19.390 | 68.864 |
| MWD | 9.0000 | 4.2500 | 9.0000 | 28.051 | 49.474 |
| Receiver Sub | 9.5000 | 4.2500 | 9.5000 | 5.938 | 21.423 |
| Push-The-Bit (RSS) | 8.9764 | 3.2238 | 17.3750 | 14.068 | 15.485 |
| Bit | 17.5000 | 0.0000 | 17.5000 | 1.417 | 1.417 |

| Component | OD (in) | ID (in) | MaxOD (in) | Length (ft) | Cum Len (ft) |
|---|---|---|---|---|---|
| 6-5/8" 27.70 DPS, 10% Wear | 6.5530 | 5.9010 | 8.5000 | 5478.576 | 6000.000 |
| 8 x 6 5/8" HWDP | 6.6250 | 4.5000 | 8.5000 | 246.391 | 521.424 |
| Hydra Jar | 8.5000 | 3.0000 | 8.5000 | 32.901 | 275.033 |
| 3 x 6 5/8" HWDP | 6.6250 | 4.5000 | 8.5000 | 92.356 | 242.126 |
| XO | 8.5000 | 3.0000 | 8.5001 | 3.543 | 148.770 |
| Filter Sub | 9.5001 | 4.0000 | 9.5001 | 7.940 | 146.227 |
| NM HWDP | 7.5000 | 3.5000 | 9.0625 | 30.643 | 138.287 |
| NM HWDP | 7.5000 | 3.5000 | 9.0625 | 29.823 | 107.644 |
| 17 1/4" NM Stabilizer | 9.5000 | 3.0000 | 17.2500 | 7.579 | 77.821 |
| Crossover | 9.3751 | 4.2500 | 9.3751 | 1.379 | 70.242 |
| LWD | 9.1250 | 4.2500 | 9.1250 | 19.390 | 68.864 |
| MWD | 9.0000 | 4.2500 | 9.0000 | 28.051 | 49.474 |
| Receiver Sub | 9.5000 | 4.2500 | 9.5000 | 5.938 | 21.423 |
| Push-The-Bit (RSS) | 8.9764 | 3.2238 | 17.3750 | 14.068 | 15.485 |
| Bit | 17.5000 | 0.0000 | 17.5000 | 1.417 | 1.417 |

| Component | OD (in) | ID (in) | MaxOD (in) | Length (ft) | Cum Len (ft) |
|---|---|---|---|---|---|
| 6-5/8" 27.70 DPS, 10% Wear | 6.5530 | 5.9010 | 8.5000 | 5478.576 | 6000.000 |
| 8 x 6 5/8" HWDP | 6.6250 | 4.5000 | 8.5000 | 246.391 | 529.003 |
| Hydra Jar | 8.5000 | 3.0000 | 8.5000 | 32.901 | 282.612 |
| 3 x 6 5/8" HWDP | 6.6250 | 4.5000 | 8.5000 | 92.356 | 249.705 |
| XO | 8.5000 | 3.0000 | 8.5001 | 3.543 | 157.349 |
| Filter Sub | 9.5001 | 4.0000 | 9.5001 | 7.940 | 153.806 |
| 16 3/4" NM Stabilizer | 9.5000 | 3.0000 | 16.7500 | 7.579 | 145.866 |
| NM HWDP | 7.5000 | 3.5000 | 9.0625 | 30.643 | 138.287 |
| NM HWDP | 7.5000 | 3.5000 | 9.0625 | 29.823 | 107.644 |
| 16 3/4" NM Stabilizer | 9.5000 | 3.0000 | 16.7500 | 7.579 | 77.821 |
| Crossover | 9.3751 | 4.2500 | 9.3751 | 1.378 | 70.242 |
| LWD | 9.1250 | 4.2500 | 9.1250 | 19.390 | 68.864 |
| MWD | 9.0000 | 4.2500 | 9.0000 | 28.051 | 49.474 |
| Receiver Sub | 9.5000 | 4.2500 | 9.5000 | 5.938 | 21.423 |
| Push-The-Bit (RSS) | 8.9764 | 3.2238 | 17.3750 | 14.068 | 15.485 |
| Bit | 17.5000 | 0.0000 | 17.5000 | 1.417 | 1.417 |

BHA 4

| Component | OD (in) | ID (in) | MaxOD (in) | Length (ft) | Cum Len (ft) |
|---|---|---|---|---|---|
| 6-5/8" 27.70 DPS, 10% Wear | 6.5530 | 5.9010 | 8.5000 | 5478.576 | 6000.000 |
| 8 x 6 5/8" HWDP | 6.6250 | 4.5000 | 8.5000 | 246.391 | 529.003 |
| Hydra Jar | 8.5000 | 3.0000 | 8.5000 | 32.901 | 282.612 |
| 3 x 6 5/8" HWDP | 6.6250 | 4.5000 | 8.5000 | 92.356 | 249.705 |
| XO | 8.5000 | 3.0000 | 8.5001 | 3.543 | 157.349 |
| Filter Sub | 9.5001 | 4.0000 | 9.5001 | 7.940 | 153.806 |
| 16 3/4" NM Stabilizer | 9.5000 | 3.0000 | 16.7500 | 7.579 | 145.866 |
| NM HWDP | 7.5000 | 3.5000 | 9.0625 | 30.643 | 138.287 |
| NM HWDP | 7.5000 | 3.5000 | 9.0625 | 29.823 | 107.644 |
| 17 1/4" NM Stabilizer | 9.5000 | 3.0000 | 17.2500 | 7.579 | 77.821 |
| Crossover | 9.3751 | 4.2500 | 9.3751 | 1.378 | 70.242 |
| LWD | 9.1250 | 4.2500 | 9.1250 | 19.390 | 68.864 |
| MWD | 9.0000 | 4.2500 | 9.0000 | 28.051 | 49.474 |
| Receiver Sub | 9.5000 | 4.2500 | 9.5000 | 5.938 | 21.423 |
| Push-The-Bit (RSS) | 8.9764 | 3.2238 | 17.3750 | 14.068 | 15.485 |
| Bit | 17.5000 | 0.0000 | 17.5000 | 1.417 | 1.417 |

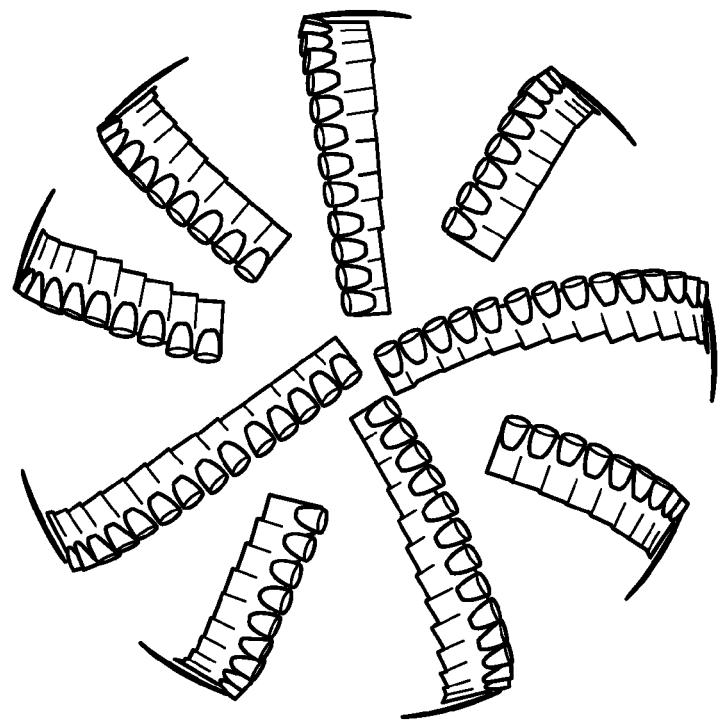
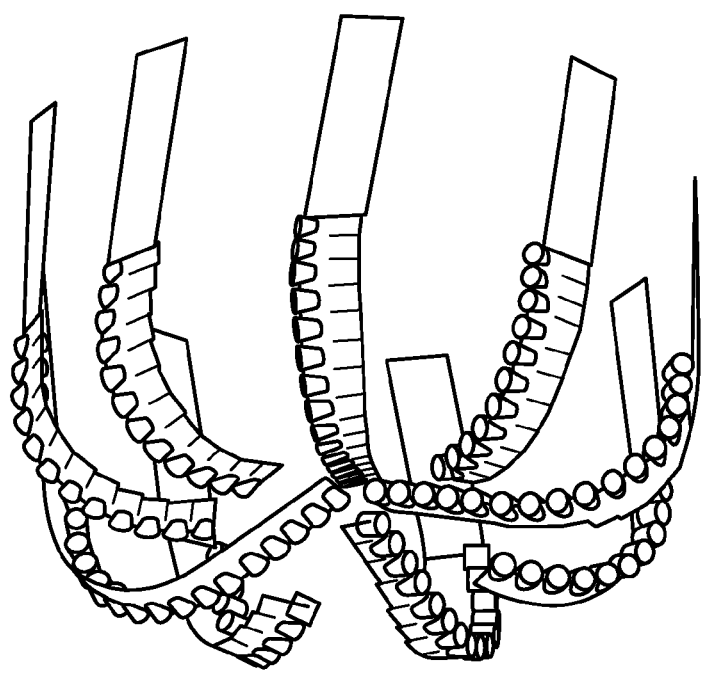
FIG. 6F

Simulation Scenarios

1. Normal drilling (RPM180, WOB40)
2. RPM ramping up (RPM = 10~300, WOB = 20, 30, 40klbs)
3. RPM ramping up as bit off-bottom (RPM = 10~300)
4. Transitional drilling (RPM180, WOB40, soft shale to hard carbonate)
5. Inhomogeneous formation drilling (RPM180, WOB40, hard nodules)
6. Drilling with high well friction (RPM180, WOB40, friction coeff 0.5)
7. Drilling with BHA eccentricity (RPM180, WOB40, 0.5" eccentricity)
8. Directional tendency prediction (RPM180, WOB40, 90ft)

*FIG. 7*

**Results of Simulation Scenario 1
Normal Drilling
WOB: 40 - SRPM: 180 - Steering: 0%**

*FIG. 8*

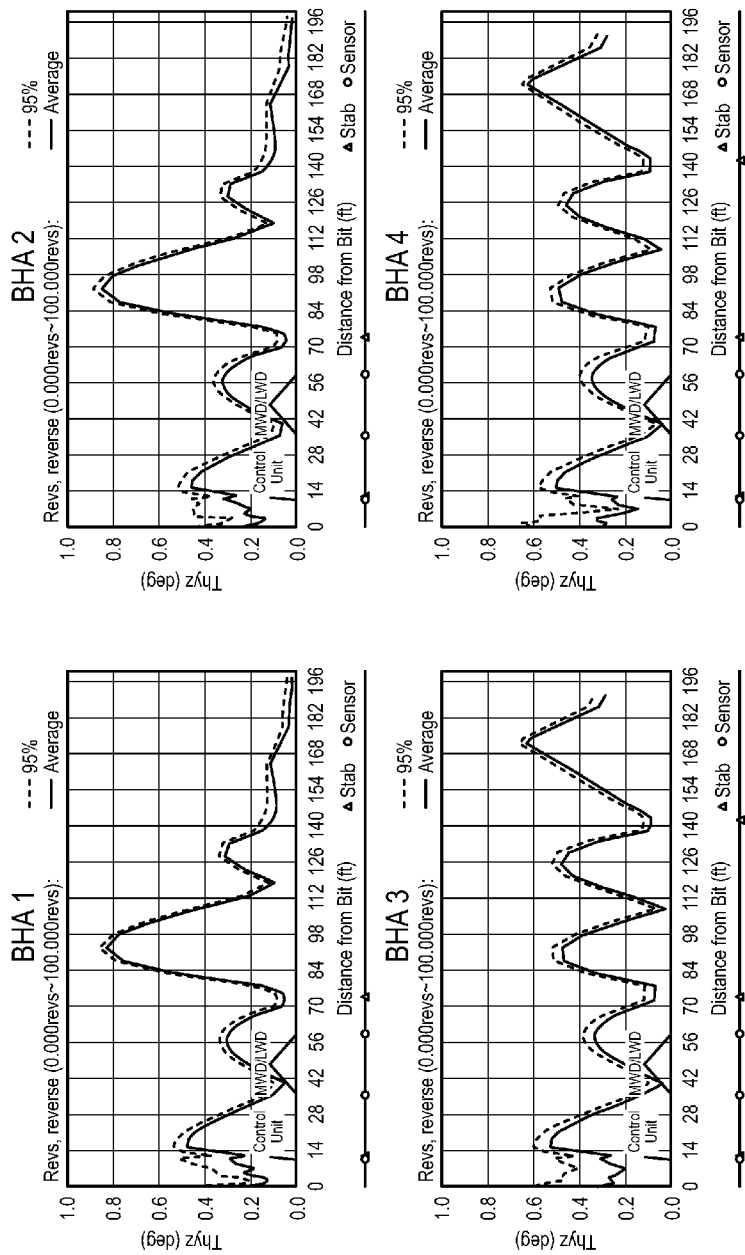

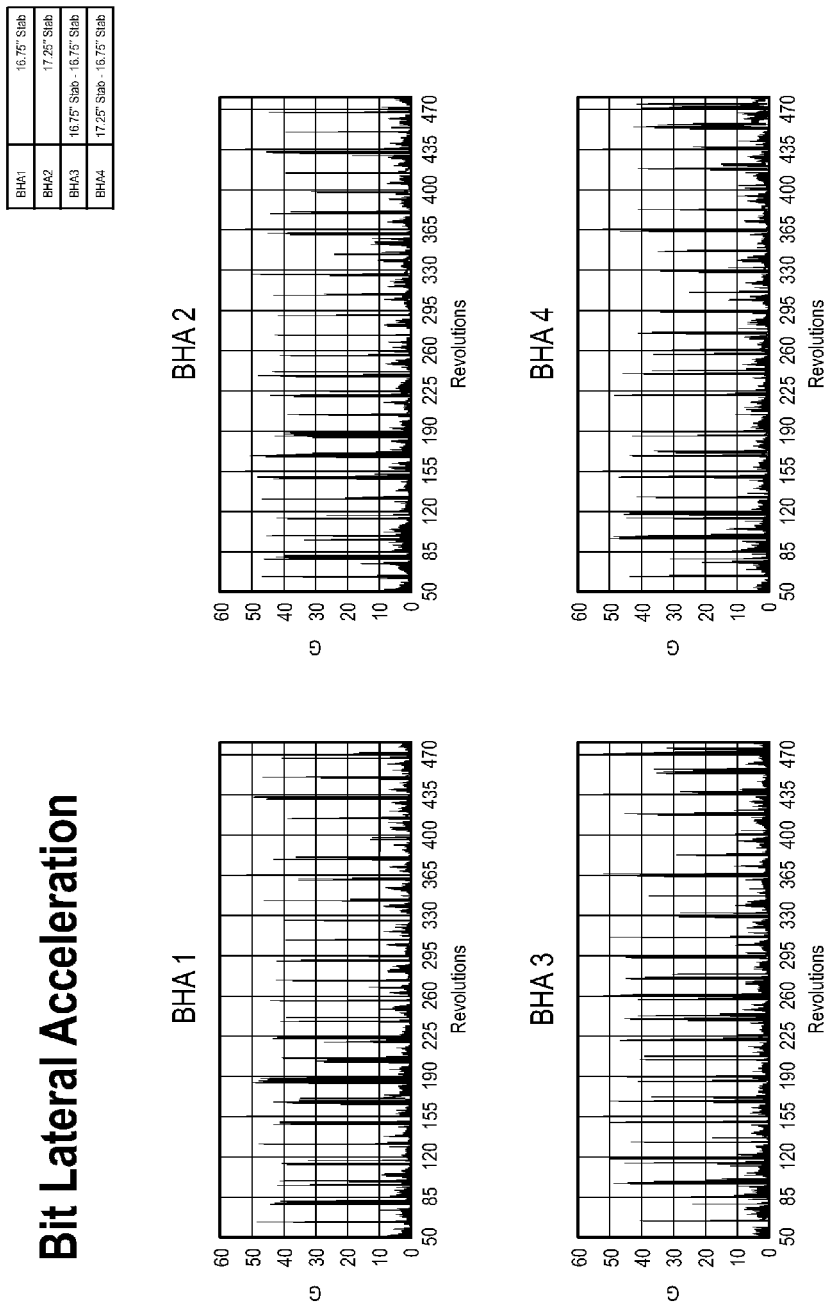

All BHAs have similar RPM variation pattern at bit (show high stick-slip).

Results of Simulation Scenario 2-1-3
RPM Ramping Up
WOB: 20-40 - SRPM: 10 to 300 - Steering: 0%

FIG. 9

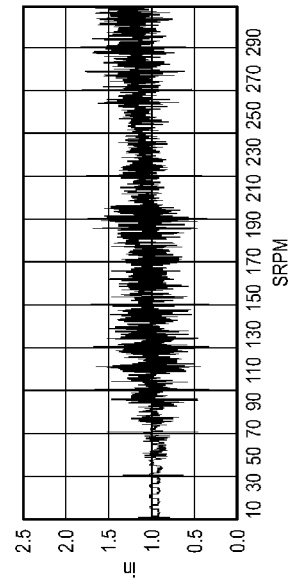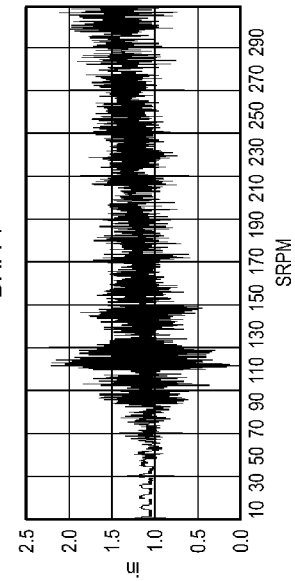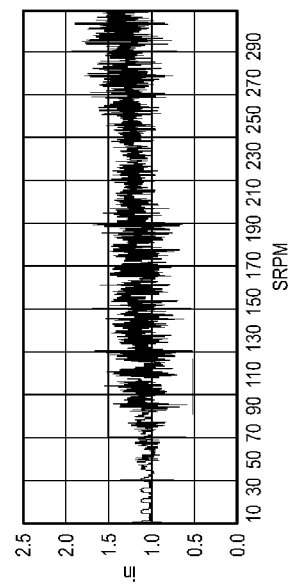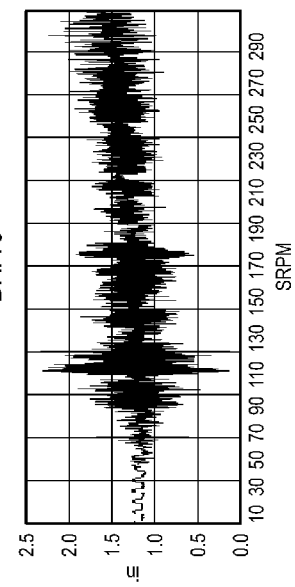
FIG. 9B
BHA1&BHA2 are stable than BHA3&BHA4. Obvious critical speed of BHA3 and BHA4 is around 110RPM.

Results of Simulation Scenario 3
RPM Ramping Up (Bit Off Bottom)
SRPM: 10 to 300 - Steering: 0%

FIG. 10

Results of Simulation Scenario 4
Transitional Drilling
WOB: 40 - SRPM: 180 - Steering: 0%

FIG. 11

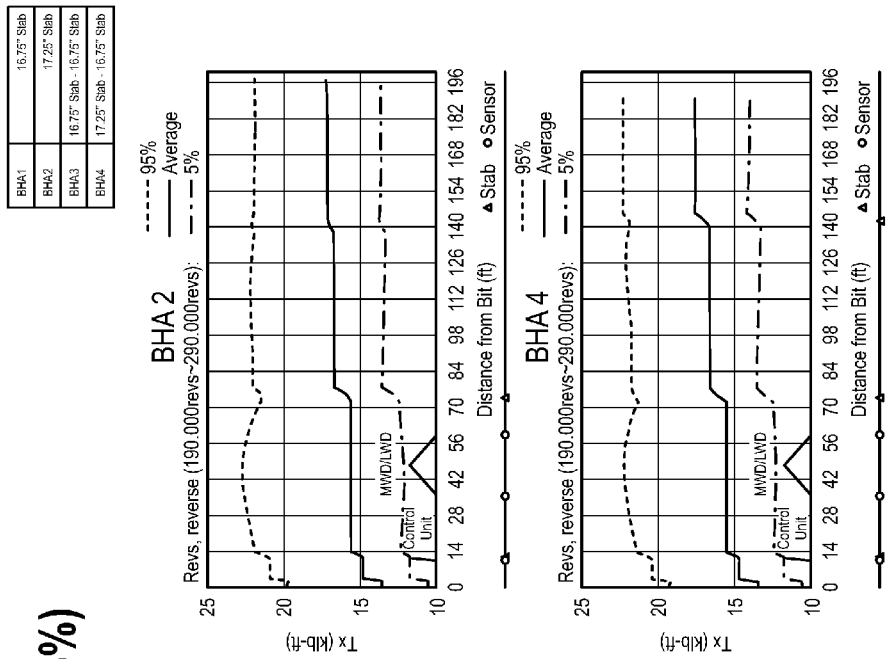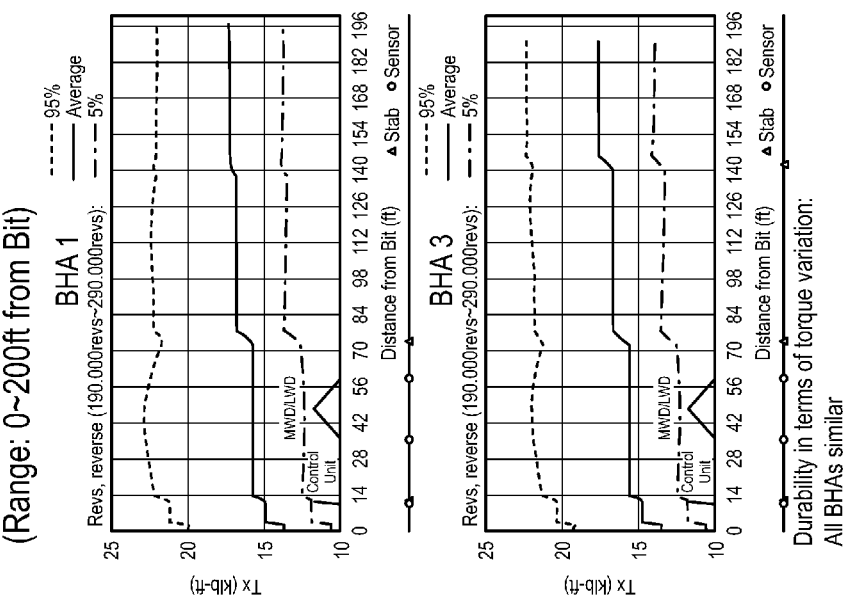
FIG. 11F

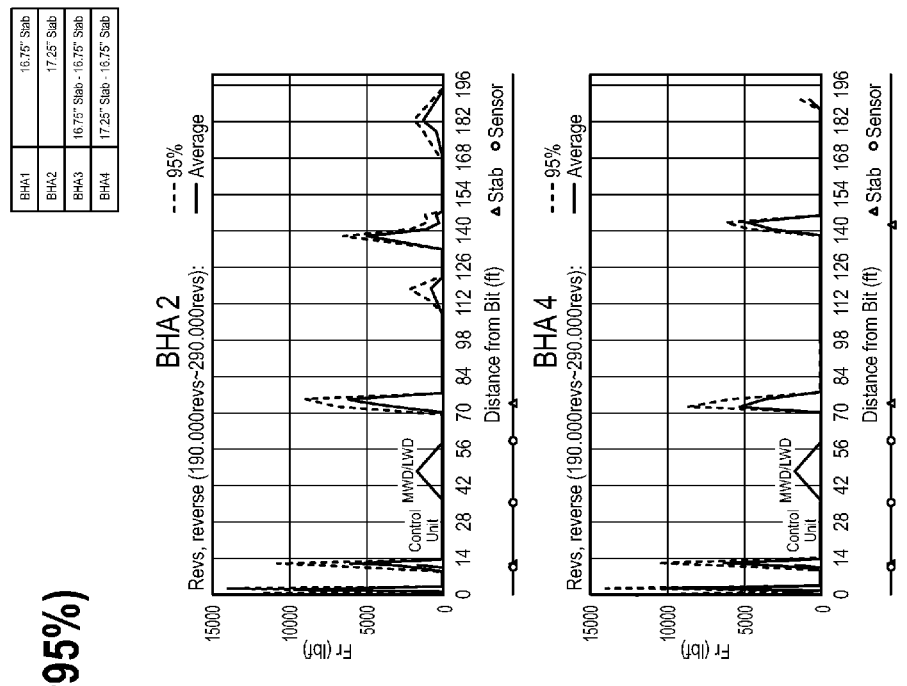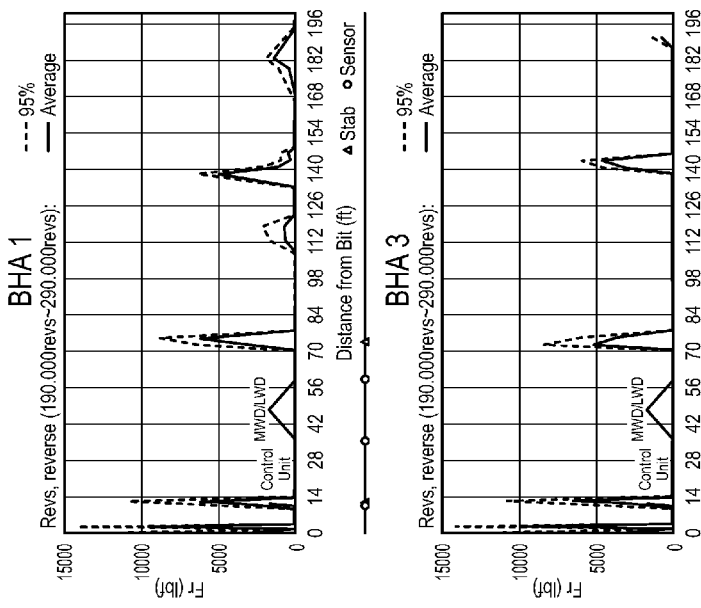
FIG. 11I

As passing the formation transition, all BHAs show similar RPM variation pattern at bit.

As passing the formation transition, all BHAs show similar torque variation pattern at surface.

Results of Simulation Scenario 5
Drilling Inhomogeneous Formation
WOB: 40 - SRPM: 180 - Steering: 0%

FIG. 12

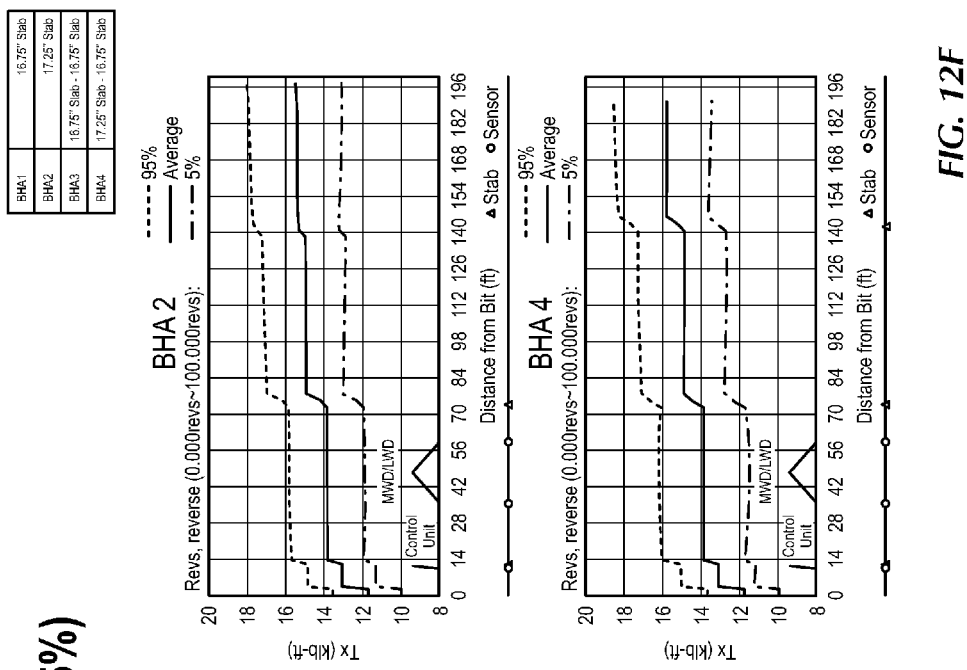
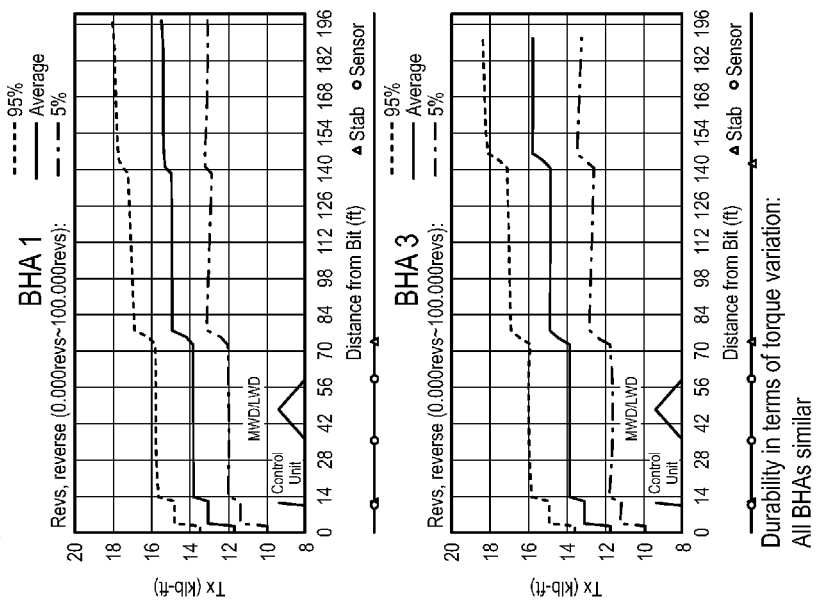
FIG. 12F

Bit RPM
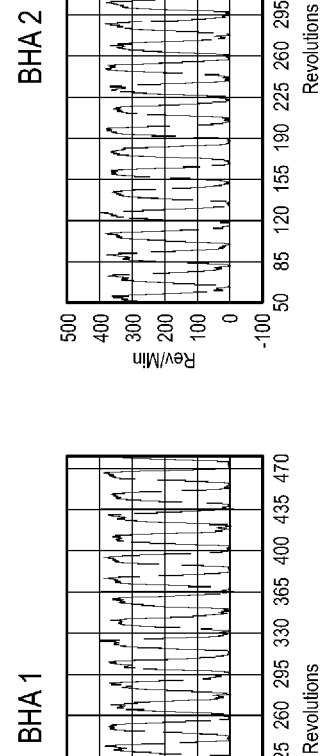
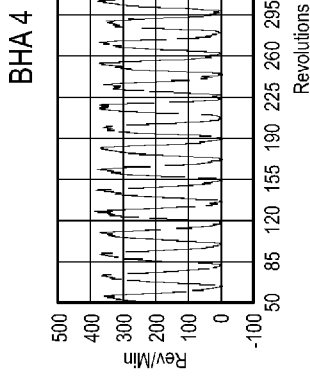
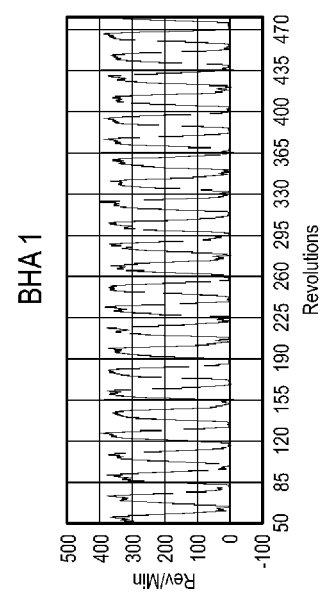
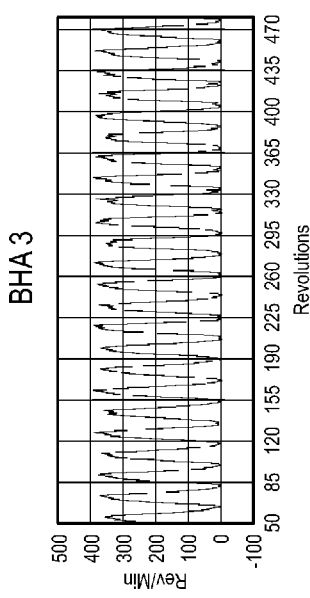
FIG. 12K
All BHAs have similar RPM variation pattern at bit (show high stick-slip).

Surface Torque
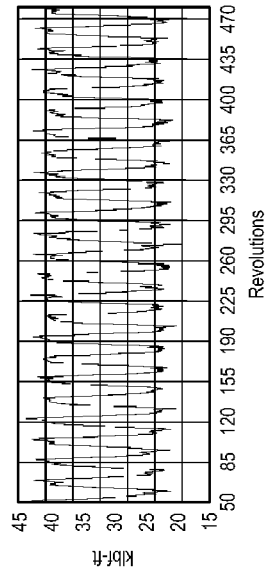
BHA 1
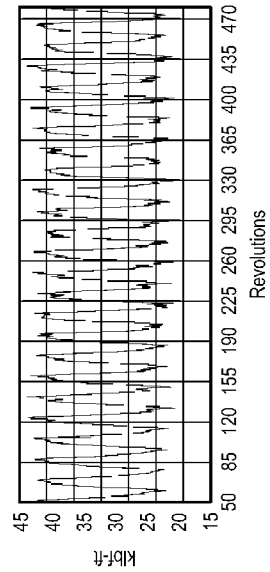
BHA 2
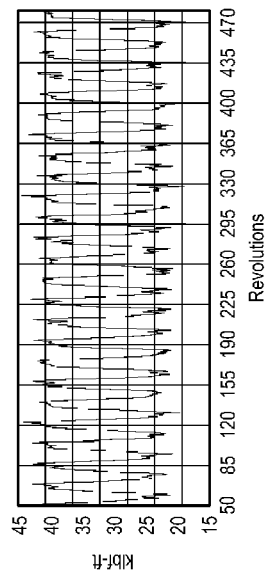
BHA 3
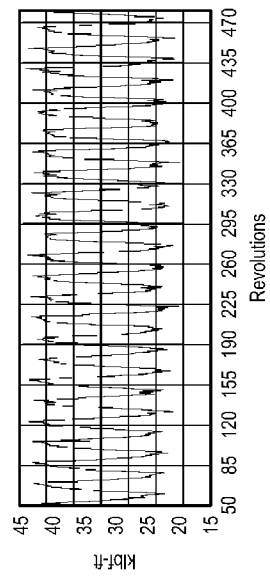
BHA 4
All BHAs have similar surface torque time history pattern.
FIG. 12M Results of Simulation Scenario 6
High Well Friction
WOB: 40 - SRPM: 180 - Steering: 0%

FIG. 13

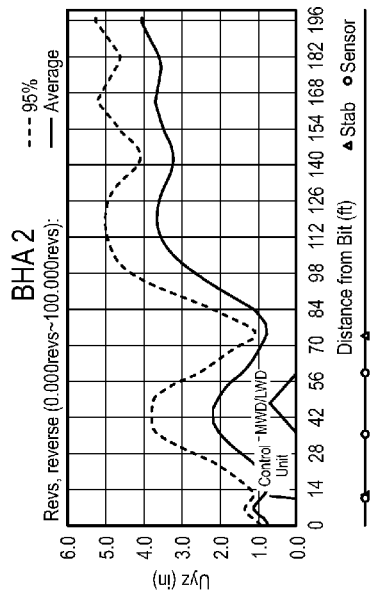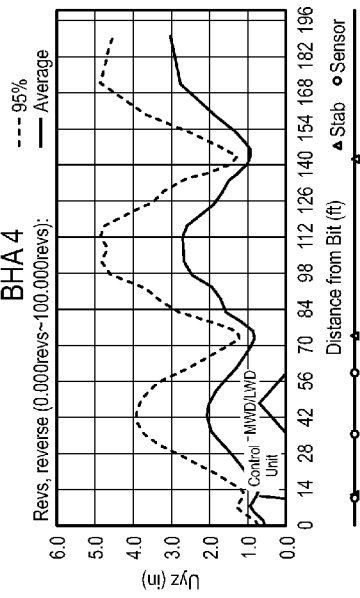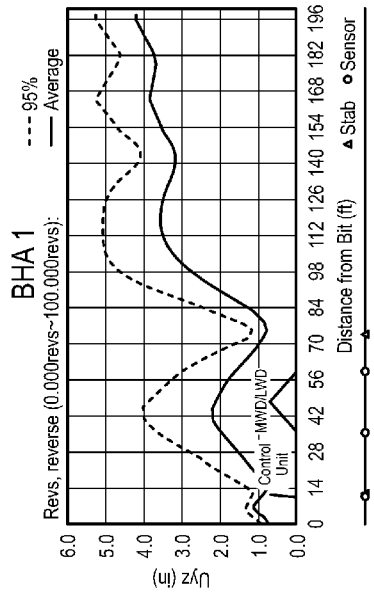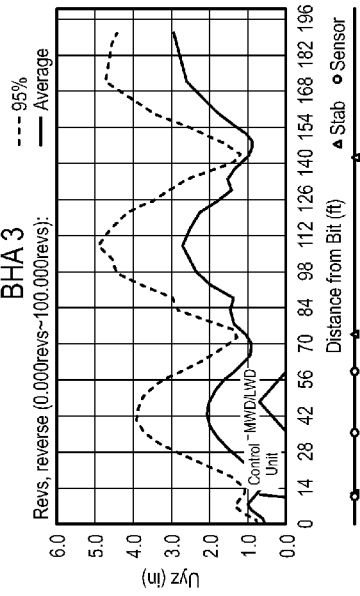
FIG. 13A

High bit lateral acceleration for all BHAs.

BHA1 and BHA2 have relatively lower stick-slip.

Results of Simulation Scenario 7
Eccentricity in BHA
WOB: 40 - SRPM: 180 - Steering: 0%

FIG. 14

Results of Simulation Scenario 8
Directional Tendency Prediction
WOB: 40 - SRPM: 180 - Steering: 100%

FIG. 15

New Well Azimuth
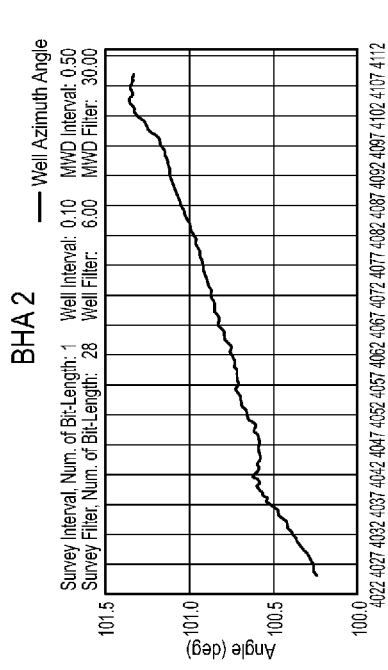
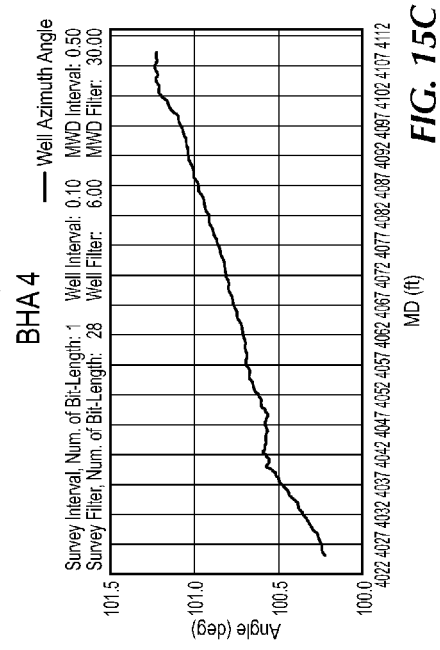
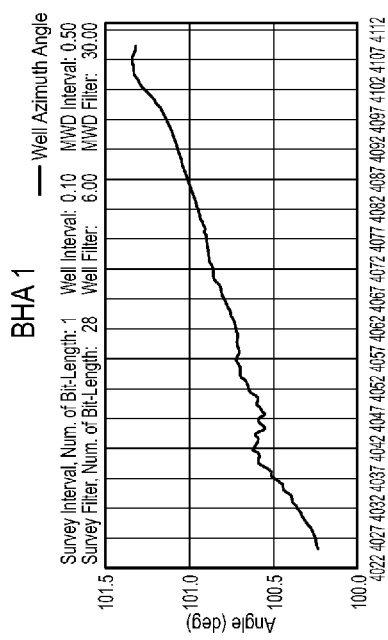
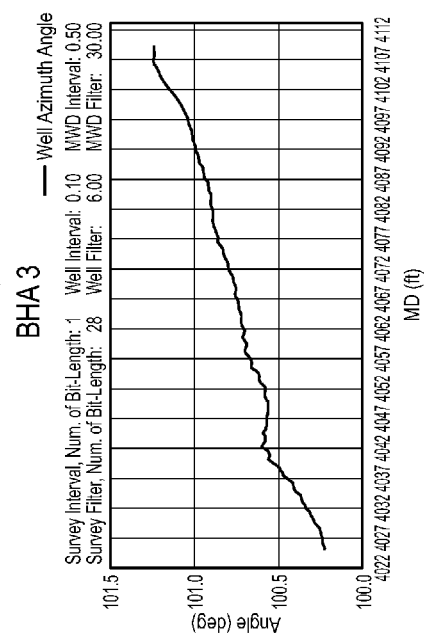
FIG. 15C

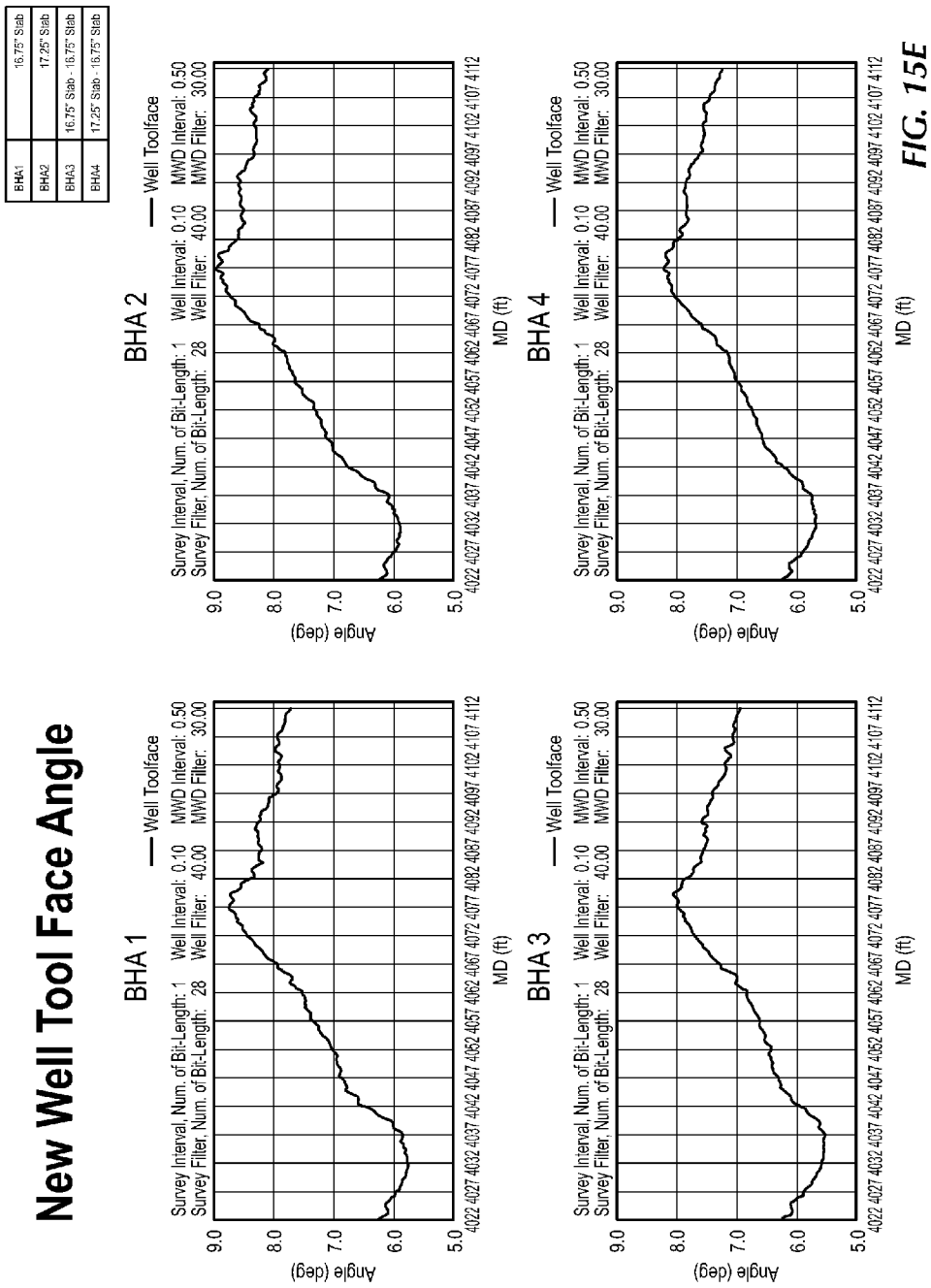

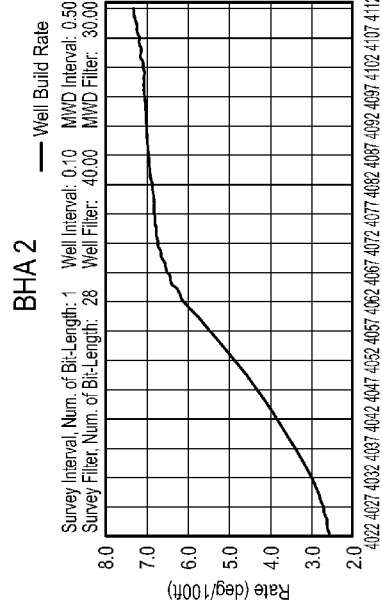
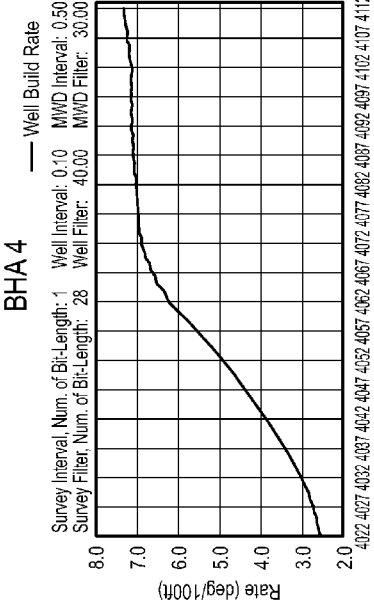
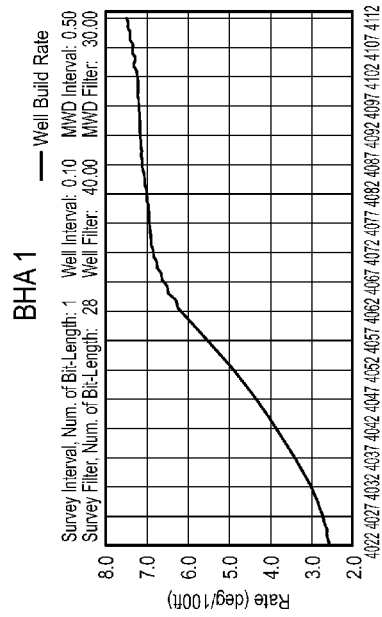
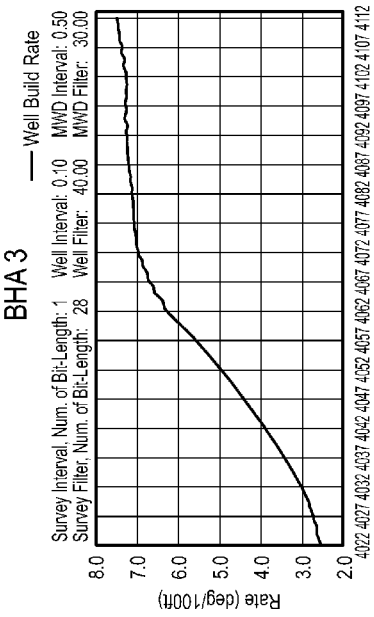
FIG. 15F
With a smaller string stab, BHA1 and BHA3 gives a slightly higher BUR.

Well TF

1. Make a normal plane to well tangent $t_1$ at survey station 1
2. Project g to normal plane and obtain high side $N_u$
3. Translate well tangent $t_2$ at survey station 2 to survey station 1
4. Project $t_2$ to normal plane to obtain $N_{TF}$
5. Well TF angle is the angle between $N_u$ and $N_{TF}$

METHODS FOR ANALYZING AND DESIGNING BOTTOM HOLE ASSEMBLIES

CROSS-REFERENCE TO RELATED APPLICATIONS

This application claims benefit of U.S. Provisional Application No. 61/811,507, filed on Apr. 12, 2013, which is herein incorporated by reference in its entirety.

BACKGROUND ART

FIG. 1 shows one example of a conventional drilling system for drilling an earth formation. The drilling system includes a drilling rig 10 used to turn a drilling tool assembly 12 that extends downward into a well bore 14. The drilling tool assembly 12 includes a drill string 16, and a bottomhole assembly (BHA) 18, which is attached to the distal end of the drill string 16. The "distal end" of the drill string is the end furthest from the drilling rig.

The drill string 16 includes several joints of drill pipe 16a connected end to end through tool joints 16b. The drill string 16 is used to transmit drilling fluid (through its hollow core) and to transmit rotational power from the drill rig 10 to the BHA 18. In some cases the drill string 16 further includes additional components such as subs, pup joints, etc.

The BHA 18 includes at least a drill bit 20. BHA's may also include additional components attached between the drill string 16 and the drill bit 20. Examples of additional BHA components include drill collars, stabilizers, measurement-while-drilling (MWD) tools, logging-while-drilling (LWD) tools, subs, hole enlargement devices (e.g., hole openers and reamers), jars, accelerators, thrusters, downhole motors, and rotary steerable systems.

In general, drilling tool assemblies 12 may include other drilling components and accessories, such as special valves, such as kelly cocks, blowout preventers, and safety valves. The drill bit 20 in the BHA 18 may be any type of drill bit suitable for drilling earth formation. Two common types of drill bits used for drilling earth formations are fixed-cutter (or fixed-head) bits and roller cone bits. FIG. 2 shows one example of a fixed-cutter bit. FIG. 3 shows one example of a roller cone bit.

Referring to FIG. 2, fixed-cutter bits (also called drag bits) 21 have a bit body 22 having a threaded connection at one end 24 and a cutting head 26 formed at the other end. The head 26 of the fixed-cutter bit 21 includes a plurality of ribs or blades 28 arranged about the rotational axis of the drill bit and extending radially outward from the bit body 22. Cutting elements 29 are embedded in the raised ribs 28 to cut formation as the drill bit is rotated on a bottom surface of a well bore. Cutting elements 29 of fixed-cutter bits include polycrystalline diamond compacts (PDC) or specially manufactured diamond cutters. These drill bits are also referred to as PDC bits.

Referring to FIG. 3, roller cone bits 30 includes a bit body 32 having a threaded connection at one end 34 and one or more legs extending from the other end. A roller cone 36 is mounted on each leg and is able to rotate with respect to the bit body 32. On each cone 36 of the drill bit 30 are a plurality of cutting elements 38, arranged in rows about the surface of the cone 36 to contact and cut through formation encountered by the drill bit. Roller cone bits 30 are designed such that as a drill bit rotates, the cones 36 of the roller cone bit 30 roll on the bottom surface of the well bore (called the "bottomhole") and the cutting elements 38 scrape and crush the formation beneath them. In some cases, the cutting elements 38 on the roller cone bit 30 include milled steel teeth formed on the surface of the cones 36. In other cases, the cutting elements 38 include inserts embedded in the cones. These inserts are tungsten carbide inserts or polycrystalline diamond compacts. In some cases hardfacing is applied to the surface of the cutting elements and/or cones to improve wear resistance of the cutting structure.

For a drill bit 20 to drill through formation, sufficient rotational moment and axial force must be applied to the drill bit 20 to cause the cutting elements of the drill bit 20 to cut into and/or crush formation as the drill bit is rotated. The axial force applied on the drill bit 20 is referred to as the "weight on bit" (WOB). The rotational moment applied to the drilling tool assembly 12 at the drill rig 10 (usually by a rotary table or a top drive mechanism) to turn the drilling tool assembly 12 is referred to as the "rotary torque". The speed at which the rotary table rotates the drilling tool assembly 12, measured in revolutions per minute (RPM), is referred to as the "rotary speed". Additionally, the portion of the weight of the drilling tool assembly supported at the rig 10 by the suspending mechanism (or hook) is typically referred to as the hook load.

During drilling, the actual WOB is not constant. Some of the fluctuation in the force applied to the drill bit may be the result of the drill bit contacting with formation having harder and softer portions that break unevenly. However, in most cases, the majority of the fluctuation in the WOB can be attributed to drilling tool assembly vibrations. Drilling tool assemblies can extend more than a mile in length while being less than a foot in diameter. As a result, these assemblies are relatively flexible along their length and may vibrate when driven rotationally by the rotary table. Drilling tool assembly vibrations may also result from vibration of the drill bit during drilling. Several modes of vibration are possible for drilling tool assemblies. In general, drilling tool assemblies may experience torsional, axial, and lateral vibrations. Although partial damping of vibration may result due to viscosity of drilling fluid, friction of the drill pipe rubbing against the wall of the well bore, energy absorbed in drilling the formation, and drilling tool assembly impacting with well bore wall, these sources of damping are typically not enough to suppress vibrations completely.

These problems may be increasingly significant when dealing with directional wells. Directional drilling involves certain terms of art, which are presented for background information. The "build rate" is the positive change in inclination over a normalized length (e.g., 3°/100 ft.). A negative change in inclination would be the "drop rate."

A long-radius horizontal well is characterized by build rates of 2 to 6°/100 ft, which result in a radius of 3,000 to 1,000 ft, respectively. This profile is typically drilled with conventional directional-drilling tools, and lateral sections of up to 8,000 ft have been drilled.

Medium-radius horizontal wells have build rates of 6 to 35°/100 ft, radii of 1,000 to 160 ft, respectively, and lateral sections of up to 8,000 ft. These wells are drilled with specialized downhole mud motors and conventional drill-string components. Double-bend assemblies are designed to build angles at rates up to 35°/100 ft. The lateral section is often drilled with conventional steerable motor assemblies.

In practical terms, a well is classified as medium radius if the bottomhole assembly (BHA) cannot be rotated through the build section at all times. At the upper end of the medium radius, drilling the maximum build rate is limited by the bending and torsional limits of API tubulars. Smaller holes with more-flexible tubulars have a higher allowable maximum dogleg severity (DLS). Dogleg severity is a measure of the amount of change in the inclination, and/or azimuth of a borehole, usually expressed in degrees per 100 feet of course length. In the metric system, it is usually expressed in degrees per 30 meters or degrees per 10 meters of course length.

Short-radius horizontal wells have build rates of 5 to 10°/3 ft (1.5 to 3°/ft), which equates to radii of 40 to 20 ft, respectively. The length of the lateral section varies between 200 and 900 ft. Short-radius wells are drilled with specialized drilling tools and techniques. This profile is most commonly drilled as a re-entry from any existing well.

The method used to obtain the measurements needed to calculate and plot a 3D well path is called a directional survey. Three parameters are measured at multiple locations along the well path—MD, inclination, and hole direction. MD is the actual depth of the hole drilled to any point along the wellbore or to total depth, as measured from the surface location. Inclination is the angle, measured in degrees, by which the wellbore or survey-instrument axis varies from a true vertical line. An inclination of 0° would be true vertical, and an inclination of 90° would be horizontal.

Hole direction is the angle, measured in degrees, of the horizontal component of the borehole or survey-instrument axis from a known north reference. This reference is true north, magnetic north, or grid north, and is measured clockwise by convention. Hole direction is measured in degrees and is expressed in either azimuth (0 to 360°) or quadrant (NE, SE, SW, NW) form.

SUMMARY OF DISCLOSURE

In one aspect, a method for selecting a bottomhole assembly, including selecting a drilling criteria; performing a dynamic simulation of a first bottomhole assembly that includes at least one drill bit, a measurement sensor, and a stabilizer; outputting results predicting a performance of the first bottomhole assembly that are indicative of a measurement quality for the measurement sensor is disclosed.

In another aspect, a method for selecting a bottomhole assembly, including performing a first dynamic simulation of a first bottomhole assembly; performing at least a second dynamic simulation of the first bottomhole assembly, wherein the at least a second dynamic simulation comprises a different constraint than the first dynamic simulation; and outputting results for both the first dynamic simulation and the second dynamic simulation, wherein the results comprise at least one output showing performance as a function of position along the bottomhole assembly is disclosed.

In another aspect, a system for selecting a bottomhole assembly (BHA), including: a computing device having a computing processor executing instructions to perform: executing a first simulation of a first BHA that includes at least one drill bit, a measurement sensor, and a stabilizer, the first simulation generating a first set of performance data, and the computing device comprising a graphical user interface executing on the computer processor with functionality to perform: inputting a selected drilling criteria, presenting, on the graphical user interface, the first set of performance data from the first simulation, and selecting a BHA based on a comparison of the first set of performance data and the selected drilling criteria is disclosed.

In another aspect, a non-transitory computer readable medium including executable instructions selecting a BHA, the executable instructions having functionality to: input, using a graphical user interface, a selected drilling criteria, perform a dynamic simulation of a first bottomhole assembly that includes at least one drill bit, a measurement sensor, and a stabilizer, and output, on the graphical user interface, results predicting a performance of the first bottomhole assembly that are indicative of a measurement quality for the measurement sensor.

In another aspect, a non-transitory computer readable medium including executable instructions selecting a BHA, the executable instructions having functionality to: input, using a graphical user interface, a selected drilling criteria, perform a dynamic simulation of a first bottomhole assembly that includes at least one drill bit, wherein the dynamic simulation comprises a dynamic input, and output, on the graphical user interface, results predicting a performance of the first bottomhole assembly.

In yet another aspect, a non-transitory computer readable medium including executable instructions selecting a BHA, the executable instructions having functionality to: perform a dynamic simulation of a first bottomhole assembly, perform at least a second dynamic simulation of the first bottomhole assembly, wherein the at least a second dynamic simulation comprises a different constraint than the first dynamic simulation, and output, on the graphical user interface, results for both the first dynamic simulation and the second dynamic simulation, wherein the results comprise at least one output showing performance as a function of position along the bottomhole assembly.

This summary is provided to introduce a selection of concepts that are further described below in the detailed description. This summary is not intended to identify key or essential features of the claimed subject matter, nor is it intended to be used as an aid in limiting the scope of the claimed subject matter.

Other aspects and advantages of the disclosure will be apparent from the following description and the appended claims.

BRIEF DESCRIPTION OF DRAWINGS

FIG. 5 shows an overview of simulation capabilities in selected embodiments of the disclosure.

FIG. 6F shows an embodiment of a drill bit used in the simulation in accordance with an embodiment of the disclosure.

FIG. 7 shows a listing of the simulation scenarios used in accordance with an embodiment of the disclosure.

FIG. 8 shows the simulation conditions of simulation scenario 1 used in an embodiment of the disclosure.

FIGS. 8A-8M show exemplary outputs for simulation scenario 1 in accordance with embodiments of the disclosure.

FIG. 9 shows the simulation conditions of simulation scenario 2 used in an embodiment of the disclosure.

FIGS. 9A-9F show exemplary outputs for simulation scenario 2 in accordance with embodiments of the disclosure.

FIG. 10 shows the simulation conditions of simulation scenario 3 used in an embodiment of the disclosure.

FIG. 11 shows the simulation conditions of simulation scenario 4 used in an embodiment of the disclosure.

FIGS. 11A-11M show exemplary outputs for simulation scenario 4 in accordance with embodiments of the disclosure.

FIG. 12 shows the simulation conditions of simulation scenario 5 used in an embodiment of the disclosure.

FIGS. 12A-12M show exemplary outputs for simulation scenario 5 in accordance with embodiments of the disclosure.

FIG. 13 shows the simulation conditions of simulation scenario 6 used in an embodiment of the disclosure.

FIGS. 13A-13M show exemplary outputs for simulation scenario 6 in accordance with embodiments of the disclosure.

FIG. 14 shows the simulation conditions of simulation scenario 7 used in an embodiment of the disclosure.

FIG. 15 shows the simulation conditions of simulation scenario 8 used in an embodiment of the disclosure.

FIGS. 15A-15G show exemplary outputs for simulation scenario 8 in accordance with an embodiment of the disclosure.

DETAILED DESCRIPTION

Figure 1:
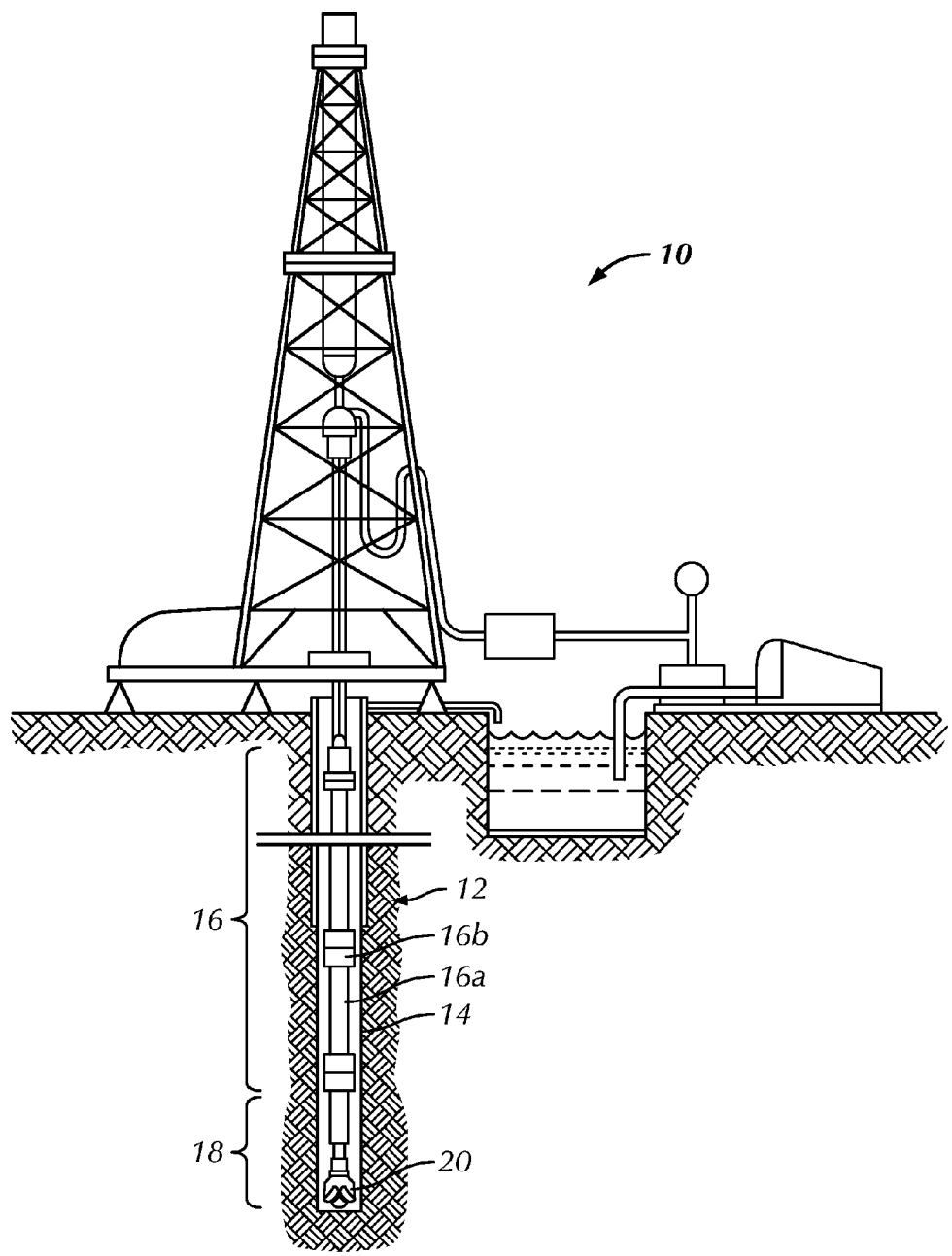
FIG. 1 shows a conventional drilling system for drilling an earth formation.
Figure 2:
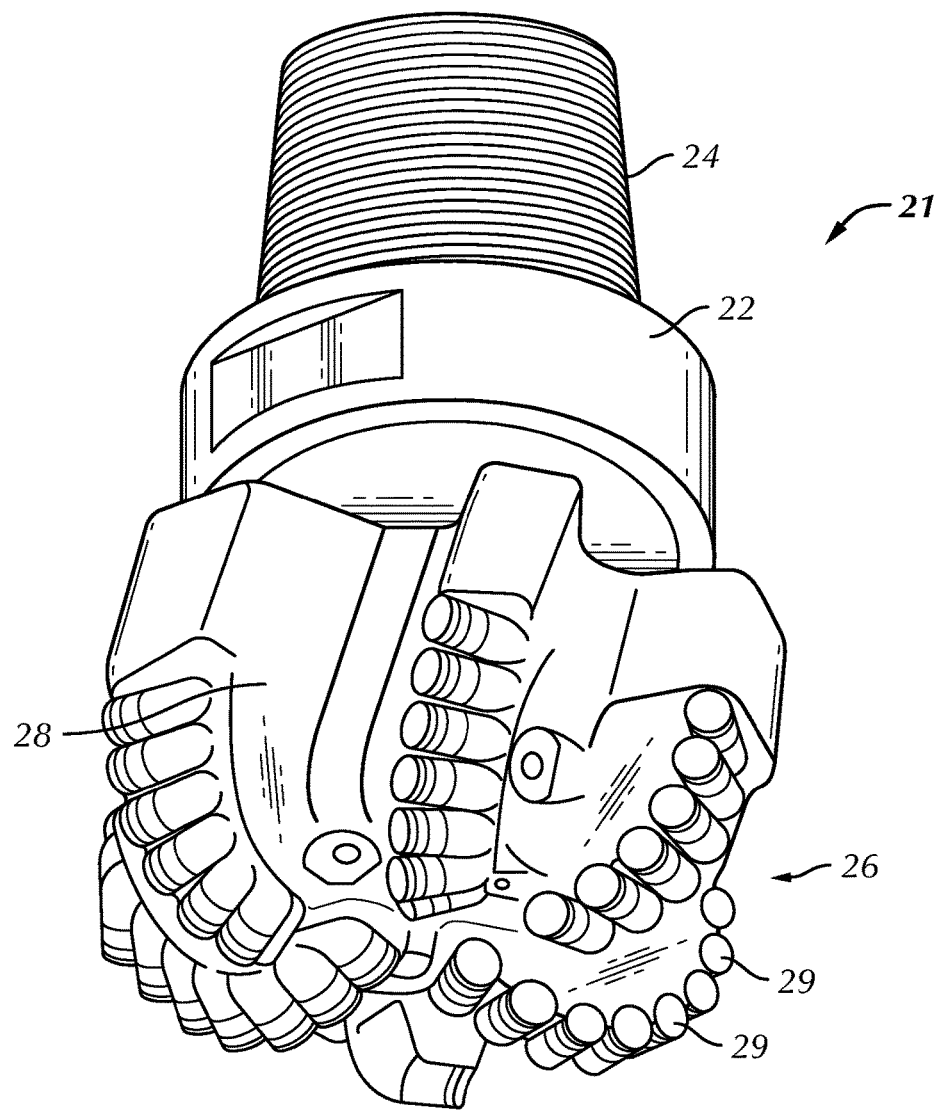
FIG. 2 shows a conventional fixed-cutter bit.
Figure 3:
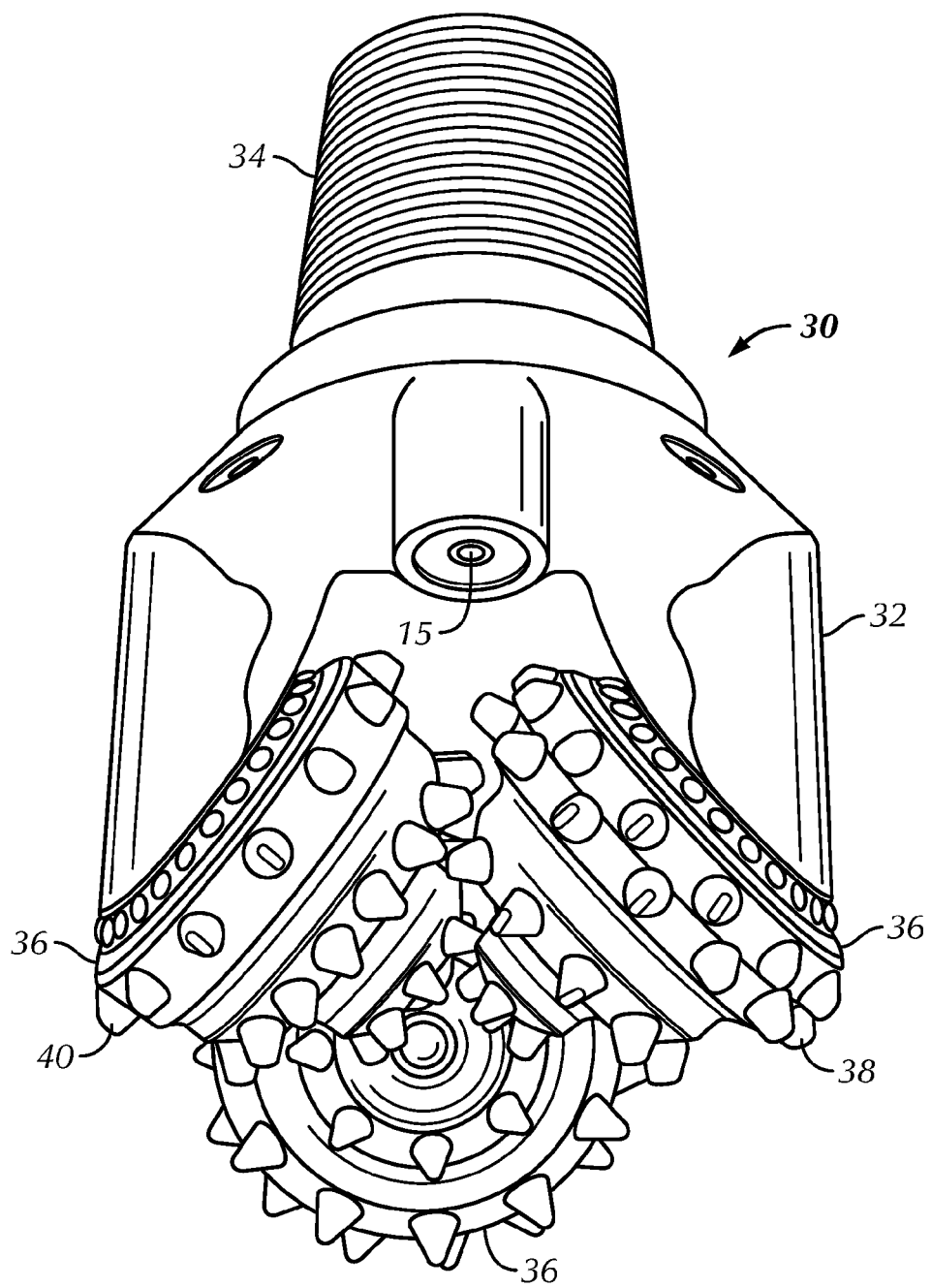
FIG. 3 shows a conventional roller cone bit.

In one aspect, the present disclosure provide a system and method for analyzing the performance of different BHA's against pre-selected criteria. For sake of clarity, a number of definitions are provided below.

While most of the terms used herein will be recognizable to those of skill in the art, the following definitions are nevertheless put forth to aid in the understanding of the present disclosure. It should be understood, however, that when not explicitly defined, terms should be interpreted as adopting a meaning presently accepted by those of skill in the art.

Embodiments disclosed herein provide systems, methods and systems, and techniques to model the behavior of various BHA packages under multiple conditions to achieve an optimal BHA package for a given well. More particularly, one or more embodiments disclosed herein provide for methods and systems of directly comparing various BHA packages against selected criteria, to determine which package may be the preferred one. In other embodiments, a BHA designer can make recommendations on structures to use in a BHA package, in order to satisfy one or more criteria.

In one or more embodiments, a performance criteria is selected (by a BHA designer, or by a drilling operator, for example). The performance criteria may be one or more selected from stability, robustness, measurement quality, and steerability of the BHA package for example. A BHA package may be designed to satisfy one or more of the performance criteria, or comparisons can be made between existing BHA packages, or a combination of existing, new, and modified BHA packages.

After a number of BHA packages are selected, the drilling performance of the BHA packages is simulated. As a product of the simulation, a number of predicted performance outputs are created. In one or more embodiments, some number of predicted performance outputs are reviewed by a BHA designer, against one or more of the selected performance criteria. In other embodiments, results from the simulation are automatically assembled into a drilling performance report, which may subsequently be reviewed by the BHA designer. If none of the BHA packages satisfy the performance criteria to an acceptable degree, the BHA package may be modified, or other BHA packages may be similarly analyzed. This process may be repeated until an optimal BHA package for a given drilling application has been selected.

"Drilling performance" may be measured by one or more drilling performance parameters. Examples of drilling performance parameters include rate of penetration (ROP), rotary torque required to turn the drilling tool assembly, rotary speed at which the drilling tool assembly is turned, drilling tool assembly lateral, axial, or torsional vibrations induced during drilling, weight on bit (WOB), forces acting on components of the drilling tool assembly, and forces acting on the drill bit and components of the drill bit (e.g., on blades, cones, and/or cutting elements). Drilling performance parameters may also include the inclination angle and azimuth direction of the borehole being drilled. One skilled in the art will appreciate that other drilling performance parameters exist and may be considered without departing from the scope of the disclosure.

"Drilling tool assembly design parameters, or "BHA parameters" may include one or more of the following: the type, location, and number of components included in the drilling tool assembly; the length, internal diameter of components, outer diameter of components, weight, and material properties of each component; the type, size, weight, configuration, and material properties of the drilling tool; and the type, size, number, location, orientation, and material properties of the cutting elements on the drilling tool. Material properties in designing a drilling tool assembly may include, for example, the strength, elasticity, and density of the material. It should be understood that drilling tool assembly design parameters may include any other configuration or material parameter of the drilling tool assembly without departing from the scope of the disclosure.

"Bit design parameters," which are a subset of drilling tool assembly design parameters, may include one or more of the following: bit type (i.e., fixed or roller cone), size of bit, shape of bit, the cutting structures on the drill bit, such as cutting element geometry, quantity, and locations. As with other component in the drilling tool assembly, the material properties of the drill bit may be defined.

"Drilling operating parameters" may include one or more of the following: the rotary table (or top drive mechanism), speed at which the drilling tool assembly is rotated (RPM), the downhole motor speed (if a downhole motor is included) and the hook load. Drilling operating parameters may further include drilling fluid parameters, such as the viscosity and density of the drilling fluid, for example. It should be understood that drilling operating parameters are not limited to these variables. In other embodiments, drilling operating parameters may include other variables, e.g. rotary torque and drilling fluid flow rate. Additionally, drilling operating parameters for the purpose of drilling simulation may further include the total number of drill bit revolutions to be simulated or the total drilling time desired for drilling simulation. Once the parameters of the system (drilling tool assembly under drilling conditions) are defined, they can be used along with various interaction models to simulate the dynamic response of the drilling tool assembly drilling earth formation as described below.

As used herein, the phrase "drilling profile" means a set of drilling characteristics selected or used for a given formation.

"Well bore parameters" may include one or more of the following: the geometry of a well bore and formation material properties (i.e. geologic characteristics). The trajectory of a well bore in which the drilling tool assembly is to be confined also is defined along with an initial well bore bottom surface geometry. Because the well bore trajectory may be straight, curved, or a combination of straight and curved sections, well bore trajectories, in general, may be defined by defining parameters for each segment of the trajectory. For example, a well bore may be defined as comprising N segments characterized by the length, diameter, inclination angle, and azimuth direction of each segment and an indication of the order of the segments (i.e., first, second, etc.). Well bore parameters defined in this manner can then be used to mathematically produce a model of the entire well bore trajectory. Formation material properties at various depths along the well bore may also be defined and used. One of ordinary skill in the art will appreciate that well bore parameters may include additional properties, such as friction of the walls of the well bore and well bore fluid properties, without departing from the scope of the disclosure.

As used herein, a "drilling simulation" is a dynamic simulation of a BHA used in a drilling operation. The drilling simulation is referred to as being "dynamic" because the drilling is a "transient time simulation," meaning that it is based on time or the incremental rotation of the drilling tool assembly. Methods for such dynamic drilling simulations are known to the assignee of the current application, such as those disclosed in U.S. Pat. Nos. 6,516,293, 7,844,426, 7,139,689, and 7,464,013 all of which are incorporated by reference in their entirety.

One example of a method that may be used to simulate a drilling tool assembly in accordance with one or more embodiments of the disclosure is disclosed in U.S. Pat. No. 6,785,641 entitled "Simulating the Dynamic Response of a Drilling Tool Assembly and its Application to Drilling Tool Assembly Design Optimizing and Drilling Performance Optimization", which has been incorporated by reference in its entirety. In accordance with this method, properties of the BHA to be simulated are provided as input. The input may include BHA parameters, well bore parameters, and drilling operating parameters.

In a BHA, the drill string includes several joints of drill pipe connected end to end, and the BHA includes one or more drill collars and a drill bit attached to an end of the BHA. The BHA may further include additional components, such as stabilizers, a downhole motor, MWD tools, and LWD tools, subs, hole enlargement devices, jars, accelerators, thrusters, and/or a rotary steerable system, for example. Therefore, in accordance with embodiments of the disclosure, a BHA may be a single segment of drill pipe attached to a drill bit, or as complex as a multi-component drill string that includes a kelly, a lower kelly cock, a kelly saver sub, several joints of drill pipe with tool joints, etc., and a multi-component BHA that includes drill collars, stabilizers, and other additional specialty items (e.g., reamers, valves, MWD tools, mud motors, rotary steerable systems, etc.) and a drill bit.

While the BHA is generally considered to include a drill bit, in the example method discussed below, the detailed interaction of the drill bit with the bottomhole surface during drilling is generally considered separately. This separate consideration of the drill bit in detail allows for the interchangeable use of any drill bit model in the drilling tool assembly simulation as determined by the system designer. Drill bits used and modeled in one or more embodiments of the disclosure may include, for example, fixed cutter bits, roller cone bits, hybrid bits (bits having a combination of fixed cutters and rolling cutting structure), bi-centered bits, reaming bits, or any other cutting tool used during the drilling of earth formation. One of ordinary skill in the art will appreciate that the drilling simulation method may consider the drill bit jointly with the drilling tool assembly without departing from the scope of the disclosure.

In one embodiment, the drilling simulation is based on a particular formation. In other words, the drilling simulation is tailored to the geologic characteristics of the formation of interest. The geologic characteristics of the formation may be obtained through offset well data, field tests, predictions, or through any other method known in the art.

Drilling simulation of a drilling tool assembly may assist in predicting the direction of drilling. As mentioned above, the driller may require that directional motors be used to "build" an angle in the well. A build angle is the rate that the direction of the longitudinal axis of the well bore changes, which is commonly measured in degrees per 100 feet. The extent of the build angle may also be referred to as the "dogleg severity." Another important directional aspect is the "walk" rate. The walk rate refers to the change in azimuthal (compass) direction of the wellbore. Control and prediction of the drilling direction is important for reaching target zones containing hydrocarbons.

The dip angle is the magnitude of the inclination of the formation from horizontal. The strike angle is the azimuth of the intersection of a plane with a horizontal surface. Other drilling operating parameters and well bore parameters are also obtained. For the purposes of calibrating the model and having a baseline for potential solutions, a drilling simulation using the drilling information and the previously used drilling tool assembly is performed.

Embodiments disclosed herein relate to comparing and/or analyzing BHA performance against various criteria. Evaluation of BHA performance prior to actually drilling a well by simulating the performance can save drilling operators hundreds of thousands of dollars. By predicting failure and/or identifying likely problems with a proposed drilling plan, operators can modify the equipment or the drilling conditions to avoid a problem.

Figure 4:
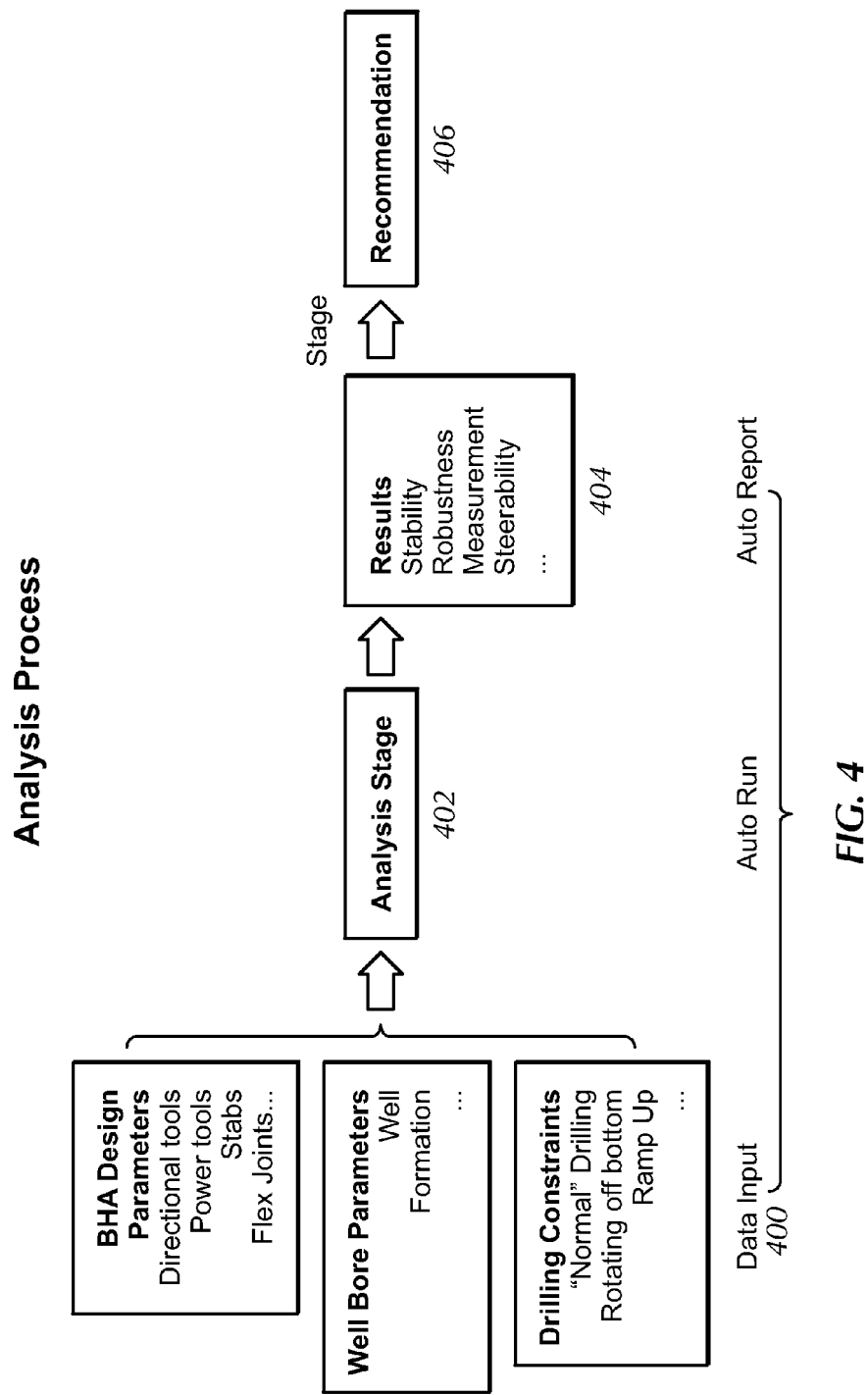
FIG. 4 shows an overview of one embodiment of an analysis process used in the disclosure.

FIG. 4 shows one embodiment of a method that involves the evaluation of a BHA. As noted above, the drilling simulation may be performed using one or more of the methods set forth in U.S. patent application Ser. No. 09/524,088 (now U.S. Pat. No. 6,516,293), Ser. No. 09/635,116 (now U.S. Pat. No. 6,873,947), Ser. Nos. 10/749,019, 09/689,299 (now U.S. Pat. No. 6,785,641), Ser. Nos. 10/852,574, 10/851,677, 10/888,358, and 10/888,446, U.S. Pat. No. 8,401,831, all of which are expressly incorporated by reference in their entirety.

FIG. 4 shows one embodiment of an analysis process in accordance with disclosed embodiments. In the data input stage 400, the BHA design parameters, well bore parameters, drilling operating parameters, and drilling constraints are entered into a simulation program.

Examples of BHA design parameters include the type, location, and number of components included in the drilling tool assembly; the length, ID, OD, weight, and material properties of each component; the type, size, weight, configuration, and material properties of the drill bit; and the type, size, number, location, orientation, and material properties of the cutting elements on the drill bit. Material properties in designing a drilling tool assembly may include, for example, the strength, elasticity, and density of the material.

The present disclosure also allows for the use of dynamic inputs. Dynamic inputs are an input whose value changes during the course of the simulation. For example, in certain embodiments provided below, the effect of "ramping up" the RPM may be analyzed. In such an embodiment, the RPM starts at zero and then increases to a final rate set by the designer over the course of the simulation. Similarly, the weight on bit and or the rate of penetration can be used as dynamic inputs as well.

Well bore parameters may include the geometry of a well bore and formation material properties. The trajectory of a well bore in which the drilling tool assembly is to be confined also is defined along with an initial well bore bottom surface geometry. Because the well bore trajectory may include either straight, curved, or a combination of straight and curved sections, well bore trajectories, in general, may be defined by parameters for each segment of the trajectory. For example, a well bore may be defined as comprising N segments characterized by the length, diameter, inclination angle, and azimuth direction of each segment and an indication of the order of the segments (i.e., first, second, etc.). Well bore parameters defined in this manner may then be used to mathematically produce a model of the entire well bore trajectory. Formation material properties at various depths along the well bore may also be defined and used. One of ordinary skill in the art will appreciate that well bore parameters may include additional properties, such as friction of the walls of the well bore and well bore fluid properties.

Drilling operating parameters typically include the rotary table (or top drive mechanism), speed at which the drilling tool assembly is rotated (RPM), the downhole motor speed (if a downhole motor is included) and the hook load. Furthermore, drilling operating parameters may include drilling fluid parameters, such as the viscosity and density of the drilling fluid, for example. It should be understood that drilling operating parameters are not limited to these variables. In other embodiments, drilling operating parameters may include other variables (e.g. rotary torque and drilling fluid flow rate). Additionally, for the purpose of drilling simulation, drilling operating parameters may further include the total number of drill bit revolutions to be simulated or the total drilling time desired for drilling simulation. Once the parameters of the system (i.e., drilling tool assembly under drilling conditions) are defined, they may be used with various interaction models to simulate the dynamic response of the BHA for a given drilling constraint.

In this embodiment, drilling constraints refer to the type of simulation being performed. In this embodiment, they are normal drilling (i.e., no modifications); RPM ramping up, while drilling; RPM ramping up, when off bottom; drilling interbedded formations; drilling inhomogeneous formations; high well wall friction; effect of eccentricity; and directional tendency. Specifically, a set of drilling constraints are applied, each having different operating conditions, excitations, and/or environments, and BHA packages are directly compared against one another under these constraints. While a number of drilling constraints are described with respect to the below embodiments, those having ordinary skill in the art will appreciate that other drilling constraints could be used.

After the data input stage 400, analysis stage 402 begins. In the analysis stage 402 a drilling simulation is performed, using simulation techniques described above. Following the analysis stage 402, the method proceeds to the results stage 404.

In the results stage 404, various output are considered for determining which BHA assembly may be preferred for a given criteria. Examples of information produced in the result stage 404 includes rate of penetration (ROP), rotary torque required to turn the drilling tool assembly, rotary speed at which the drilling tool assembly is turned, drilling tool assembly lateral, axial, or torsional vibrations induced during drilling, weight on bit (WOB), forces acting on components of the drilling tool assembly, and forces acting on the drill bit and components of the drill bit (e.g., on blades, cones, and/or cutting elements). Drilling performance parameters may also include the inclination angle and azimuth direction of the borehole being drilled.

In some embodiments, the simulation provides visual outputs. In one embodiment, the visual outputs may include performance parameters. Performance parameters, as used herein may include rate of penetration (ROP), forces encountered, force imbalance, degree of imbalance, maximum, minimum, and/or average forces (including but not limited to vibrational, torsional, lateral, and axial). The outputs may further include stress information, bending moments, directional data, RPM fluctuation, and other outputs that are shown in any of the incorporated references, or are additionally shown herein.

The outputs may include tabular data of one or more performance parameters. Additionally, the outputs may be in the form of graphs of a performance parameter, with respect to time, or with respect to location along the BHA, for example. When the outputs are given based on location along the BHA the outputs may be presented as an average value for each location as well as other percentages, such as 5%, 10%, 25%, 75%, 90%, and 95%. Other plots may include presentation of the results at a minimum or maximum value, or any combination of those results. A graphical visualization of the drill bit, drill string, and/or the drilling tools (e.g., a hole opener) may also be output. The graphical visualization (e.g., 2-D, 3-D, or 4-D) may include a color scheme for the drill string and BHA to indicate performance parameters at locations along the length of the drill string and bottom hole assembly.

In this embodiment, four drilling criteria are analyzed. They are steerability; stability; robustness; and measurement quality. Within steerability, the buildup rate, dogleg severity, and other factors known in directional drilling, and explained in more detail below may be analyzed. Factors that influence the steerability analysis include, but are not limited to, the desired bore hole trajectory, various BHA components such as bits, stabs, and flex joints, the formation type, and operating parameters such as weight on bit, revolutions per minute, and the flow rate of drilling mud.

Within stability, the vibration of the bit and BHA, including axial, lateral, and rotational vibrations may be analyzed. Various drilling operations which may affect BHA stability, such as drilling, forward or backward reaming, rotating off bottom, reaming with a reamer, and the rotation of the BHA in a reamed section may be analyzed. In addition, the behavior of the bit, reamer, stabs, drilling string wellbore contact, mud motor, and rotary steerable system may be analyzed. The effects of the well bore (as providing friction), imbalance or eccentricity of the system, and WOB/RPM/Flow rate oscillation may be considered as well. In addition, the effects of the formation (via interbedded formations or inhomogeneity) may be studied. Damping factors, contact with the well bore, and surface control measures (such as reducing torque) can be analyzed as well.

With respect to the overall robustness of the BHA, the various components can be analyzed for excessive bending moments, torques, axial force, stress, vibrations, contact forces, and buckling Material aspects of each of the components (such as the stiffness and modulus of elasticity) may be modified and analyzed for their effects on the robustness of the BHA.

With respect to the measurement quality, LWD tool or other measurement tool sensor positions may be analyzed. In particular, deformation and bending of the drill string may cause the sensors to be off center. Further, the motion of sensors (i.e., the dynamic movement of the sensor location) may be analyzed to predict effects on sensor performance. The potential contact with the formation and that effect on sonic tools, for example, may be analyzed. Sag of the BHA and its impact on other drilling and instrumentation packages may be analyzed. Particularly, deformation and bending of the drill string (or portions thereof) may cause the collar angle to change, impacting sensor performance. Also, spacing from magnetic components can be analyzed.

Figure 17:
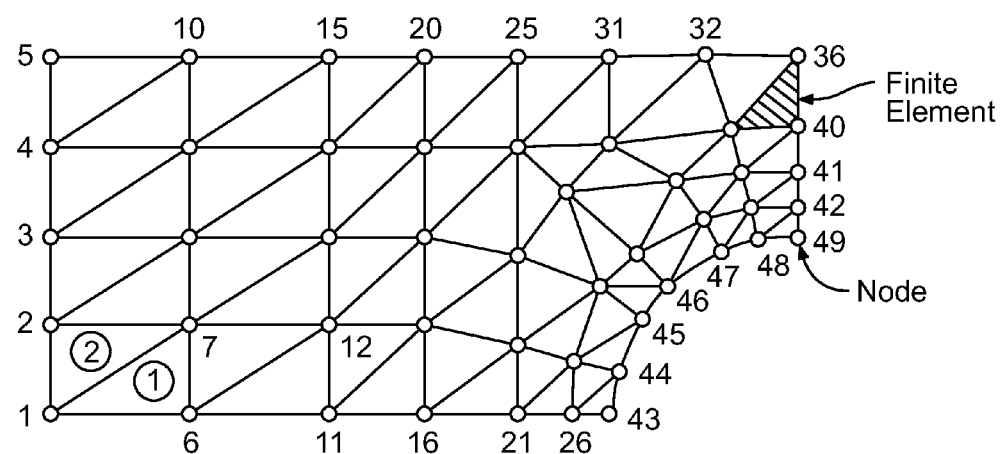
FIG. 17 shows how FEA nodes may be assigned in accordance with an embodiment of the present disclosure.

In this embodiment, the BHA is modeled with beam elements (using finite element analysis (FEA) techniques as known in the art). Briefly, FEA involves dividing a body under study into a finite number of pieces (subdomains) called elements. Such a division is shown in FIG. 17.

Particular assumptions are then made on the variation of the unknown dependent variable(s) across each element using so-called interpolation or approximation functions. This approximated variation is quantified in terms of solution values at special element locations called nodes.

Through this discretization process, the method sets up an algebraic system of equations for unknown nodal values which approximate the continuous solution. Because element size, shape and approximating scheme can be varied to suit the problem, the method can accurately simulate solutions to problems of complex geometry and loading.

Each beam element has two nodes. For a MWD/LWD tool, for example, the tool is divided into beam elements, based on the geometry of the tool and sensor locations. The nodes are located at the division points of the elements. During the simulation, the wellbore is drilled by the bit and propagates as the bit progresses. A wellbore is formed from drilling. The BHA is confined in the wellbore. The BHA moves dynamically during the simulation, depending on the loading and contacting conditions as well as initial conditions.

When the BHA moves in the well bore, the nodes will have history of accelerations, velocity, and displacement, etc. The location of the nodes referencing to the well center or wellbore can be determined. The sensors have fixed location on the tool. The sensors relative location can then be calculated. Some sensor measurements can be affected by the movement of the BHA.

For example, the directional sensors in MWD measures inclination and azimuth angle of the well. The directional sensor does not measure the angle of the well directly. Instead, the directional sensor measures the angle of the MWD collar. When the collar sags due to gravity, or bends due to dynamics, the angle of the collar can vary. The measurement of the well by measuring the collar will introduce more errors if sag/bend is more severe. As another example, LWD tools measuring formation density can be affected by the gap between the sensor and the wellbore. If the gaps keep changing, it can effect the density measurements. Thus, in one or more embodiments, one or more BHA's may be simulated according to one or more drilling scenarios to analyze sag of the MWD or other measurement tools and/or to consider changes in the distance between the MWED or other measurement tool and the wellbore wall.

Representative results that are produced by the simulation include accelerations at the bit, reamer, stabs and other locations; velocities at the bit, reamer, stabs and other locations; displacements at the bit, reamer, stabs, and other locations; the trajectory of the bit, reamer, stabs, and other locations; torque of the bit, reamer, stabs, and other locations; and contact force of the bit, reamer, stabs, and other locations. Any or all of these results may be produced in the form of a time history, box and whisker plots, 2D or 3D animations and pictures.

Specifically, with respect to steerability, the well path trajectory, the well bore diameter, the inclination angle, the azimuthal angle, the tool face angle, the build up rate, and the drill string length/bend may be analyzed. With respect to the robustness, the stress along the BHA, the internal force along the BHA (such as bending moment, torque, and axial force) may be reviewed. With respect to measurement quality, as noted above, the sensor location acceleration, velocity, displacement, and center trajectory may be analyzed.

Returning to FIG. 4, after the results stage 404, a recommendation stage 406 begins. In the recommendation stage 406, a proposed BHA design is selected based on one at least one of the four criteria discussed above. In select embodiments, the analysis stage 402 and the results stage 404 may be automated. If they are automated, a designer enters in the inputs 400, and then the computer automates the simulation and produces a pre-selected results package. In such an embodiment, the reporting of the results may be standardized to produce a standard results package for any series of inputs. In this manner, a number of BHA designs can be compared against a standard series of reports. In the embodiment explained below, there are 8 types of analysis, and the user can select one of them or a combination of them. The report will compare all the proposed BHA designs for the different analyzed conditions.

Turning to FIG. 5, an overview of the simulation capabilities is shown. Specifically, in FIG. 5, a number of uses of the simulation is shown at 502. Various objectives, including stability, steerability, durability, and measurement quality are shown at 504. A number of modeling factors are shown at 506. In one embodiment, the simulation may be used 502, to select or design one or more cutting tools, such as reamers, or drill bits. The simulation may also be used to optimize a BHA design. The simulation can be used to provide a "map" of drilling parameters (i.e., to produce predicted drilling behavior for a given BHA under a range of parameters). The simulation may also be used to troubleshoot problems that have developed in the field (i.e., to perform an "autopsy" of drilling performance, to predict what caused a drill bit, or a component of the BHA to fail). The simulation may also be used to plan a well (i.e., to suggest to a drilling operator how to drill a well, what components to include in the BHA, to suggest one or more suitable drill bits, and how to target a production zone).

Still referring to FIG. 5, the simulation may be used to satisfy a performance criteria (or objective 504), as noted above. These performance criteria can include one or more selected from stability (i.e., location at the vibrations at the drill bit, at components of the BHA, or the overall vibration profile), steerability (i.e., predict the build up rate, the dogleg severity, and walk rate), the efficiency (i.e., predict the rate of penetration for a given BHA package in a given formation), the durability (i.e., the resistance to material fatigue and/or failure), the well trajectory (including inclination and azimuthal directions), and/or the measurement quality (i.e., predicting the quality of measurement as a function of reproduceability, nearness to the borehole wall, and other considerations, discussed below).

Still referring to FIG. 5, there are a number of factors 506, that the simulation can include or a designer can modify. For example, within the subset of cutting structures, a variety of tools can be modified or analyzed, such as PDC bits, roller cone bits, bi-center bits, and reamers. Power tools, such as straight hole motors, or straight hole turbines, can be modeled or modified as part of the analysis. Steering tools, such as steerable motors, steerable turbines, rotary steerable systems (push the bit, point the bit, and hybrid push/point systems) may all be modeled and/or modified. Tubular components of a BHA such as drill pipe, heavy weight drill pipe, drilling collars, and flex joints, may be added, modeled, or modified in the simulation (including the location and number, as well as the material properties). Various stabilizing tools such as stabilizers, roller reamers, and other stabilizers can similarly be included in the modeling. Specialty BHA components, such as jars, thrusts, and shock subs may also be included in the simulation. In addition, various operating parameters may be used to predict performance of a BHA package, such as the WOB and RPM. A number of drilling conditions, such as sliding, rotating, steering, neutral, backwards or forwards reaming, or rotating off bottom, may also be analyzed. Various wellbore properties, such as trajectory, tortuosity, hole size, and friction, may also be analyzed. In addition, formation properties such as interbedded formations, compressive strength of the formation, anisotropy, dip, strike, and inhomogeneity of the formation may be analyzed as well.

Figure 6A:
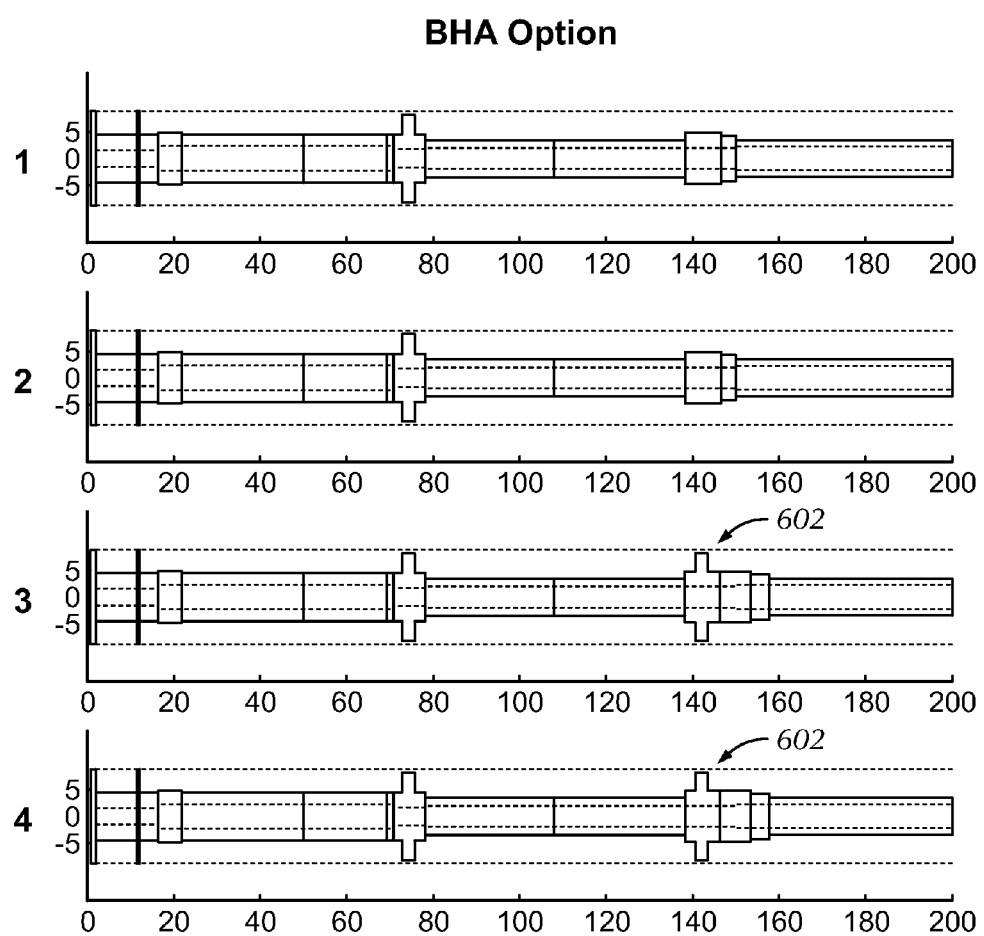
FIG. 6A shows an exemplary group of bottomhole assembly packages that are analyzed in accordance with an embodiment of the disclosure.
Figure 6B:
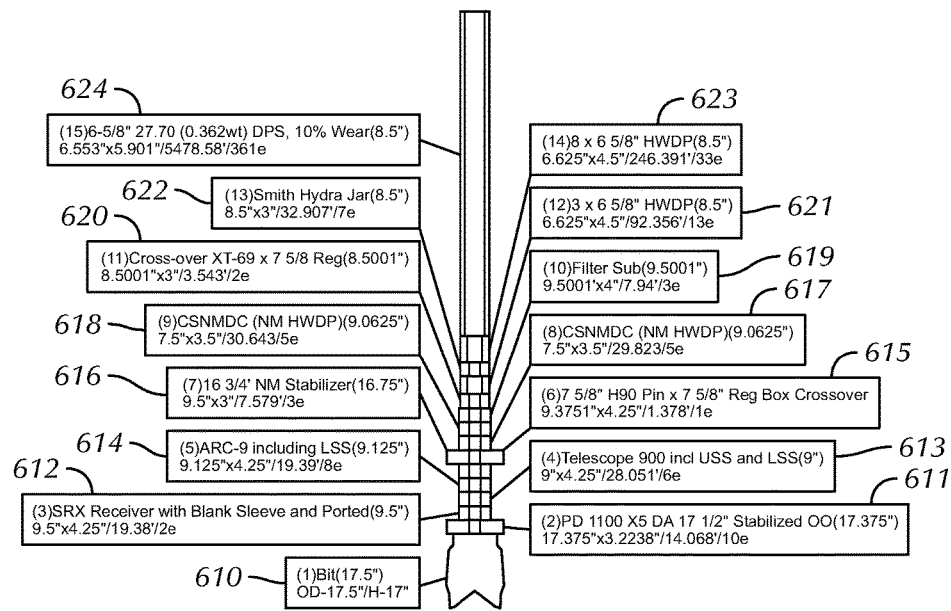
FIGS. 6B-6E show information about the group of bottomhole assembly packages of FIG. 6A.

Turning to FIGS. 6A-6E an embodiment of the present disclosure is shown. In FIG. 6A, four competing BHA designs are shown (BHA1, BHA2, BHA3, and BHA4). As shown in FIG. 6A, BHA3 and BHA4 contain a secondary stabilizer (602), or "stab," located approximately 142 feet from the bit, that BHA1 and BHA2 do not possess. Turning to FIG. 6B, the components of BHA1 are shown, and the dimensions of each component are shown in the corresponding table. A PDC bit, in this embodiment, 610 is located at the bottom of the BHA assembly. The PDC bit 610 has a number of cutting elements (shown in FIG. 6F) that engage and cut the formation. Moving up the BHA (towards the surface), FIG. 6B contains a rotary steerable system 611, and a receiver sub 612. BHA1 also contains an MWD and LWD apparatuses at 613 and 614, respectively. A pin/box crossover is also modeled at 615. A 16.75" stabilizer is modeled at 616. Heavy weight drill pipe is then modeled at 617 and 618. A filter sub is modeled at 619. A crossover is modeled at 620, and another section of heavy weight drill pipe is modeled at 621. A jar is modeled at 622, and another section of heavy weight drill pipe is modeled at 623. A long section of drill pipe (roughly 5,500 feet) is then modeled at 624. Those having ordinary skill in the art will appreciate that these are merely representative of BHA components and that more or less components may be included in the FEA model.

Figure 6C:
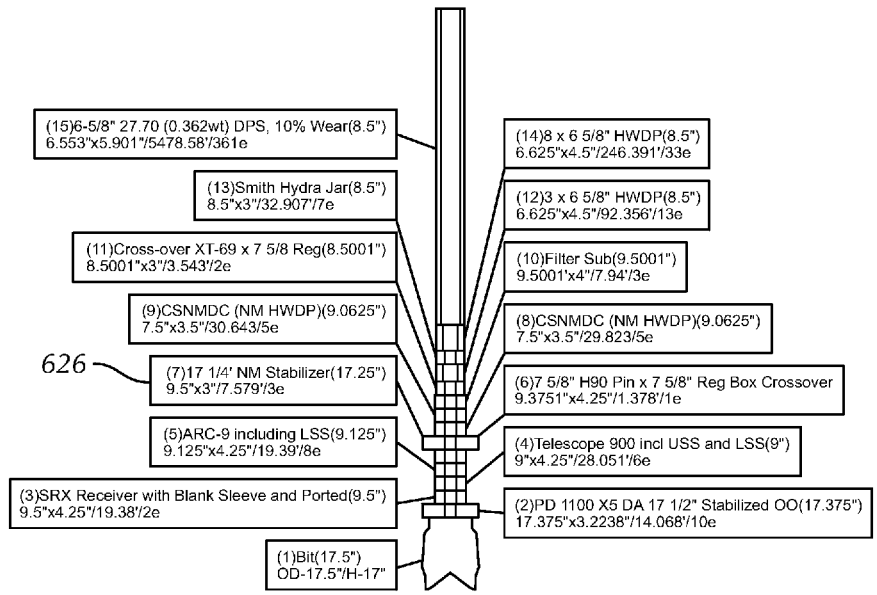

Turning to FIG. 6C, a layout for BHA2 is shown. The difference between BHA1 and BHA2 is shown at 626, where BHA2 has a larger stabilizer (17.25") than BHA1. The other components remain identical to that shown in BHA1. Again, those having ordinary skill in the art will appreciate that there is no restriction on the differences between two (or more) BHA packages to be compared.

Figure 6D:
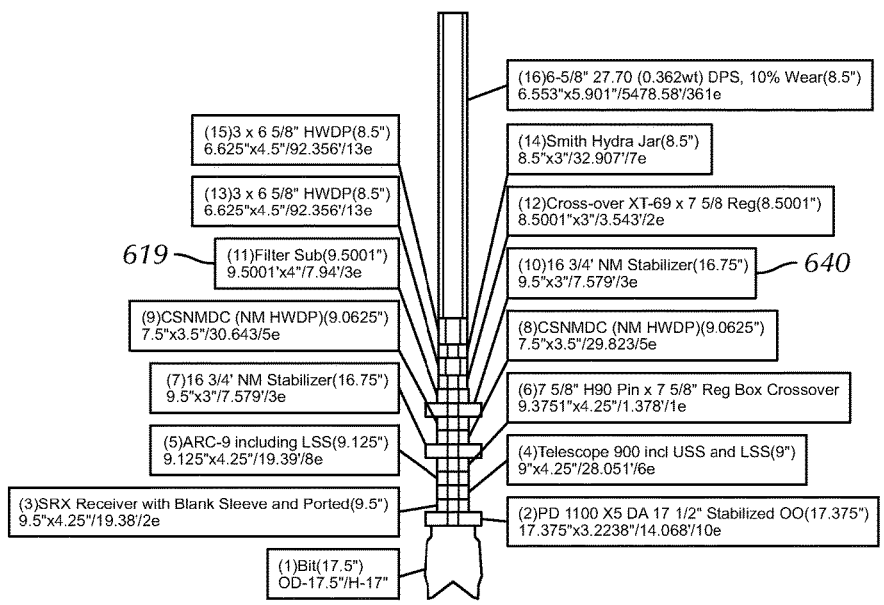
Figure 6E:
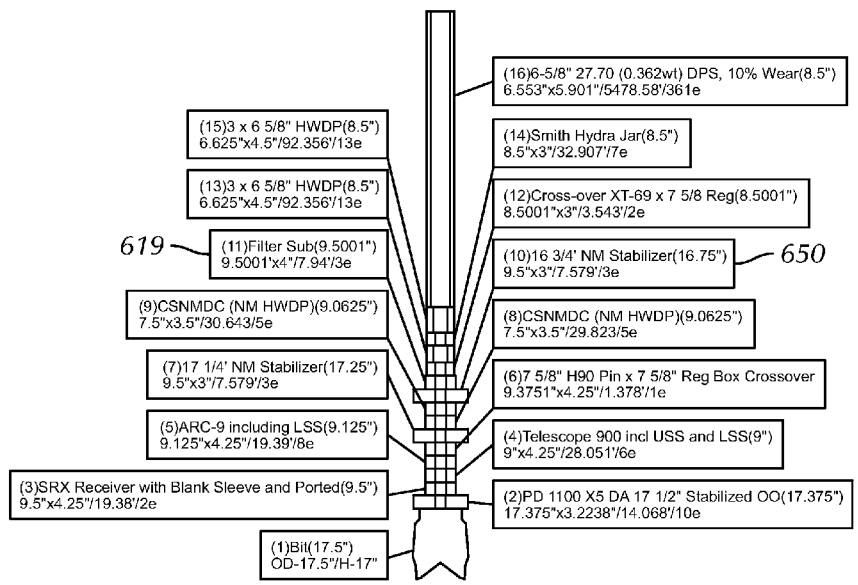

Turning to FIG. 6D, a layout for BHA3 is shown. BHA1 and BHA3 have similar components, except that BHA3 has an additional 16.75" stabilizer 640 located just below the filter sub 619. Similarly, turning to FIG. 6E, a layout for BHA4 is shown. BHA2 and BHA4 have similar components, except that BHA4 has an additional 16.75" stabilizer 650 located just below the filter sub 619.

Each of the BHA designs has a number of components shown, such as drill pipe, stabilizers, drill bits, stiffeners, reamers, collars, subs, and other components known in the art. Specifically, the designer inputs a series of information about the drill string, as noted above in the input phase 400, and can produce a picture showing the various selected components. The BHA's shown in FIG. 6A are merely representative of the types of components that may be modeled, and no restriction on the scope of the disclosure is intended by reference to components that are or are not present. Those having ordinary skill in the art will appreciate that a BHA package may contain some, all, or additional components than those shown in FIG. 6A. FIG. 6B is a chart comparing the four competing BHA designs.

To analyze the performance of the competing BHA designs, FIG. 7 shows eight different simulation scenarios that are used as the drilling operating parameters. More information about each of the scenarios is provided below.

Simulation 1: Normal Drilling

| | |
|---|---|
| Depth (ft) | 12796 |
| BHA Excitation Type | Normal Drilling |
| Rock1 at Bit | Pierre Shale 2 Shale (0-2 ksi) |
| Rock2 at Bit | NA |
| WOBs (klbs) | 40 |
| RPMs | 180 |
| Mud Weight (ppg) | 12.4 |
| Steering | 0% |
| Simulation Length (revs) | 480 |

Simulation 2: RPM Ramping Up

| | |
|---|---|
| Depth (ft) | 12796 |
| BHA Excitation Type | RPM Ramping Up |
| Rock1 at Bit | Pierre Shale 2 Shale (0-2 ksi) |
| Rock2 at Bit | NA |
| WOBs (klbs) | 20, 30, 40 |
| RPMs | 10-300 |
| Mud Weight (ppg) | 12.4 |
| Steering | 0% |
| Simulation Length (revs) | 460 |

Simulation 3: RPM Ramping Up as Bit Off Bottom

| | |
|---|---|
| Depth (ft) | 12796 |
| BHA Excitation Type | RPM Ramping Up (Bit Off Bottom) |
| Rock1 at Bit | NA |
| Rock2 at Bit | NA |
| WOBs (klbs) | NA |
| RPMs | 10-300 |
| Mud Weight (ppg) | 12.4 |
| Steering | 0% |
| Simulation Length (revs) | 460 |

Simulation 4: Transitional Drilling (Drilling Through Soft Formation to Hard Formation)

| | |
|---|---|
| Depth (ft) | 12796 |
| BHA Excitation Type | Interbedded Formation Drilling |
| Rock1 at Bit | Pierre Shale2 Shale (0-2 ksi) |
| Rock2 at Bit | Carthage Marble (15-20 ksi) |
| WOBs (klbs) | 40 |
| RPMs | 180 |
| Mud Weight (ppg) | 12.4 |
| Steering | 0% |
| Simulation Length (revs) | 480 (formation transition @ 240 revs) |

Simulation 5: Inhomogeneous Formation Drilling

| | |
|---|---|
| Depth (ft) | 12796 |
| BHA Excitation Type | Inhomogeneous Formation Drilling |
| Rock1 at Bit | Pierre Shale2 Shale (0-2 ksi) |
| Inhomogeneity1 at Bit | Size 0.5", Cov 50%, Multiplier 3 |
| WOBs (klbs) | 40 |
| RPMs | 180 |
| Mud Weight (ppg) | 12.4 |
| Steering | 0% |
| Simulation Length (revs) | 480 |

Simulation 6: Drilling with High Well Friction

| | |
|---|---|
| Depth (ft) | 12796 |
| BHA Excitation Type | Drilling w/ High Well Friction (0.5) |
| Rock1 at Bit | Pierre Shale2 Shale (0-2 ksi) |
| Rock2 at Bit | NA |
| WOBs (klbs) | 40 |
| RPMs | 180 |
| Mud Weight (ppg) | 12.4 |
| Steering | 0% |
| Simulation Length (revs) | 480 |

Simulation 7: Drilling with BHA Eccentricity

| | |
|---|---|
| Depth (ft) | 12796 |
| BHA Excitation Type | Eccentricity in BHA (0.5" in MWD and Stab) |
| Rock1 at Bit | Pierre Shale2 Shale (0-2 ksi) |
| Rock2 at Bit | NA |
| WOBs (klbs) | 40 |
| RPMs | 180 |
| Mud Weight (ppg) | 12.4 |
| Steering | 0% |
| Simulation Length (revs) | 480 |

Simulation 8: Directional Drilling Prediction

| | |
|---|---|
| Depth (ft) | 4000 |
| BHA Excitation Type | Normal Drilling |
| Rock1 at Bit | Pierre Shale 2 Shale (0-2 ksi) |
| Rock2 at Bit | NA |
| WOBs (klbs) | 40 |
| RPMs | 180 |
| Mud Weight (ppg) | 12.4 |
| Steering | 100% |
| Simulation Length (ft) | 90 |

In the tables above, therefore, eight different drilling constraints are analyzed for each of the four BHA packages to be analyzed. These constraints are not intended to be all of the conditions possible, but rather are representative of the types of drilling employed by various drillers. In particular, simulation 1 is a baseline case, where "normal" drilling is performed (i.e., no additional constraints are added). Simulation 2 is performed with the RPM increasing, while the bit is drilling, as the WOB increases. Simulation 3 is performed with the RPM increasing, while the bit is off-bottom, which is shown in the table where the WOB is listed as NA.

Scenarios 2 and 3 are used to simulate the increasing of RPM from 0 to a certain number, for example, from 0 to 300 RPM. When the drill string is rotating at different RPM, it may have different response. When the RPM is at or close to the natural frequency of the drill string, the vibration will be more severe. By ramping up the RPM, some critical rotating speed can be identified for different BHA's. It is desirable to have critical speed far away from the drilling operational range. By optimizing a BHA package to avoid the critical speed, the BHA is more likely to drill smoothly. By identifying a critical rotating speed, suggestions to the drilling operator may be made to avoid those RPM when drilling or rotating off bottom to reduce the chance of exciting severe vibration.

In simulation 4, the drilling between two formations types of interest is shown, where the first formation is a soft shale formation having a compressive strength of 0-2 ksi, while the second formation is a hard carbonate formation having a compressive strength of 15-20 ksi.

In simulation 5, nodules of inhomogeneous formation (i.e., mixed hard regions and soft regions, within the same formation) are shown. Embodiments of the present disclosure provide the ability to model inhomogeneous regions and transitions between layers. With respect to inhomogeneous regions, sections of formation may be modeled as pie-shaped regions, nodules, or as a series of layers. A difference in radial direction between the regions may also be modeled. That is, a user may define a section of a formation as including various non-uniform regions, whereby several different types of rock are included as discrete regions within a single section. In particular, the user may define the number, size, and material properties of discrete regions (within a selected base region).

With respect to multilayer formations, embodiments of the present invention advantageously simulate transitions between different formation layers. As those having ordinary skill will appreciate, in real world applications, it is often the case that a single bit will drill various strata of rock. Further, the transition between the various strata is not discrete, and can take up to several thousands of feet before a complete delineation of layers is seen. This transitional period between at least two different types of formation is called a "transitional layer," in this application.

Significantly, embodiments disclosed herein provide an ability to analyze BHA performance when drilling through a transitional layer, the bit will "bounce" up and down as cutters start to hit the new layer, until all of the cutters are completely engaged with the new layer. As a result, drilling through the transitional layer mimics the behavior of a dynamic simulation. As a result, forces on the cutter, blade, and bit dynamically change.

Simulation 6 is performed with a high well friction (increasing forces associated with drilling and formation contact. In all of the simulations, the drill string contacts the wellbore. The normal contact force is calculated based on the motion of the nodes. The wellbore acts like a spring at the contact point. The node pushes the spring, and the contact force depends on how far the node pushes the spring.

There is a frictional force generated due to the contact. The magnitude of the force is the normal force multiplied by the friction coefficient. The direction of the frictional force is opposite to the speed of the node relative to wellbore. By increasing friction, more drag force from the wellbore will result on the drill string. This may cause more vibrations, increased torque to the surface, etc. Sometimes in the field, the wellbore may have local doglegs, or ledges. Those imperfections will generate more drag to the drillstring. The higher friction coefficient can be used to simulate those conditions.

Simulation 7 is performed with an eccentric BHA, when a mass is rotating off its center, it generates eccentric force. The force is proportional to the distance of the mass center to the rotating axis, and to the square of rotational speed. In the simulation, a user can specify the eccentricity of a component, i.e. how far is the center of mass is from the rotation axis. An eccentric force will be calculated and applied to corresponding nodes. This is to simulate drill string components that have non uniform mass distribution regarding to its nodes.

Simulation 8 is performed to predict directional drilling performance of the four BHA packages.

Each of these various simulations provide different challenges for a BHA designer. For example, in simulation 4, when transitioning from a soft formation to a hard formation, the drilling action causes a moment at the bit that tends to buckle the collar and deflect the collar from center line of the hole. Thus embodiments of the present disclosure allow a BHA designer to compare various designs (as shown below) under various criteria to determine the optimal BHA package for a given well. Because of the number of different types of wells that are being drilled, it is important to select an optimized BHA design for a given well. As shown below, by analyzing various outputs, and selecting a BHA design that meets the criteria explained above, an optimized BHA package can be developed.

FIG. 8 and associated figures illustrate exemplary outputs associated with simulation condition 1. The location of sensors and stabs are noted along the bottom of the graphs in this simulation condition and subsequent simulations. They are denoted as triangles (stab) and circles (sensor). BHA packages 3 and 4 contain an additional stabilizer as compared to BHA 1 and 2, located approximately 140 feet from the bit.

Figure 8A:
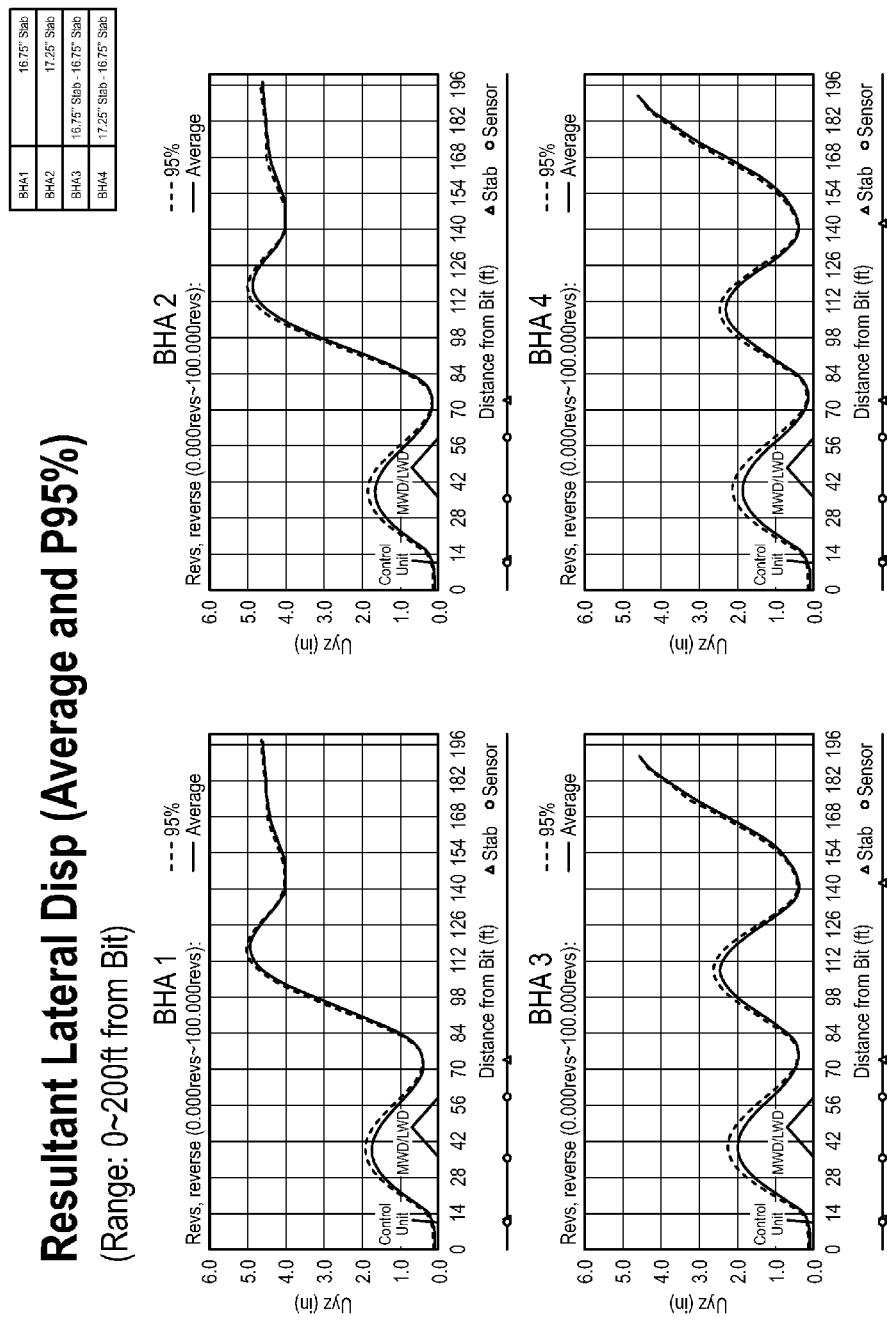

FIG. 8A illustrates lateral drop in a range 0-200 feet from the bit for each of the four BHA packages. All of the packages have an MWD/LWD system located approximately 50 feet from the bit. In FIG. 8A the average lateral displacement for the simulation is shown. As can be seen from the figure, BHA package 2 has the least amount of drop, which is shown on the Y-axis as a function of bit distance (along the X-axis). For the relevant range, the largest sag (approximately 2.25 inches) is shown in BHA 3, while BHA 2 has the smallest sag at approximately 1.8 inches.

Figure 8B:
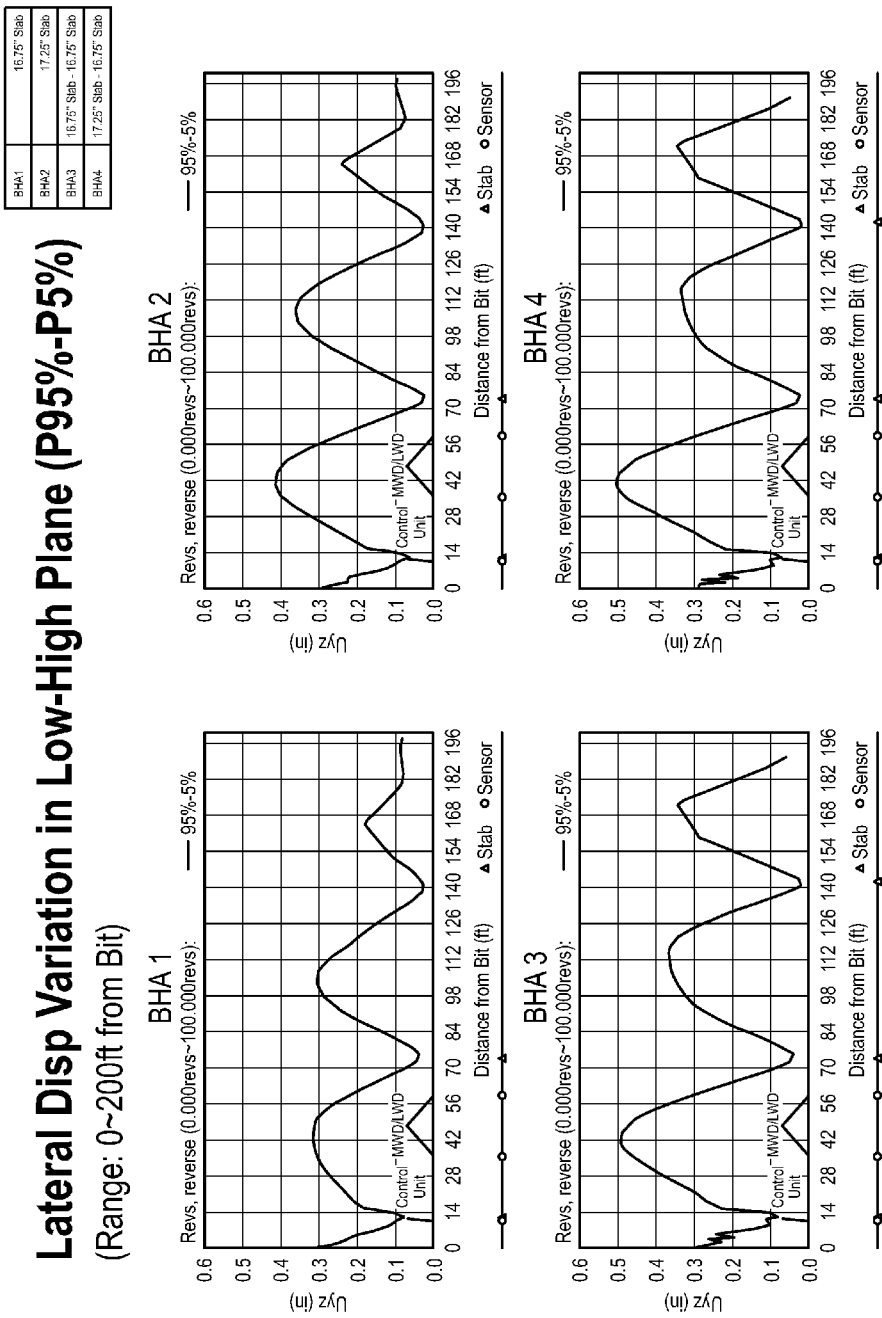

FIG. 8B illustrates the variation between lateral displacement at its highest and lowest values (i.e., measures the range of lateral displacement). As shown in FIG. 8B, BHA1 has the lowest variation at the sensor (approximately 0.31 inches), while BHA4 shows high variation at the sensor (approximately 0.5 inches). FIG. 8B also shows that for the entire 200 foot range from the bit, BHA1 has the least variation, while BHA3 and BHA4 have relatively high variation throughout the entire analyzed length.

FIG. 8C illustrates the collar deflection angle (caused by the lateral displacement). As mentioned above, MWD measures the inclination and azimuth of the hole. The collar bending angle can introduce a measuring error for each of the BHA packages. In this simulation, all of the BHA's have similar deflection angles (as shown on the Y-axis).

FIGS. 8A-8C, therefore, can provide useful comparison for BHA packages on the measurement quality. By decreasing the sag, or reducing the dynamic bending angle variation, more precise measurements can be made when either performing a static survey (i.e., when no movement of the BHA is occurring), or a real-time survey (i.e., when the drill string is moving).

Figure 8D:
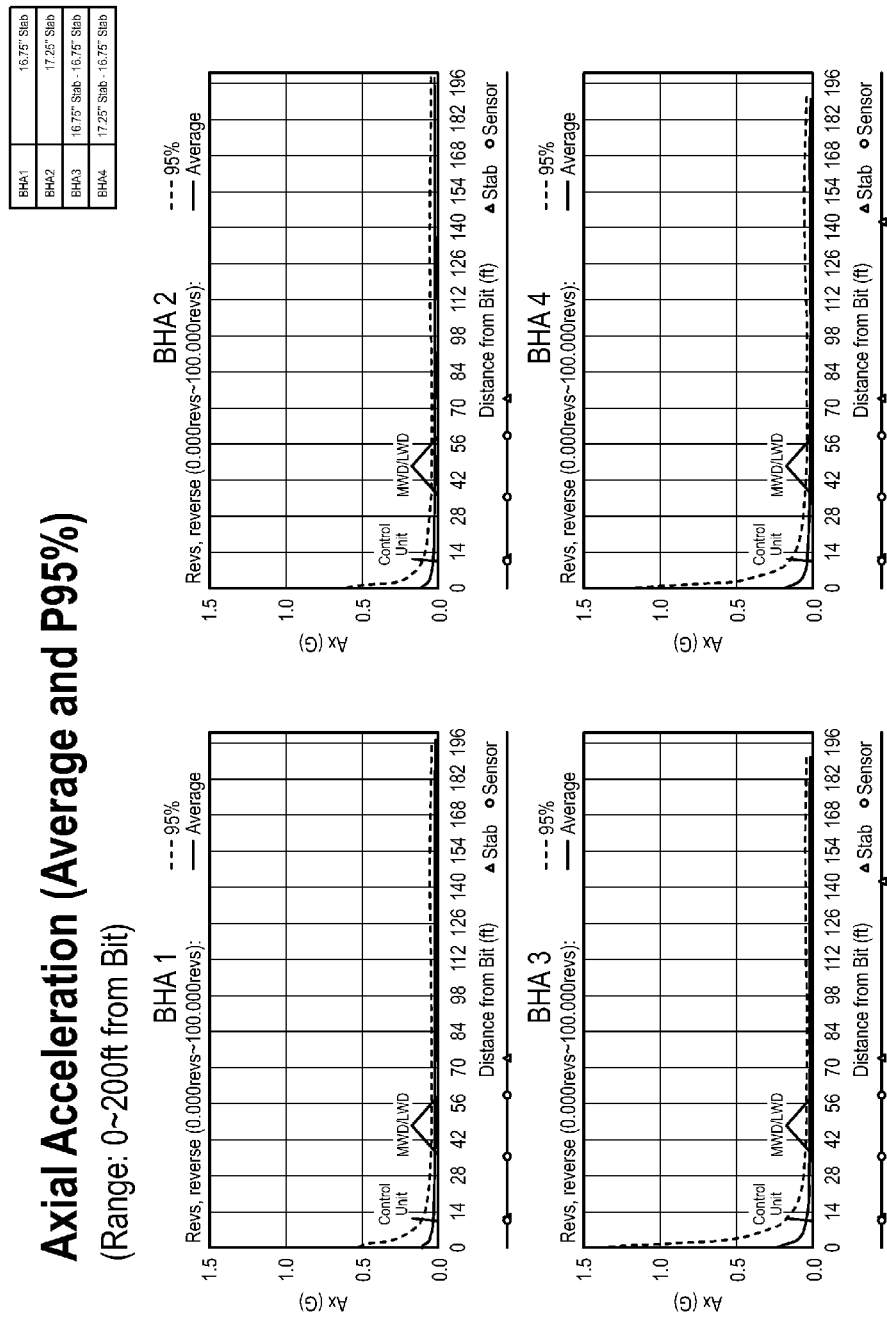

FIG. 8D illustrates the average axial acceleration. Axial acceleration of a node is in the direction tangent to the well path at the location of the node. Lateral acceleration is the acceleration in the direction normal to the tangent. Axial acceleration is measured in g-forces, as shown on the Y-axis, as a function of the distance from the bit, shown on the X-axis for each of the BHA packages. Here, BHA3 and BHA4 have higher average accelerations, over a longer period than BHA1 and BHA2.

Figure 8E:
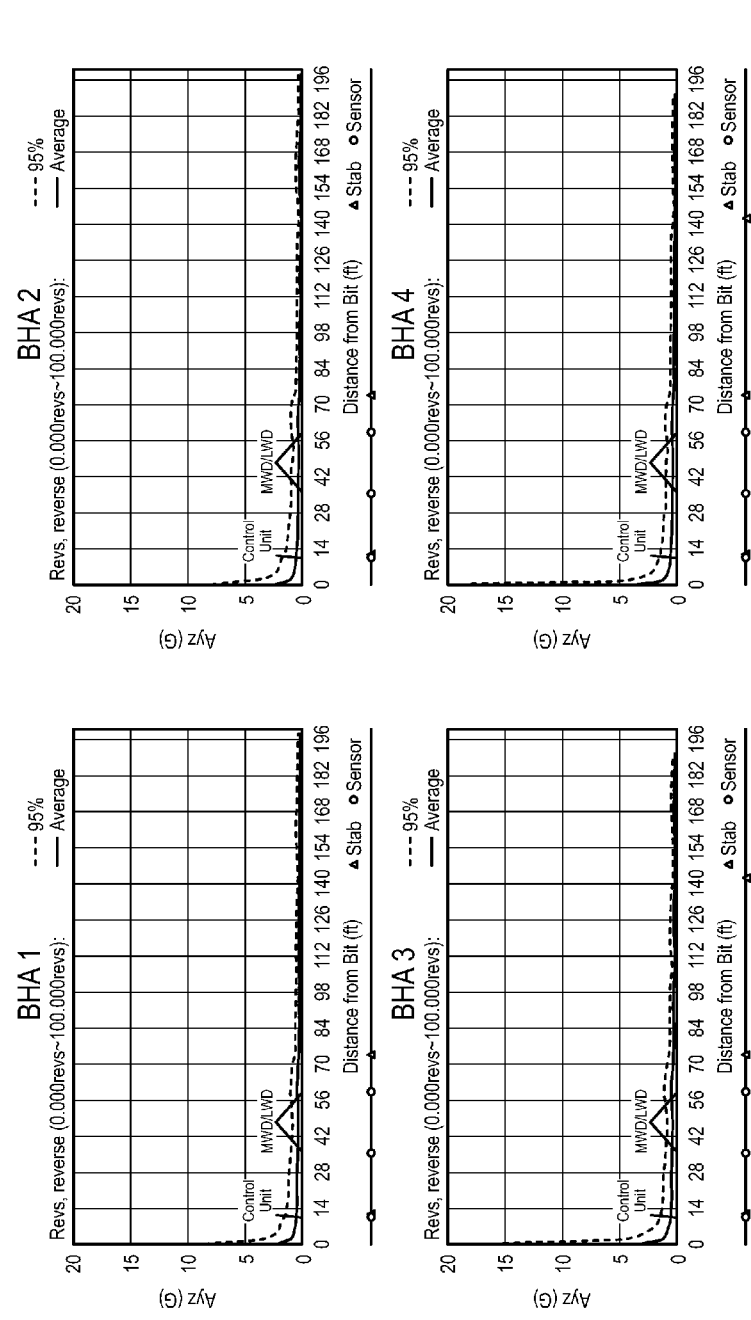

FIG. 8E illustrates the average lateral acceleration (as measured in g-forces, as shown on the Y-axis, as a function of the distance from the bit (X-axis)). Here, BHA3 and BHA4 once again show higher lateral accelerations as compared to BHA1 and BHA2.

FIGS. 8D and 8E, therefore, can be used to provide a comparison of the stability of the BHA package, as the lower the average acceleration in the lateral and axial planes, the more stable the package will be.

Figure 8F:
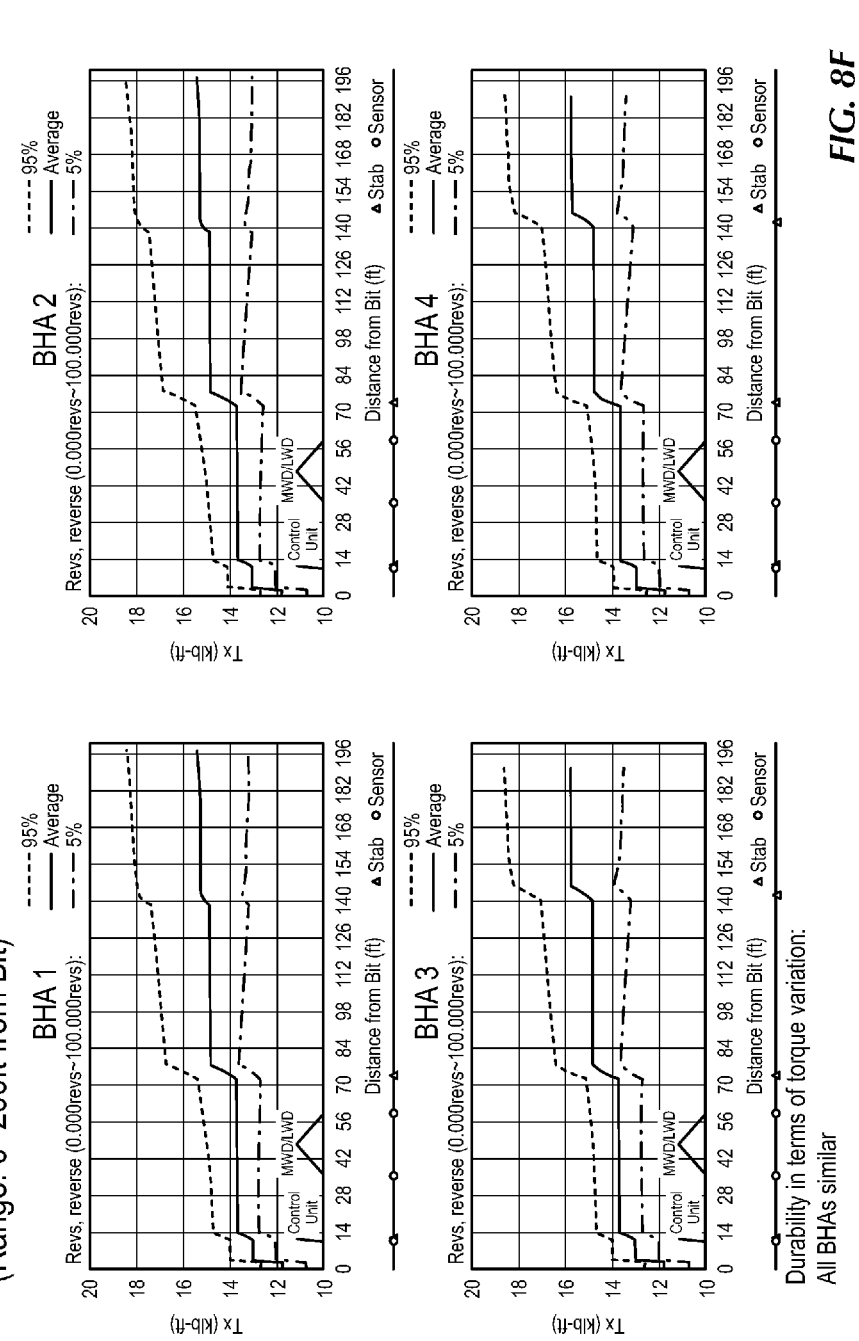

FIG. 8F illustrates the torque in a range 0-200 feet from the bit, measured in pounds-feet (along the Y-axis). All of the BHA packages show similar torque performance in this simulation. P5%, P95%, P50%, etc. are statistical representation of a variable. For example, if we have a history of axial acceleration, we try to find the statistic distribution of all the points. P5% number means that 5% of the points are below this value, P95% number means 95% of the points are below this value.

Figure 8G:
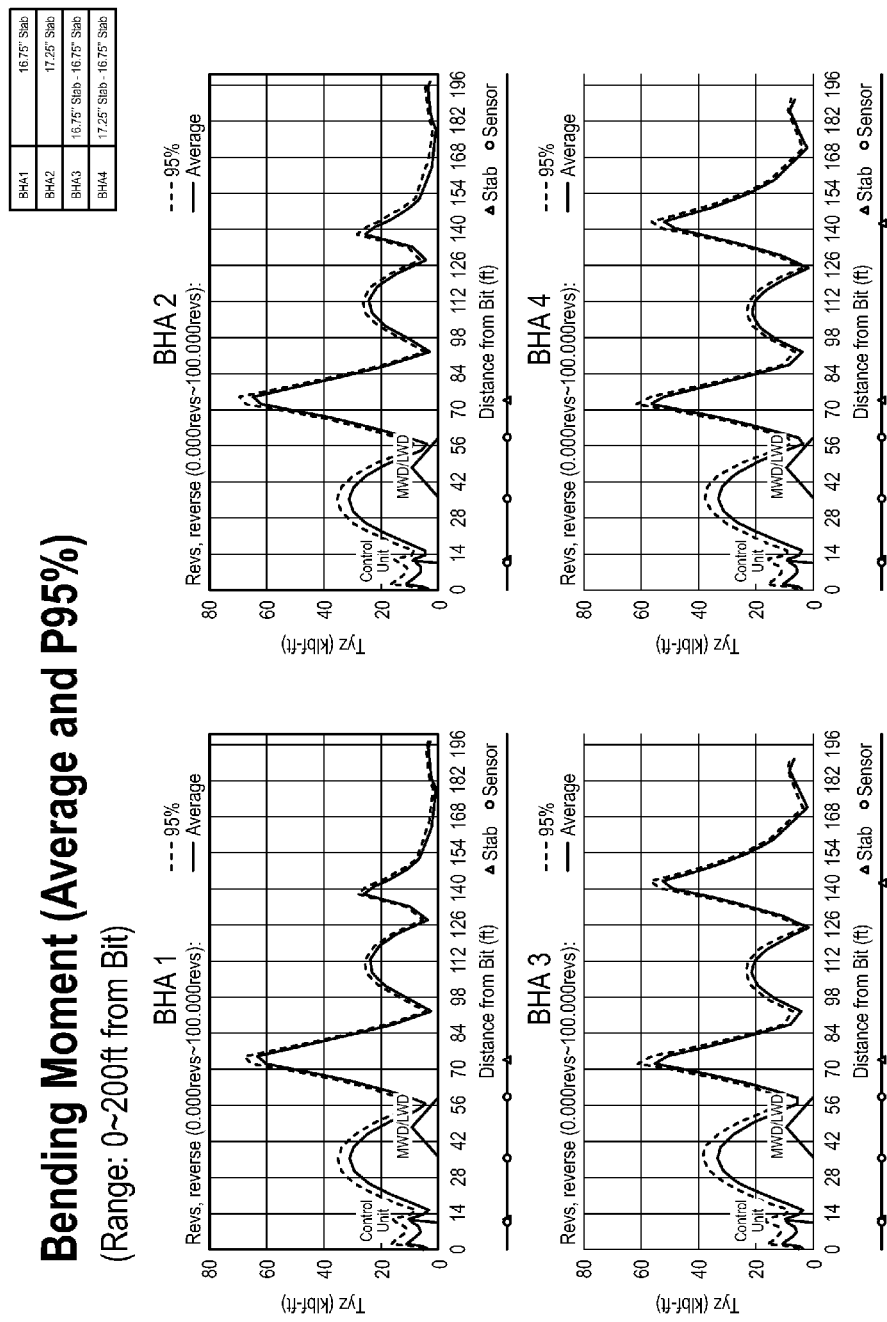

FIG. 8G illustrates the bending moment in a range 0-200 feet from the bit, measured in pounds-feet (along the Y-axis).

As shown in the figure, BHA3 and BHA4 have a relatively high bending moment near the secondary stab (located roughly 142 feet from the bit).

Figure 8H:
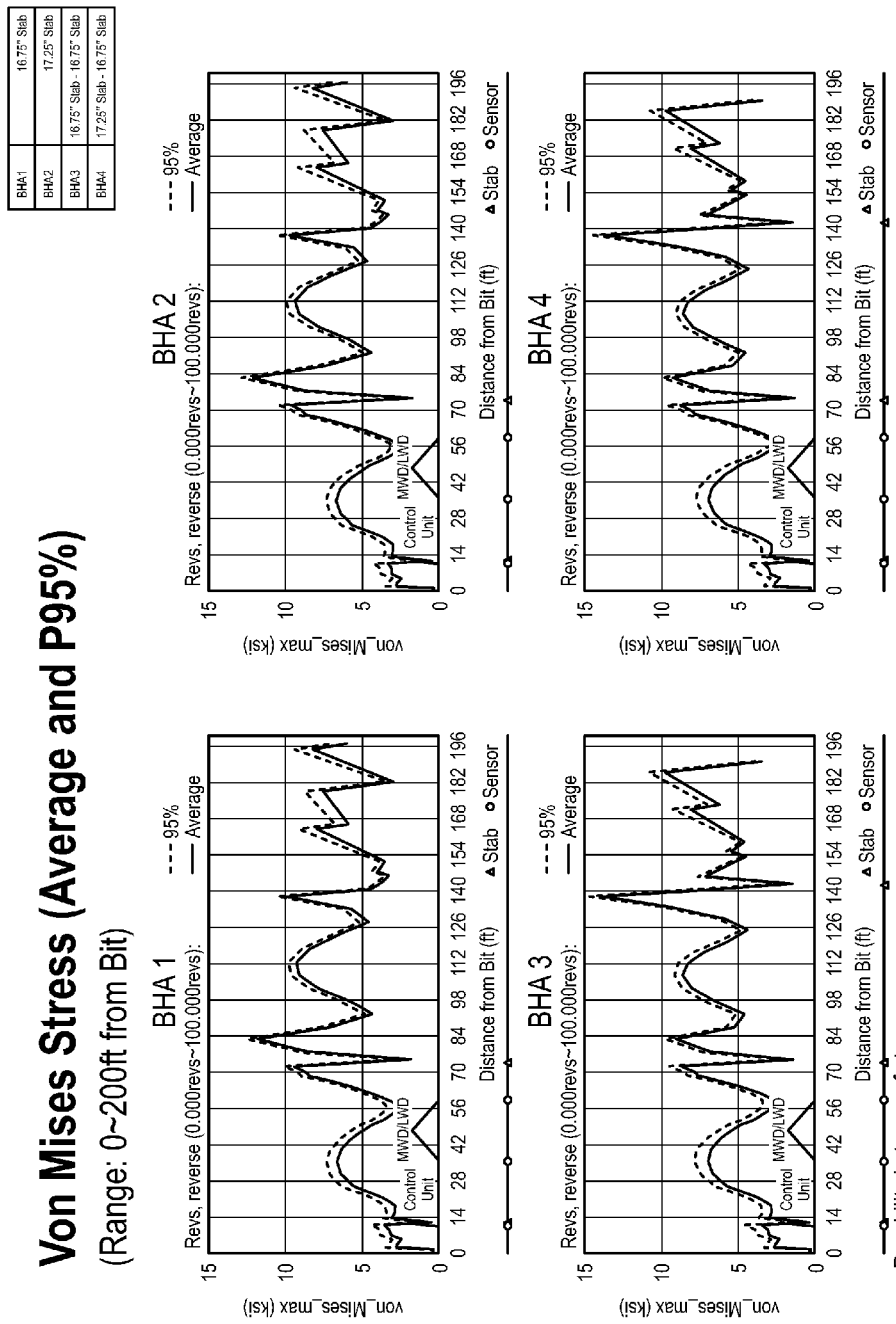

FIG. 8H illustrates the Von Mises stress (i.e., plastic deformation) at a range 0-200 feet from the bit (measured in kilopounds per square inch). As can be seen from the figure, BHA3 and BHA4 have very high max stresses at adjacent to the secondary stab.

FIGS. 8F-8H, therefore, can be used as a comparison of durability of the BHA package, as higher bending moments, torque, and stresses can result in equipment failure, due to deformation.

Figure 8I:
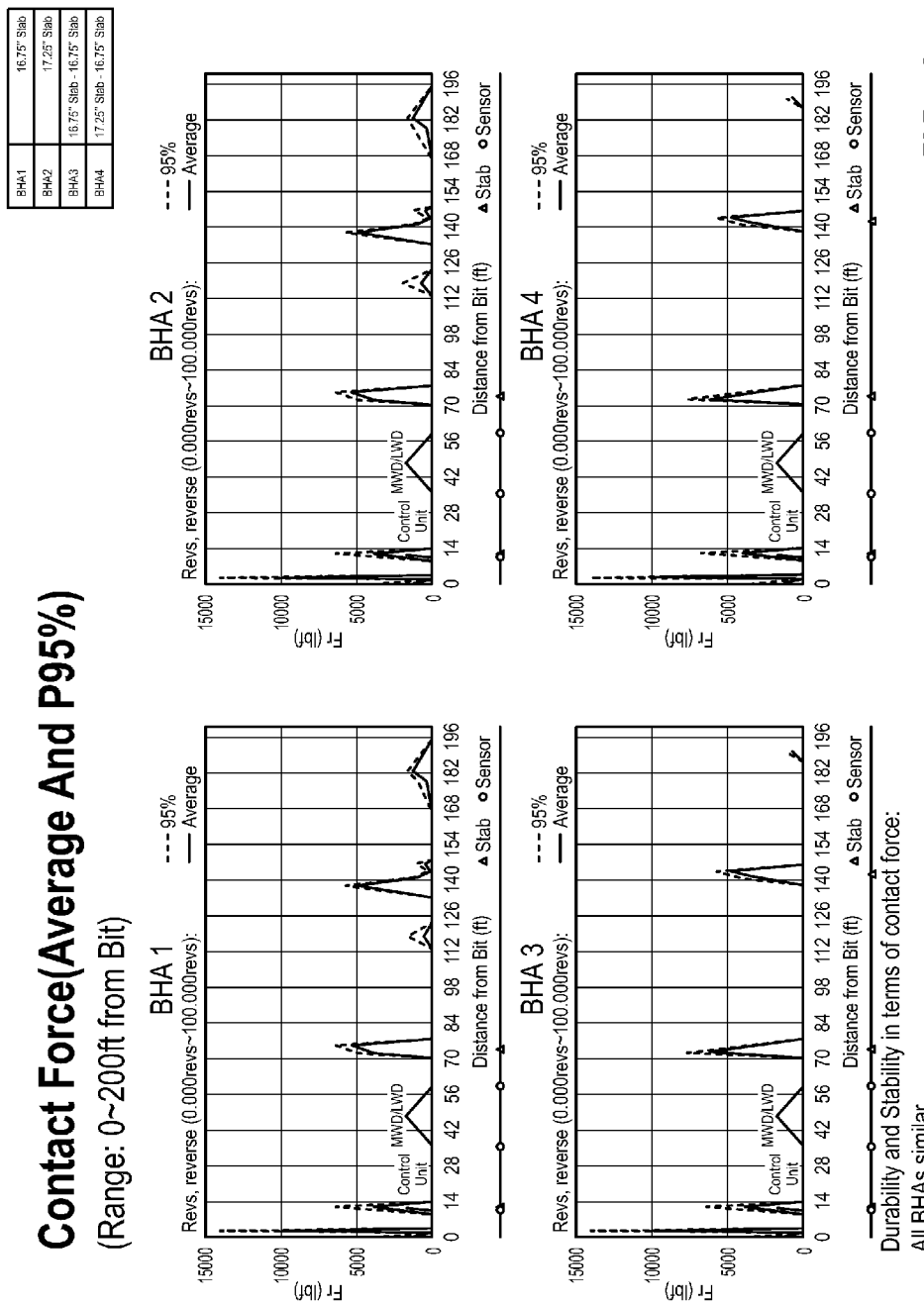

FIG. 8I illustrates the contact force (frictional force) associated with bore hole contact with the BHA, as measured in kilopounds (along the Y-axis). In this simulation, all of the BHA packages have similar profiles. The contact force is used as a measure of both stability and durability of the BHA package.

FIG. 8J illustrates the bit lateral acceleration for each of the BHA packages. As shown in the figure, for this simulation, all of the BHA's have similar bit lateral acceleration. Lateral acceleration is an indicator of bit whirl. Cutters on a whirling bit can move sideways, backward, and much faster than those on a true rotating bit. The impact loads associated with this motion cause PDC cutters to chip, which, in turn, accelerates wear. During backwards whirl, the instantaneous center of rotation moves around the face of the bit, in the opposite direction to the rotation of the bit. This can cause cutters to be accelerated sideways and backwards, causing chipping that can accelerate bit wear, reduce PDC bit life and reduce rate of penetration (ROP). In addition, bit whirl results in very high downhole lateral acceleration, which causes damage not only to the bit but also other components in the BHA.

Figure 8K:
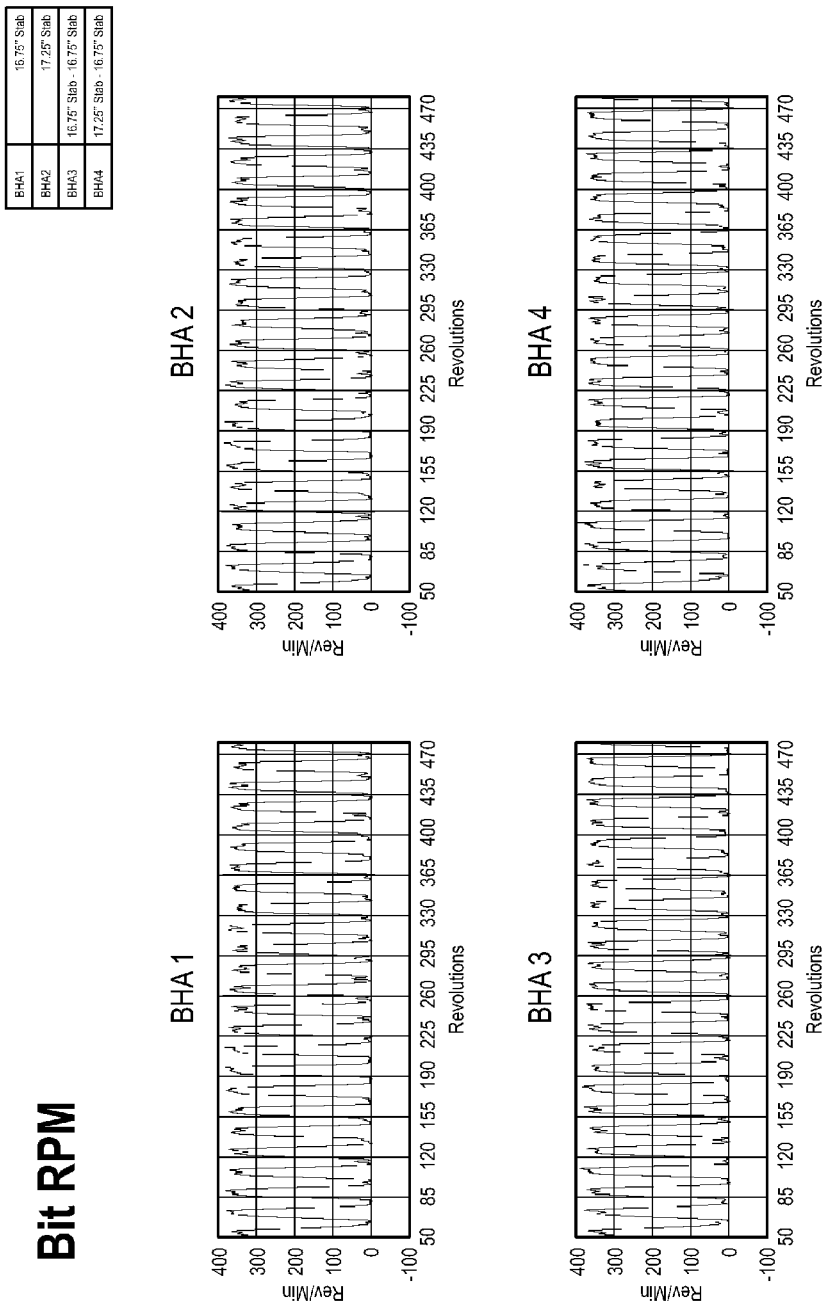

FIG. 8K illustrates the bit RPM's as a function of the number of revolutions of the bit. Here, all BHA's show a wide variation in RPM's, which is indicative of high stickslip. Stick slip occurs when a bit gets stuck in the formation it is drilling. Because the drill string is relatively long compared to its stiffness, the drill string can wind up and build torque in the string until the bit breaks free. When the drill bit is stuck (RPM is approximately zero), the torque on the bit gradually increases. At some point, the bit breaks loose leading to a sudden, rapid increase in the rotation of the drill bit and a sudden decrease in torque. This process can occur in cycles for long periods of time.

Stick slip is undesirable because it may be very damaging to drill string components and can reduce ROP (rate of penetration). Connections can get over-torqued and twist off. The bit can get severely damaged from the excessive RPM and vibration that result from stick slip. It is often not apparent at the surface when stick slip is occurring downhole. The drill string at the surface can appear to be drilling smoothly even though the RPM at the bit is erratic.

Figure 8L:
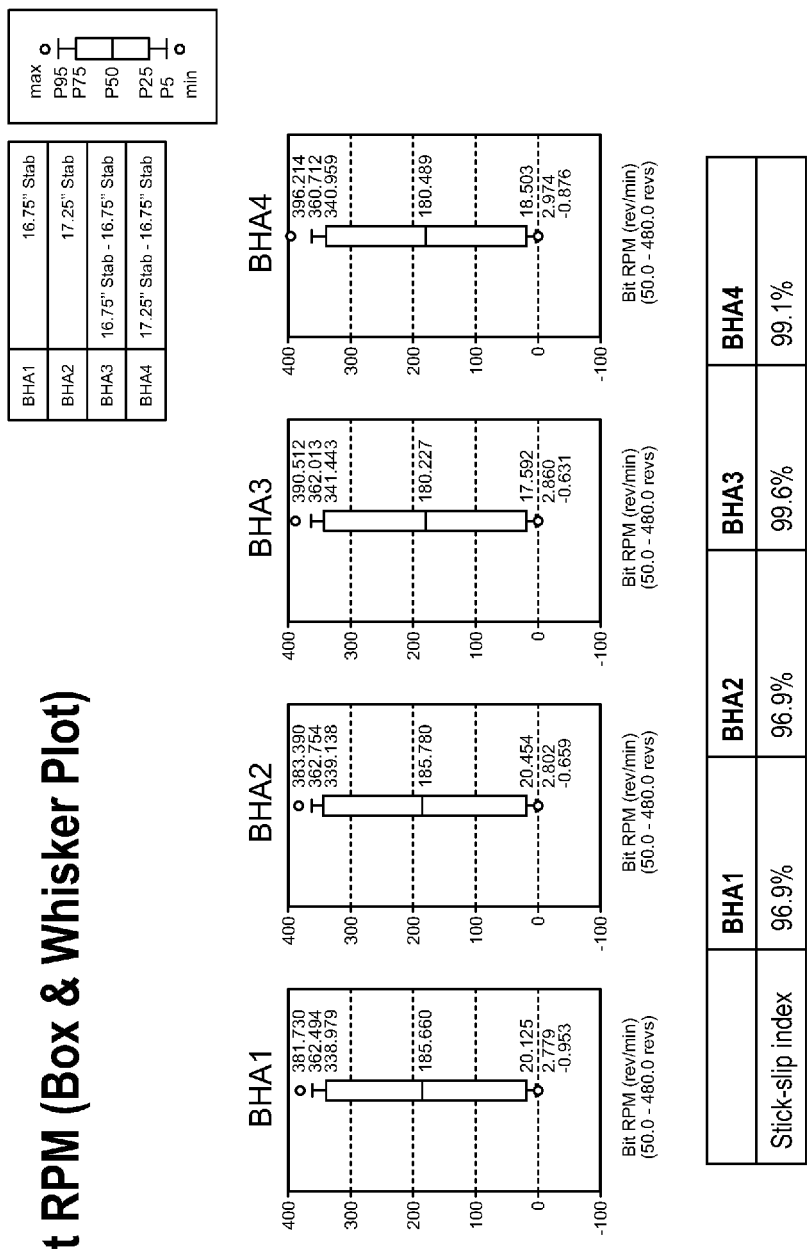

FIG. 8L illustrates the bit RPM as a box and whisker plot. Box and whisker plots depict data in the box as the 25th and 75th percentile, and the band near the middle of the box is always the 50th percentile (the median). In FIG. 8L, the box and whisker plots are used to generate a slip-stick index for each of the BHA packages. The stick slip index is measured according to the following formula:

$$(95\% - 5\%)/(2*\text{median})$$

As shown in the table on FIG. 8L, BHA1 and BHA2 have a lower stick-slip rate, which is advantageous.

Figure 8M:
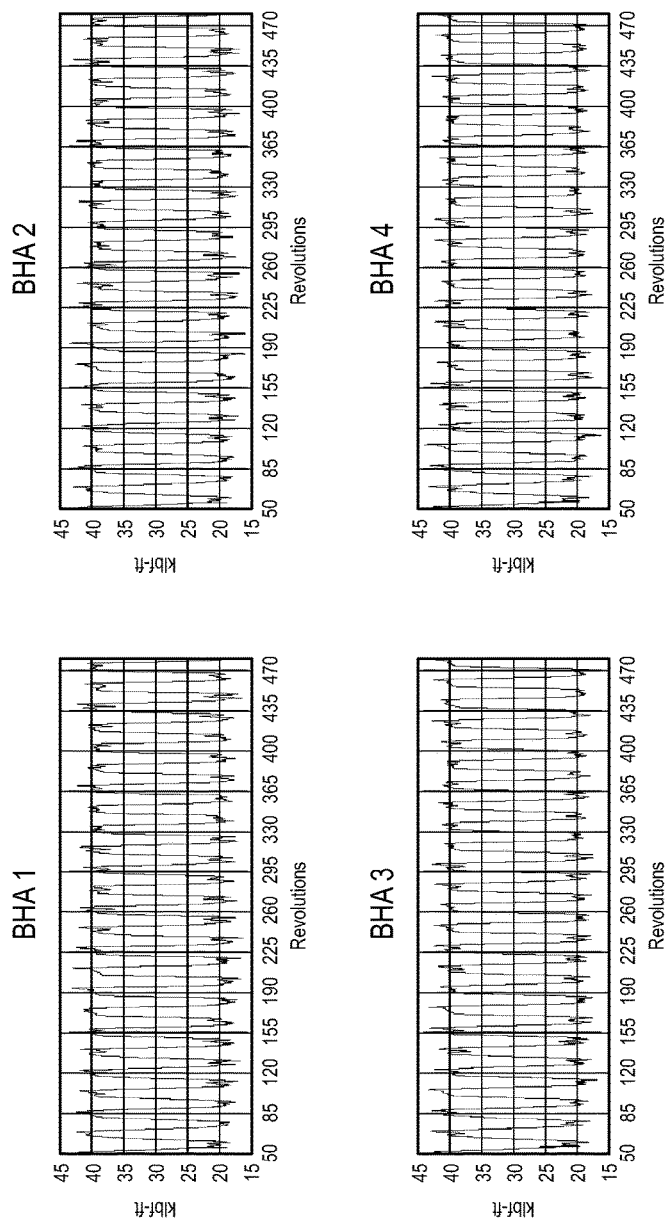

FIG. 8M illustrates the surface torque for each of the BHA packages. Surface torque is also used as an indicator of stick-slip behavior for a BHA package. In this simulation, all of the BHA packages have similar surface torque behavior.

FIG. 9 and associated figures illustrate the results of simulation 2. Simulation 2 details the case with surface RPM increasing from 10 RPM to 300 RPM, while the bit is on bottom, with an increase on WOB from 20 klbf to 40 klbf. Simulation 2 is shown in the figures as three separate groups of figures, simulation 2-1 (RPM's ramping at 20 klbf), simulation 2-2 (RPM's ramping at 30 klbf), and simulation 2-3 (RPM ramping at 40 klbf). Within this simulation, the RPM's are varied between 10 to 300 RPM. First, the drill string is static. Then topdrive/kelly can rotate the drillstring from the top. The RPM is gradually increased up. In this case, initially the string is rotated at 10 RPM, then the RPM is increased to 300 within 3 minutes. The time to reach final RPM can be adjusted by the user.

Figure 9A:
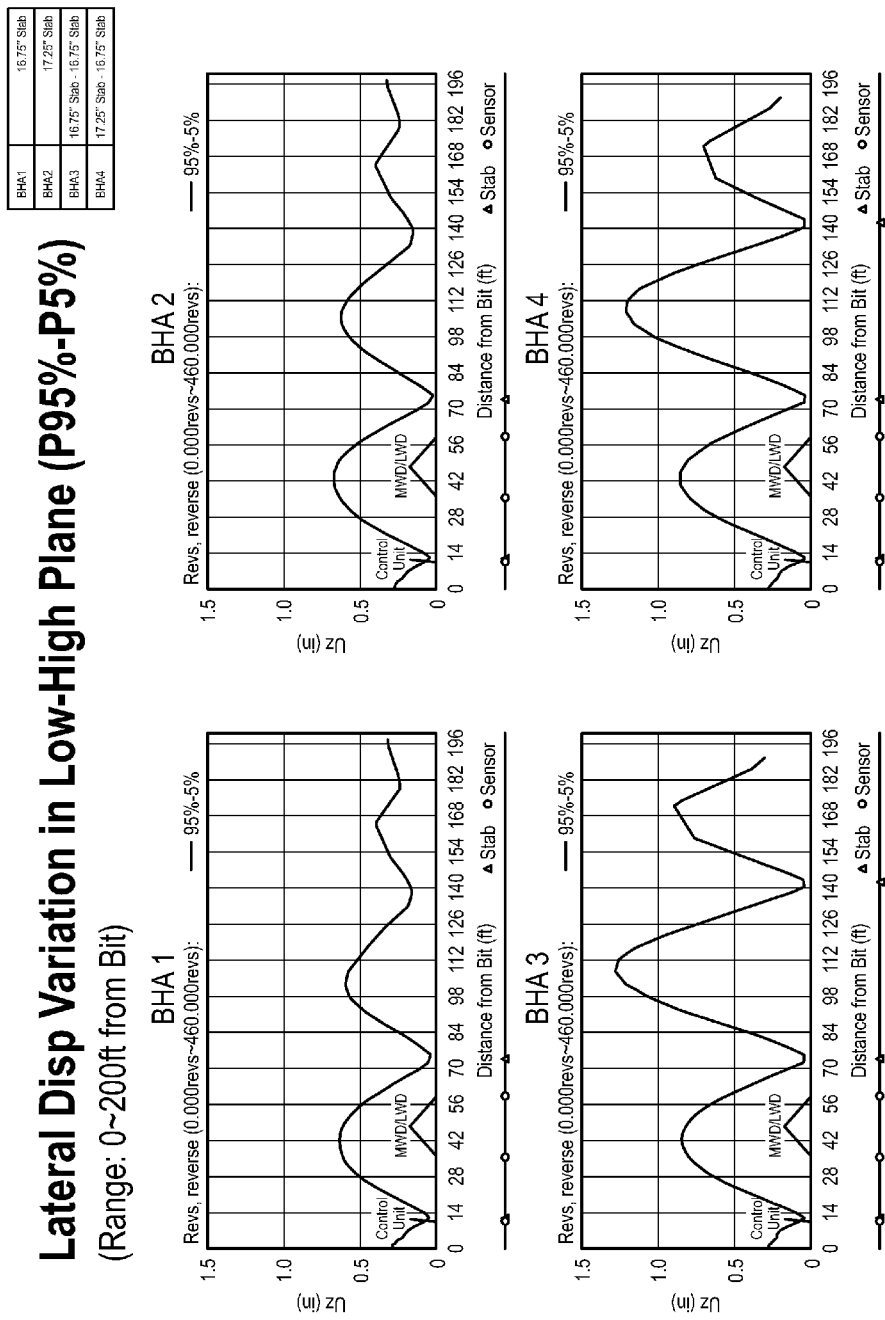

FIG. 9A illustrates the lateral displacement variation for each of the BHA packages. BHA1 and BHA2 have smaller variations at both the LWD/MWD sensor and at the first stab, as compared to BHA3 and BHA4.

FIG. 9B illustrates the effect of RPM ramping on the system. Particularly, FIG. 9B shows that BHA1 and BHA2 are more stable during the ramping process, as the magnitude of the lateral displacement variation is lower than compared with BHA3 and BHA4. In this figure, the x-axis is the RPM's at the LWD/MWD location. Moreover, as can be seen from FIG. 9B, BHA3 and BHA4 show an extremely high variation at a critical speed of 110 RPM. This information can be used by the designer to either warn the driller about this speed.

Figure 9C:
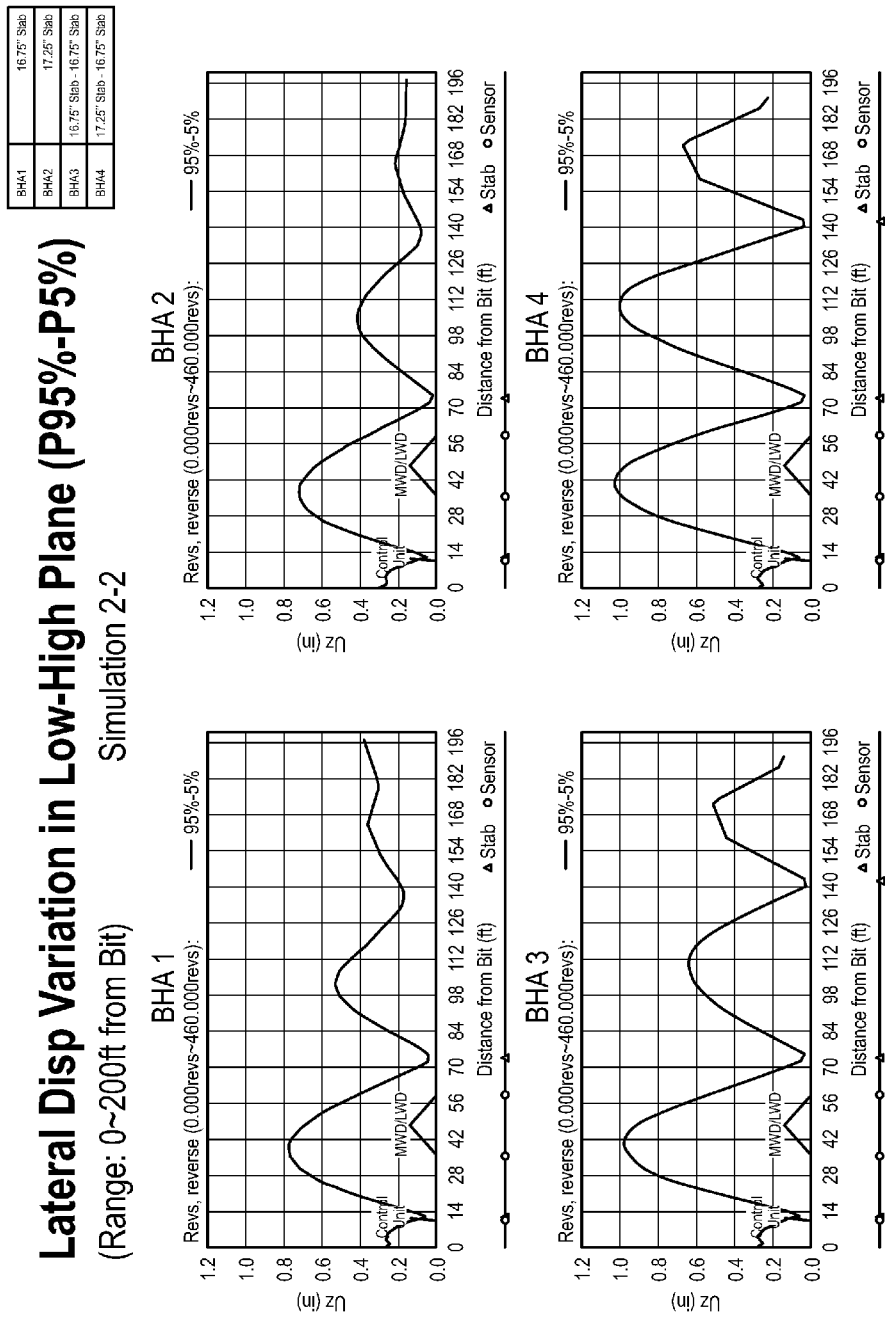

FIG. 9C illustrates the effect of RPM ramping on the system at 30 klbf. In particular, FIG. 9C illustrates the change in performance between BHA1 and BHA2. Whereas at 20 lbf (FIG. 9B) WOB, BHA1 and BHA2 had very similar performance, at the higher WOB, BHA2 is superior to BHA1.

Figure 9D:
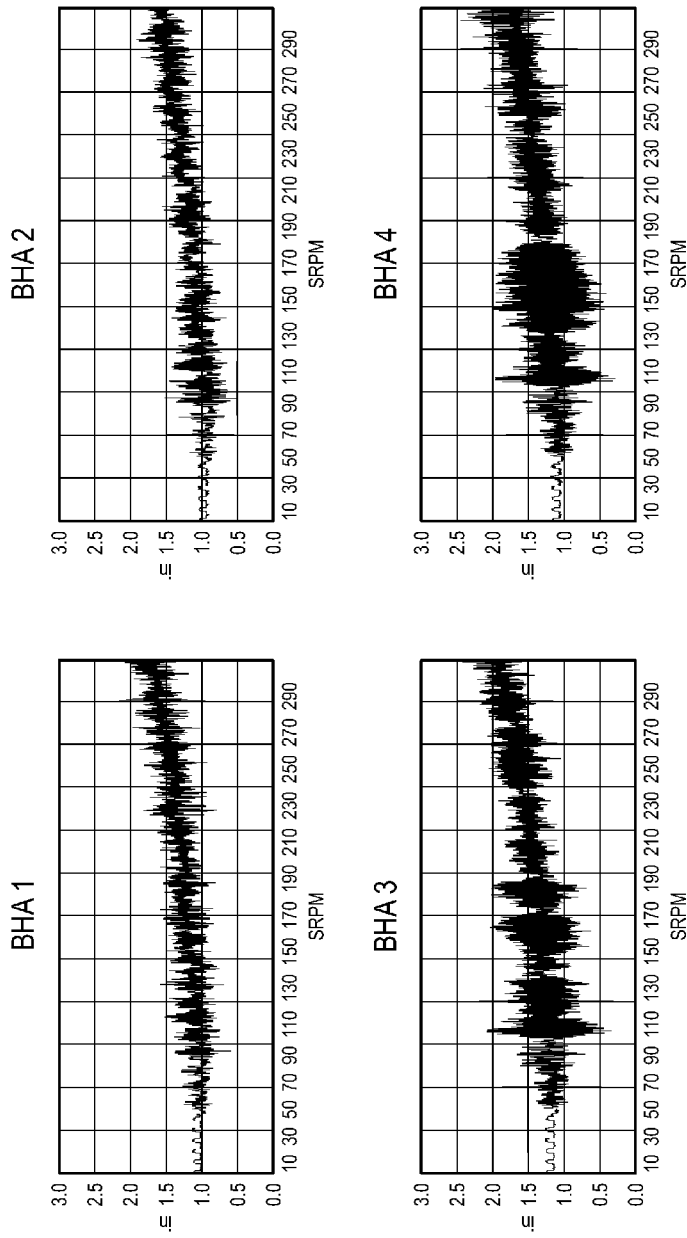

FIG. 9D illustrates the effect of RPM ramping on the system, at the MWD/LWD sensor location. Similar to FIG. 9B, both BHA1 and BHA2 have lower magnitudes of lateral displacement variation as compared with BHA3 and BHA4. BHA3 and BHA4 show high variations at approximately 100 RPM's and again at approximately 160 RPM's.

Figure 9E:
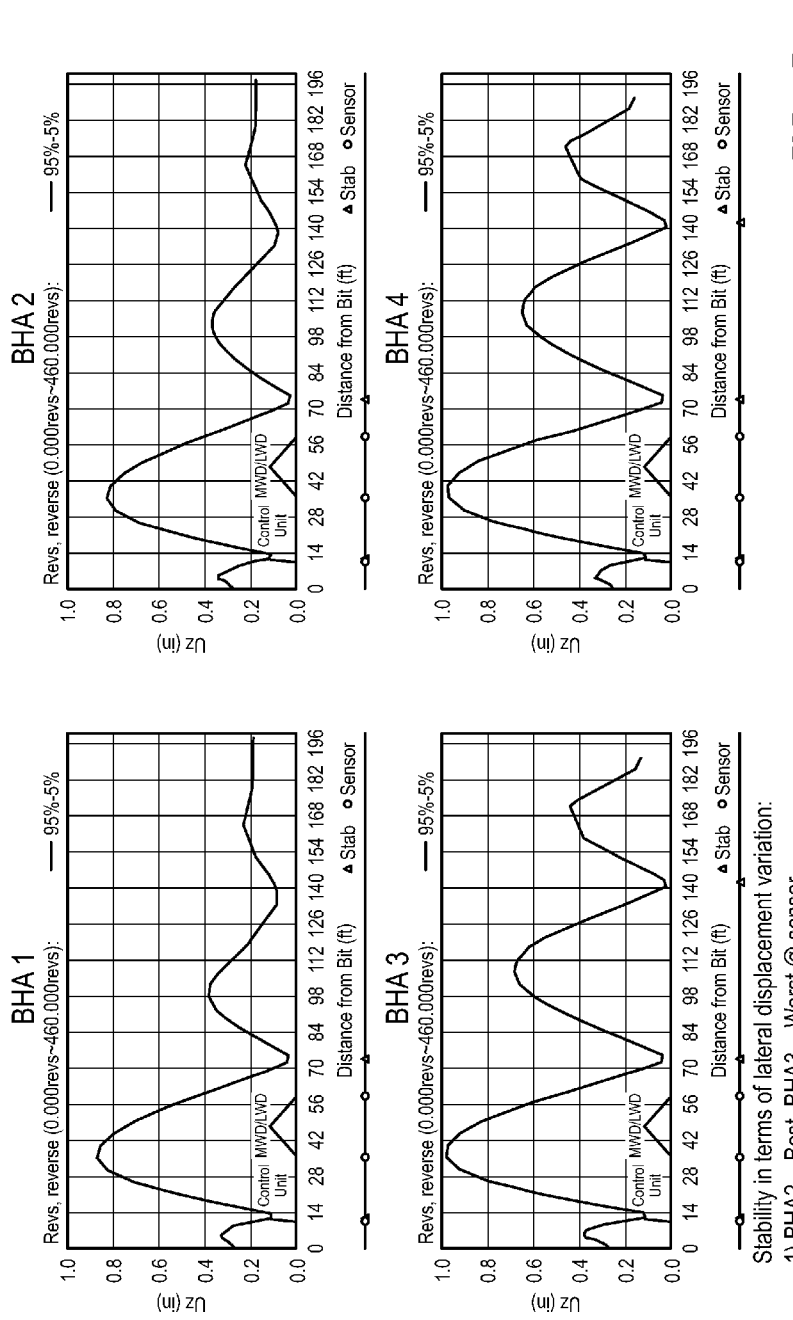

FIG. 9E illustrates the effect of RPM ramping on the system at 40 klbf. Here, the performance of BHA1 and BHA2 is similar, while BHA3 and BHA4 have significantly higher lateral displacement variations.

Figure 9F:
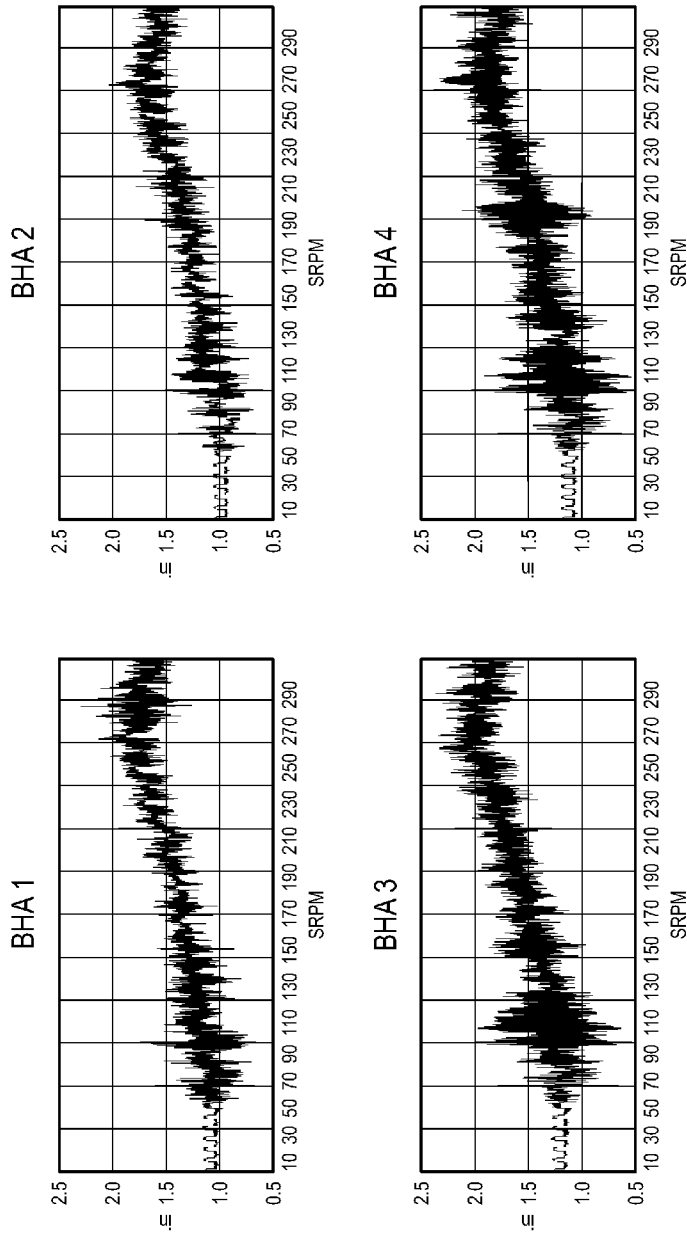

FIG. 9F illustrates the effect of RPM ramping on the system at the LWD/MWD sensor position. The RPM's are shown on the x-axis. In FIG. 9F, BHA2 has the lowest magnitude of lateral displacement variation, whereas BHA3 and BHA4 have significantly higher lateral displacement variations. There is a noticeable increase in lateral displacement variation in BHA3 and BHA4 at 90 RPM's.

FIG. 10 and associated figures illustrates the results of simulation 3, which shows RPM's increasing, with the drill bit off bottom.

Figure 10A:
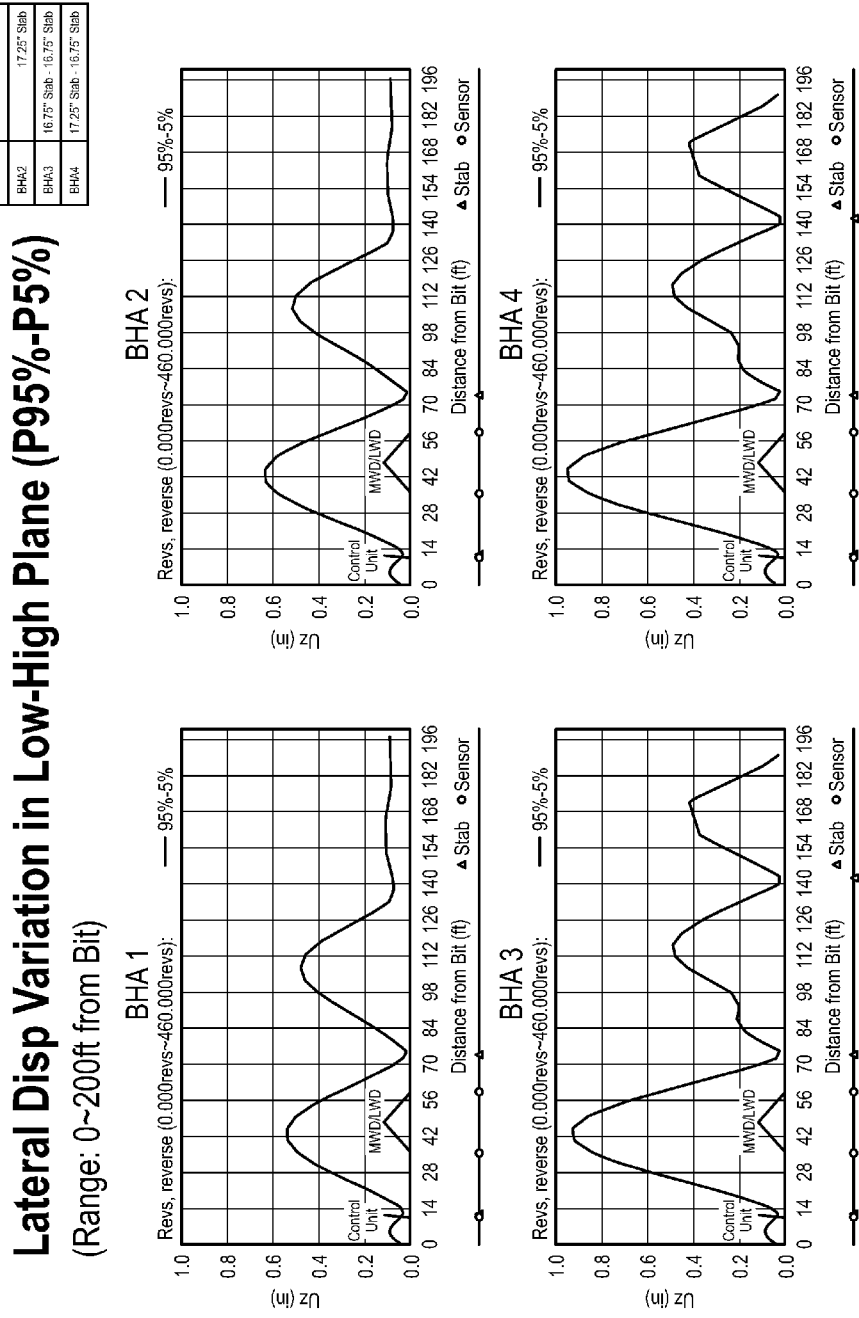
FIGS. 10A-10B show exemplary outputs for simulation scenario 3 in accordance with embodiments of the disclosure.

FIG. 10A illustrates the lateral displacement variation over the length of the drill string, and shows that BHA1 has the lowest magnitude of displacement, while BHA3 and BHA4 have significantly higher variations at the MWD/LWD sensor location.

Figure 10B:
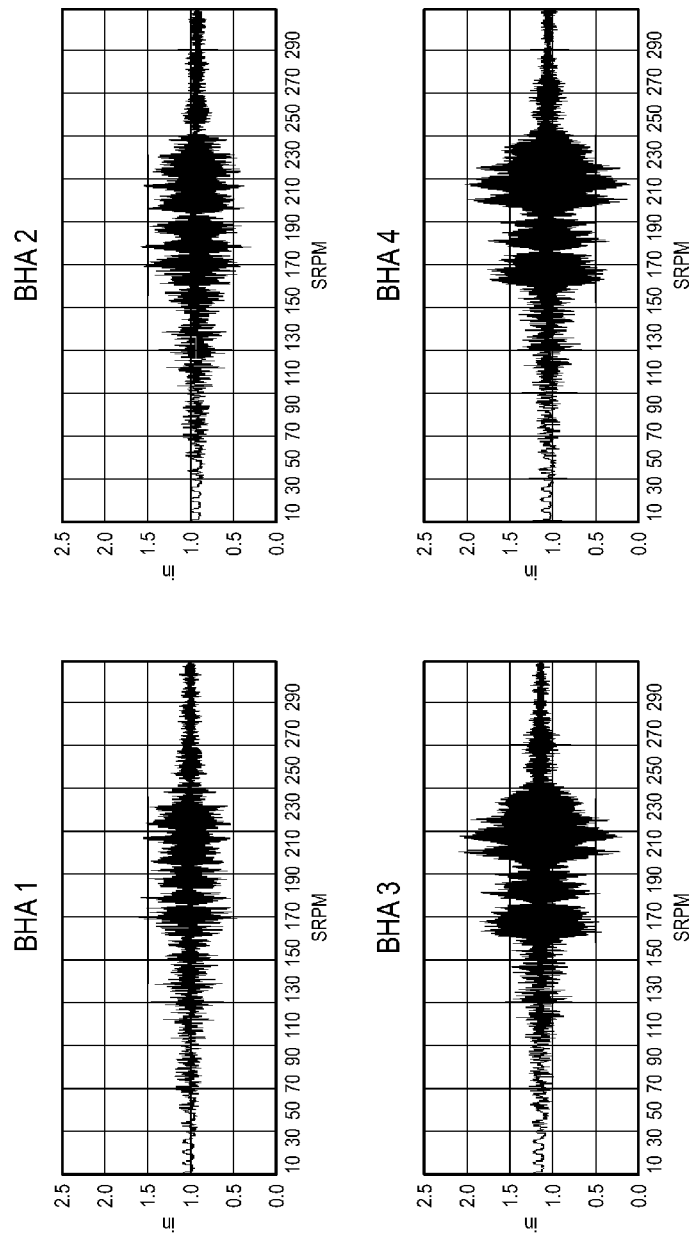

FIG. 10B illustrates the lateral displacement variation as a function of RPM's at the MWD/LWD sensor location. In particular, BHA1 has the lowest magnitude of lateral displacement variation, whereas BHA3 and BHA4 have significantly higher magnitudes. In addition, all four BHA packages show large variations around 160 RPM's.

FIG. 11 and associated figures illustrates the results of simulation 4, which is a transition from soft formation drilling to hard formation drilling.

Figure 11A:
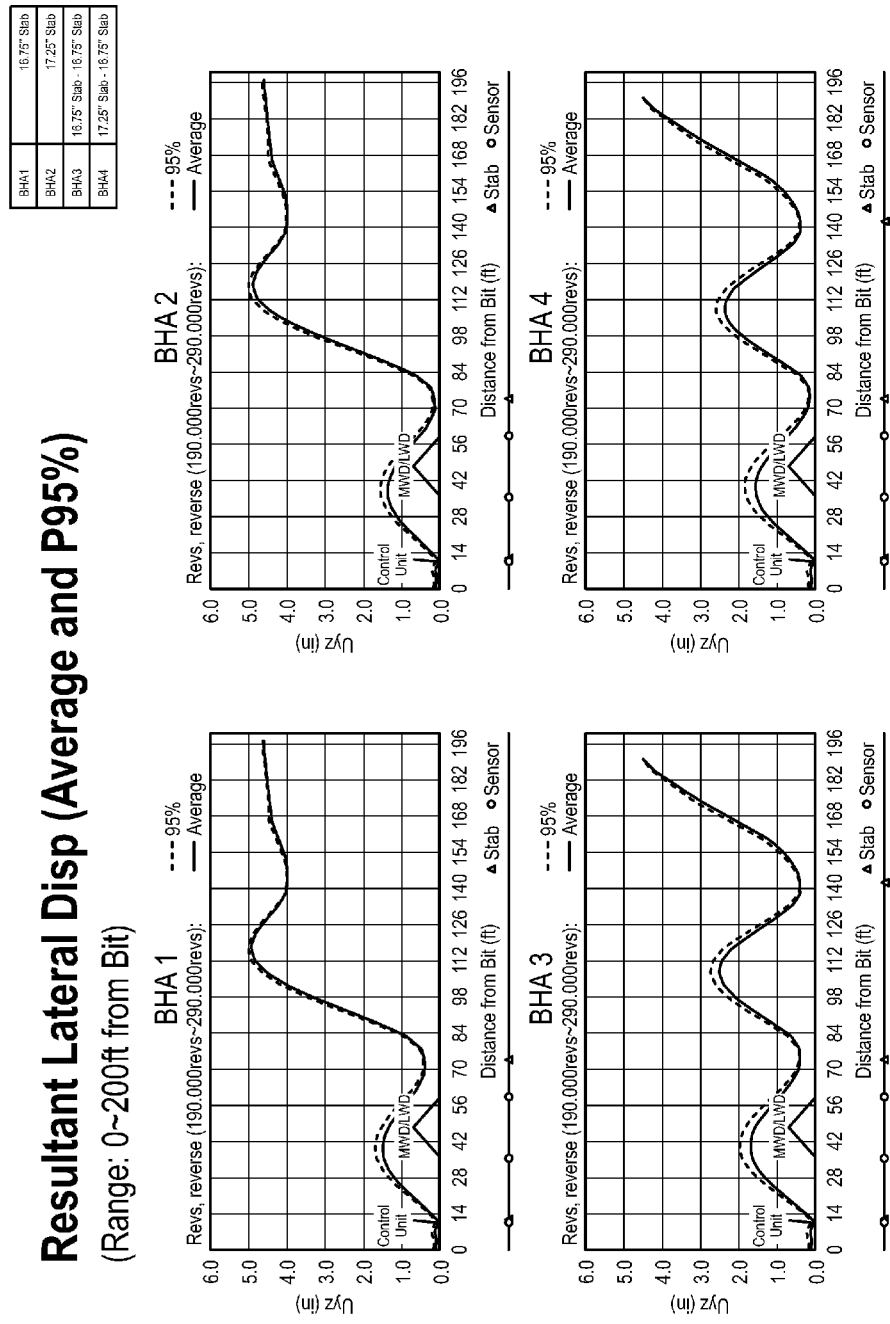

FIG. 11A illustrates the lateral displacement occurring along the length of the drill string. At the MWD/LWD sensor location, BHA2 has the lowest displacement, while showing a high secondary peak near the first stab. BHA3 shows the highest displacement at the sensor, but has lower secondary peaks.

Figure 11B:
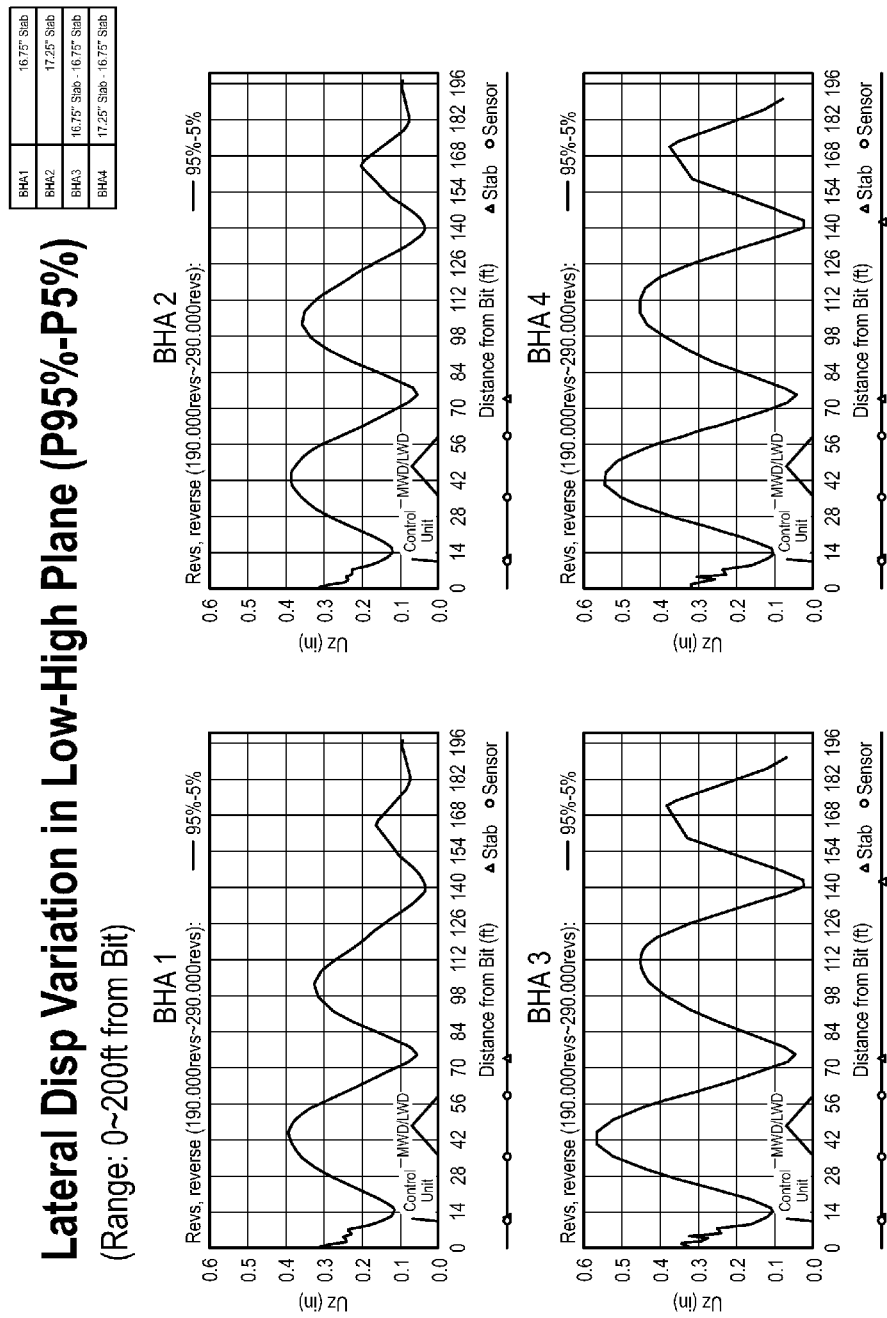

FIG. 11B illustrates the lateral displacement variation occurring along the length of the drill string. At the sensor location, BHA1 and BHA2 show significantly less lateral displacement variation at the sensor as compared to BHA3 and BHA4.

Figure 11C:
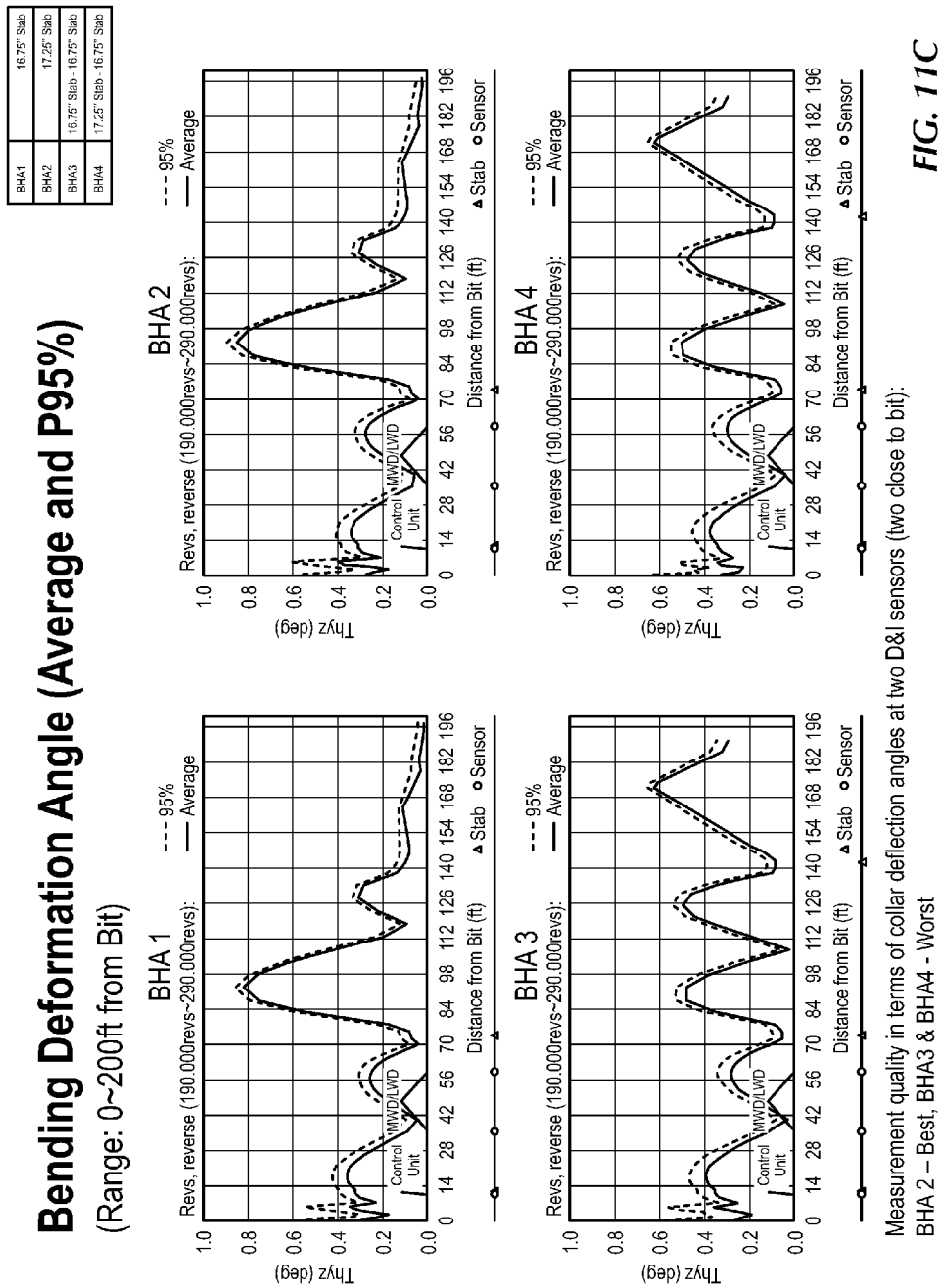

FIG. 11C illustrates the bending deformation angle along the length of the drill string. The sensors are located as pointed out by "control unit" and MWD/LWD. At those locations, the deformation angle is smaller for BHA2, so BHA2 is viewed as having the best measurement quality.

Figure 11D:
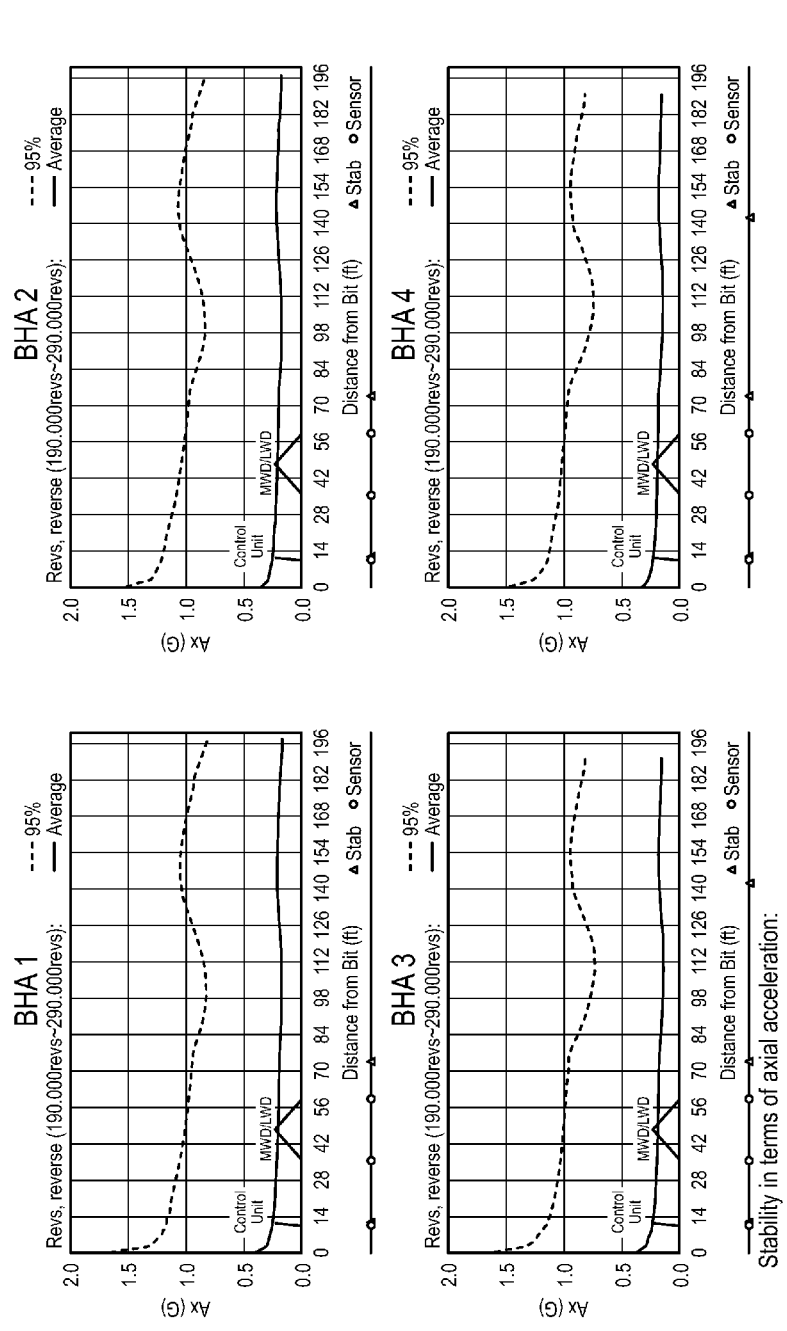

FIG. 11D illustrates the axial acceleration along the length of the drill string (from 0-200 feet from the bit). FIG. 11D shows that the axial acceleration profiles of all of the BHA packages is similar.

Figure 11E:
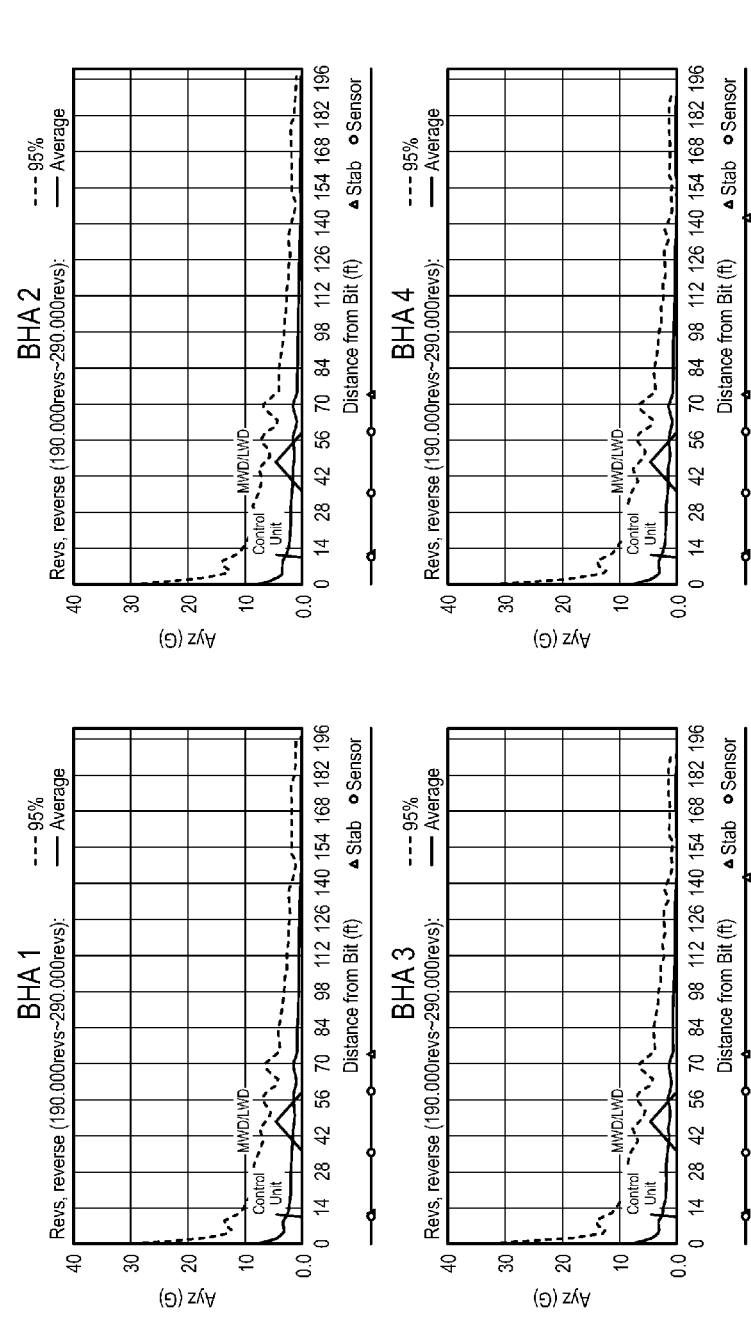

FIG. 11E illustrates the lateral acceleration along the length of the drill string (0-200 feet from the bit). FIG. 11E shows that the lateral acceleration profiles of the BHA packages is similar, but also shows that all of the packages show relatively high lateral accelerations at the bit.

FIG. 11F illustrates the torque along the length of the drill string (0-200 feet from the bit). FIG. 11F shows that the torque variation of all of the BHA packages is substantially the same.

Figure 11G:
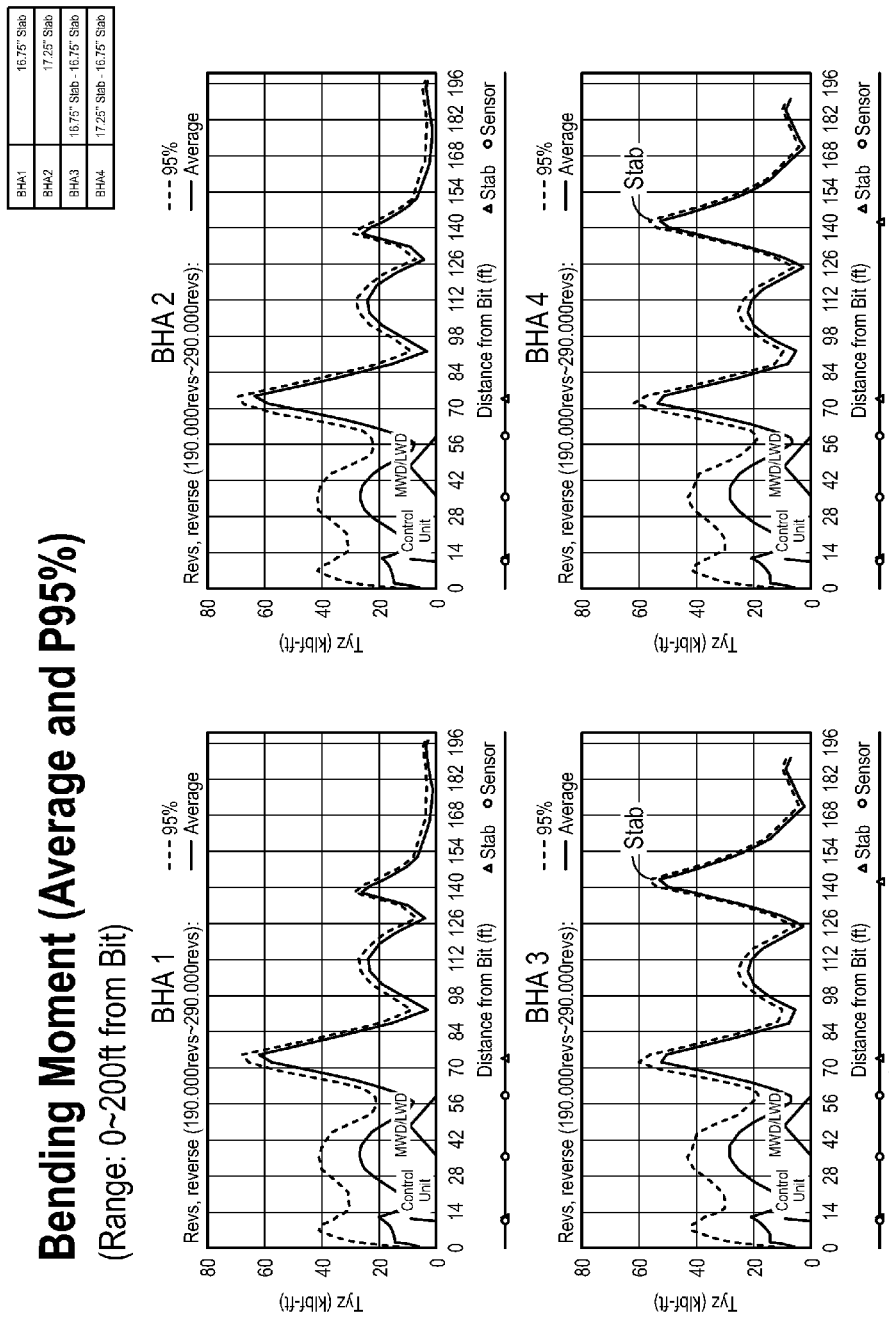

FIG. 11G illustrates the bending moment along the length of the drill string (0-200 feet from the bit). FIG. 11G shows that while the BHA's have similar bending moments for the first 130 feet, BHA3 and BHA4 show higher bending moments near the second stab (located about 140 feet from the bit).

Figure 11H:
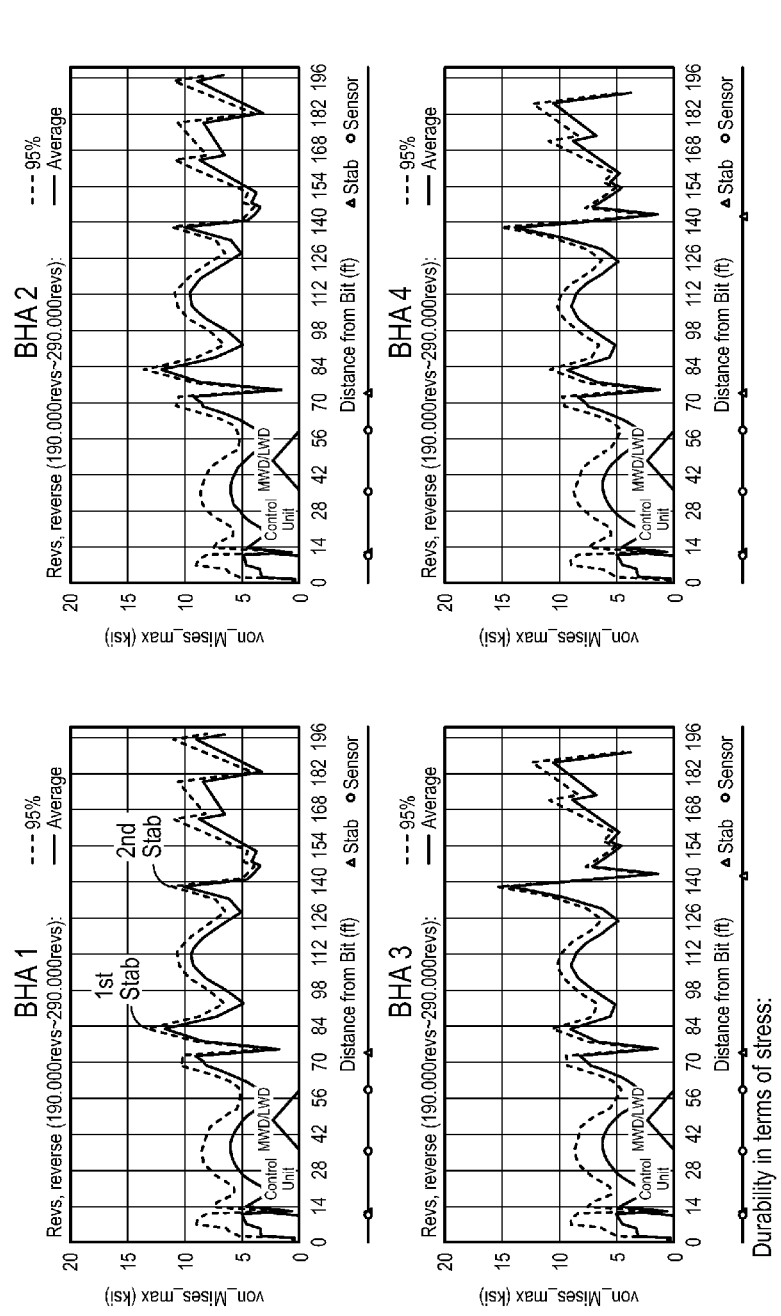

FIG. 11H illustrates the Von Mises stress along the length of the drill string (0-200 feet from the bit). FIG. 11H shows that the stress near the first stab (located approximately 80 feet from the bit) is significantly higher in BHA1 and BHA2, while stress near the second stab (located approximately 140 feet from the bit) is significantly higher for BHA3 and BHA4.

FIG. 11I illustrates the contact force along the length of the drill string (0-200 feet from the bit). FIG. 11I shows that while the contact forces are roughly similar, BHA1 and BHA2 show slightly higher contact forces at the second stab (located at approximately 140 feet from the bit).

Figure 11J:
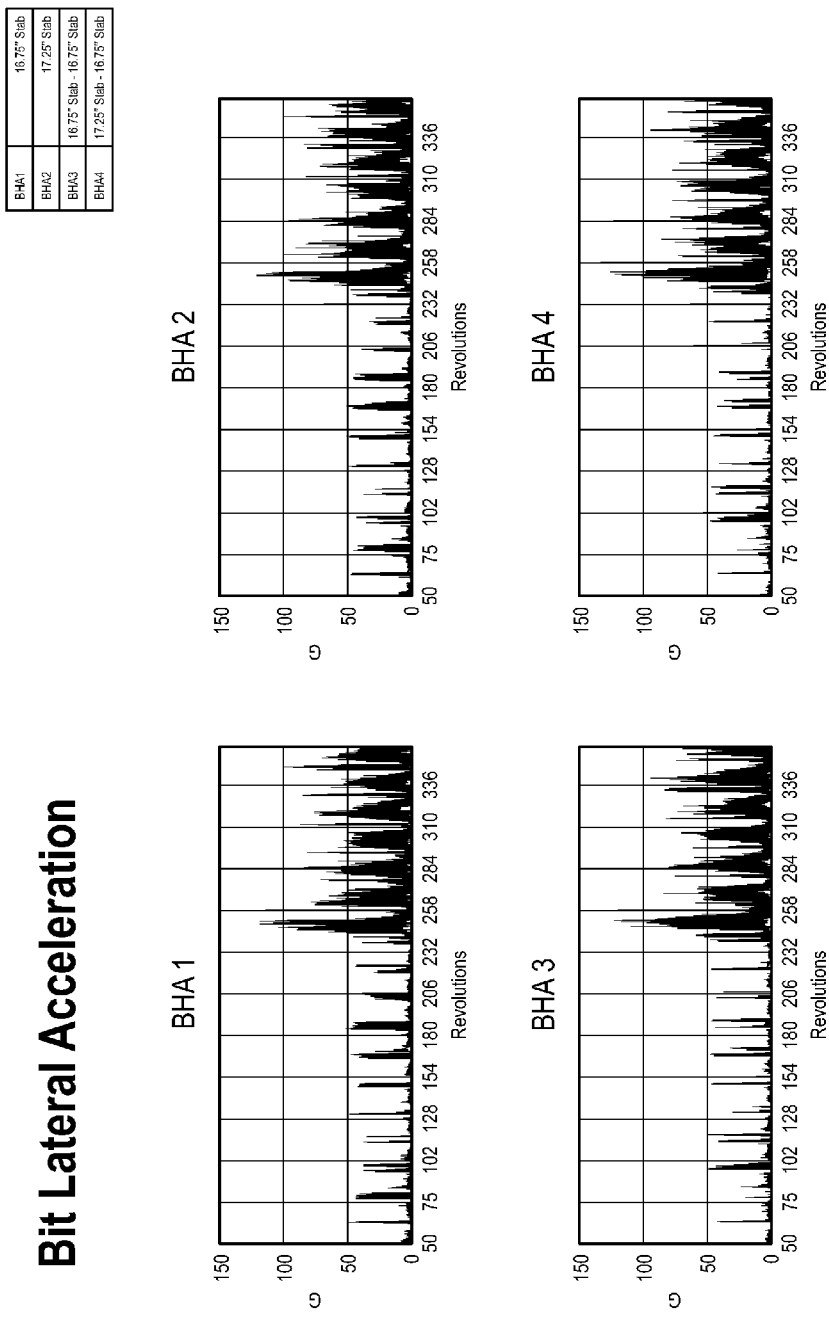

FIG. 11J illustrates the bit lateral acceleration force as a function of revolutions of the drill bit. FIG. 11J shows that all of the BHA packages show similar lateral acceleration patterns.

Figure 11K:
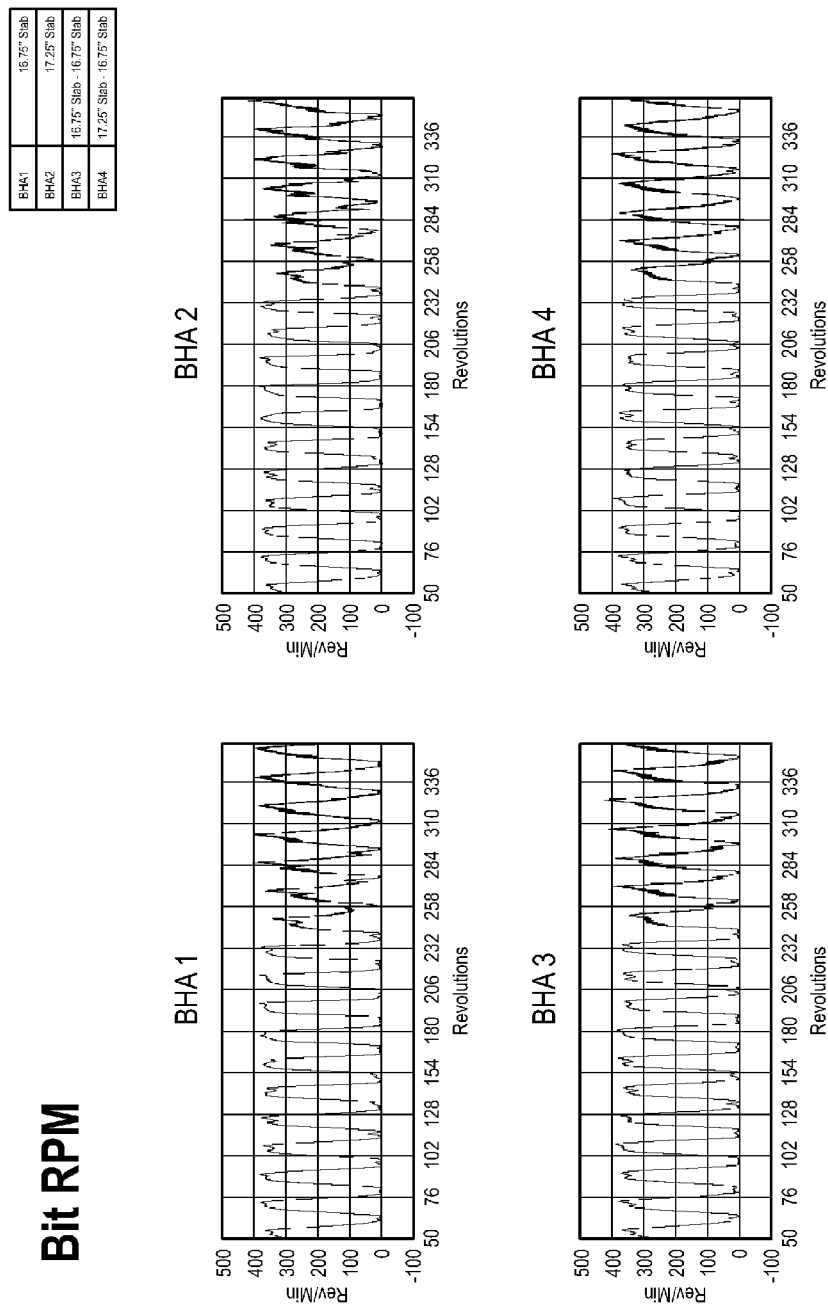

FIG. 11K illustrates the bit RPM's as a function of revolutions of the drill bit. FIG. 11K shows that the BHA packages have similar bit RPM's. Both FIGS. 11J and 11K illustrate the formation changeover, as the profiles dramatically change as the formation transitions from soft to hard (around 240 revolutions of the bit).

Figure 11L:
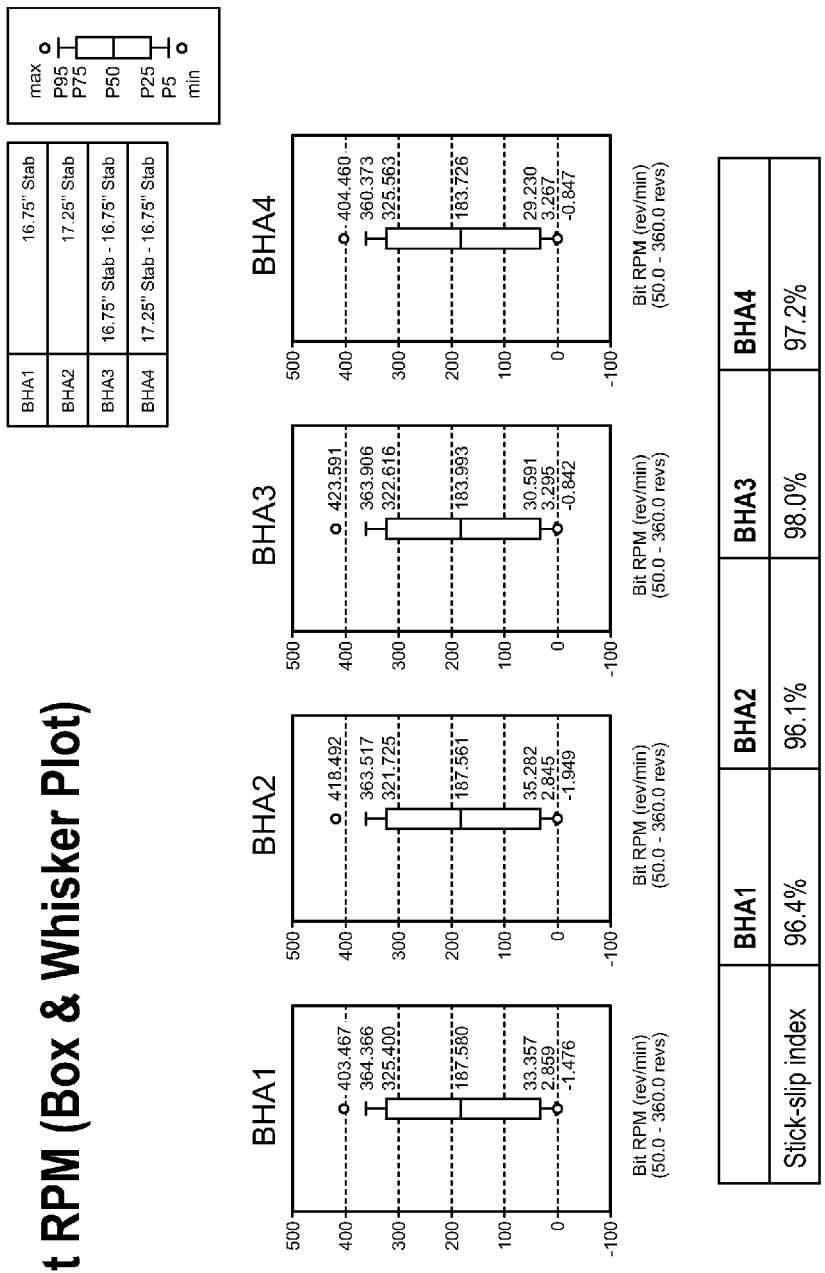

FIG. 11L illustrates the bit RPM as a Box and Whisker plot. Using these plots, the stick-slip index is calculated, as discussed above, and shows that BHA1 and BHA2 have slightly lower stick-slip than BHA3 and BHA4.

Figure 11M:
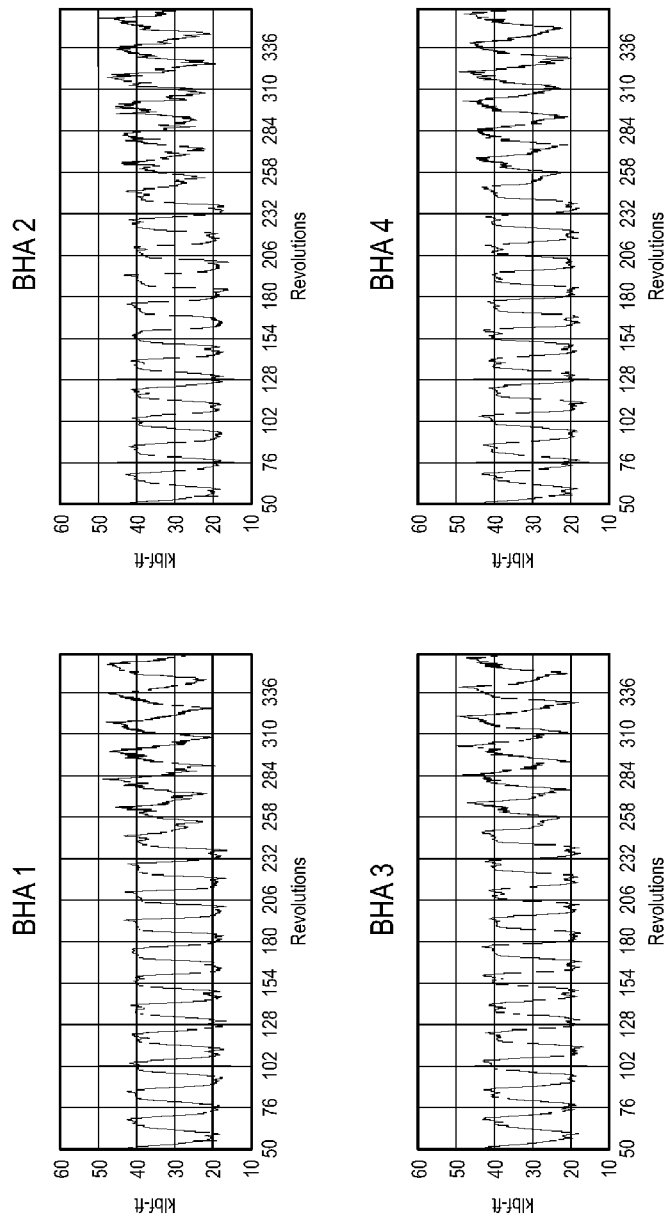

FIG. 11M illustrates the surface torque as a function of bit revolutions. FIG. 11M shows that the all of the BHA packages show similar torque variation patterns as the bit transitions from soft to hard formation (at around 240 revolutions).

FIG. 12 and the associated figures illustrates the effect of simulation 5, which pertains to the drilling of an inhomogeneous formation (i.e., mixed pockets of hard and soft formation).

Figure 12A:
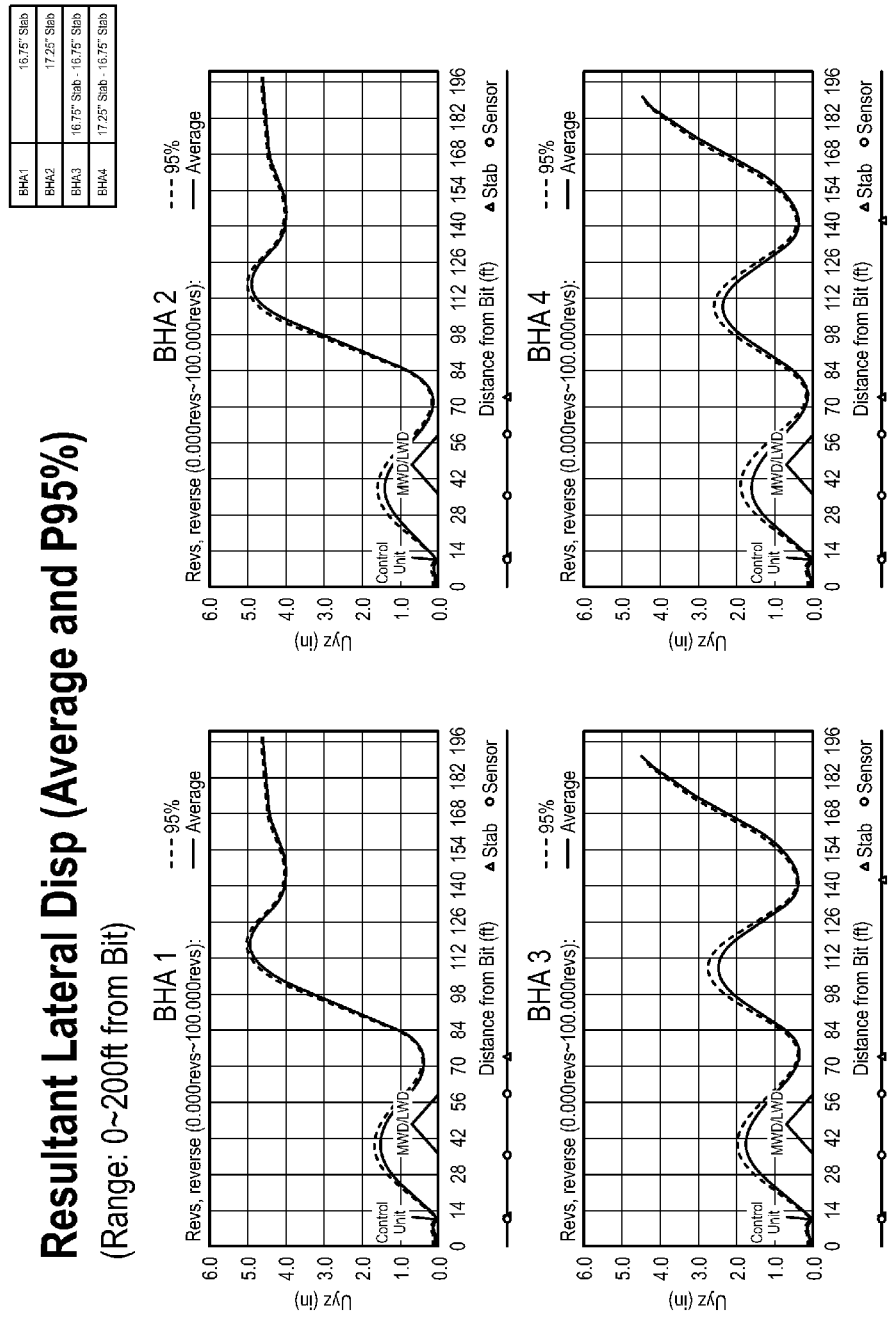

FIG. 12A illustrates the lateral displacement along the length of the drill string (0-200 feet from the bit). BHA1 and BHA2 show similar, relatively low sag at the sensor location, while having a higher secondary peak. BHA3 and BHA4 have higher sag at the sensor location, while having lower secondary peaks.

Figure 12B:
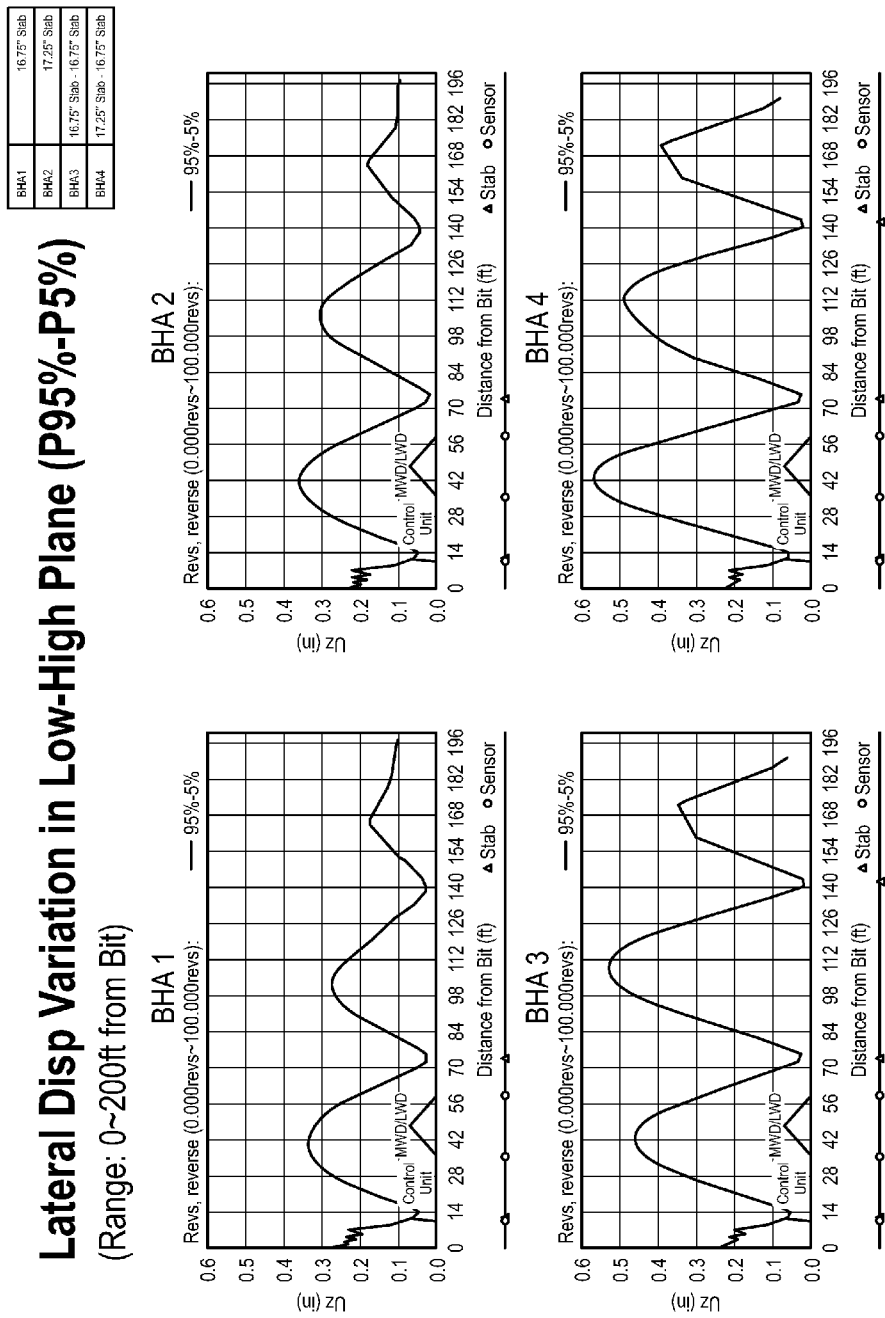

FIG. 12B illustrates the lateral displacement variation along the length of the drill string (0-200 feet from the bit). In FIG. 12B BHA1 shows the lowest lateral displacement variation at the sensor, while BHA3 and BHA4 show significantly higher lateral displacement variation.

Figure 12C:
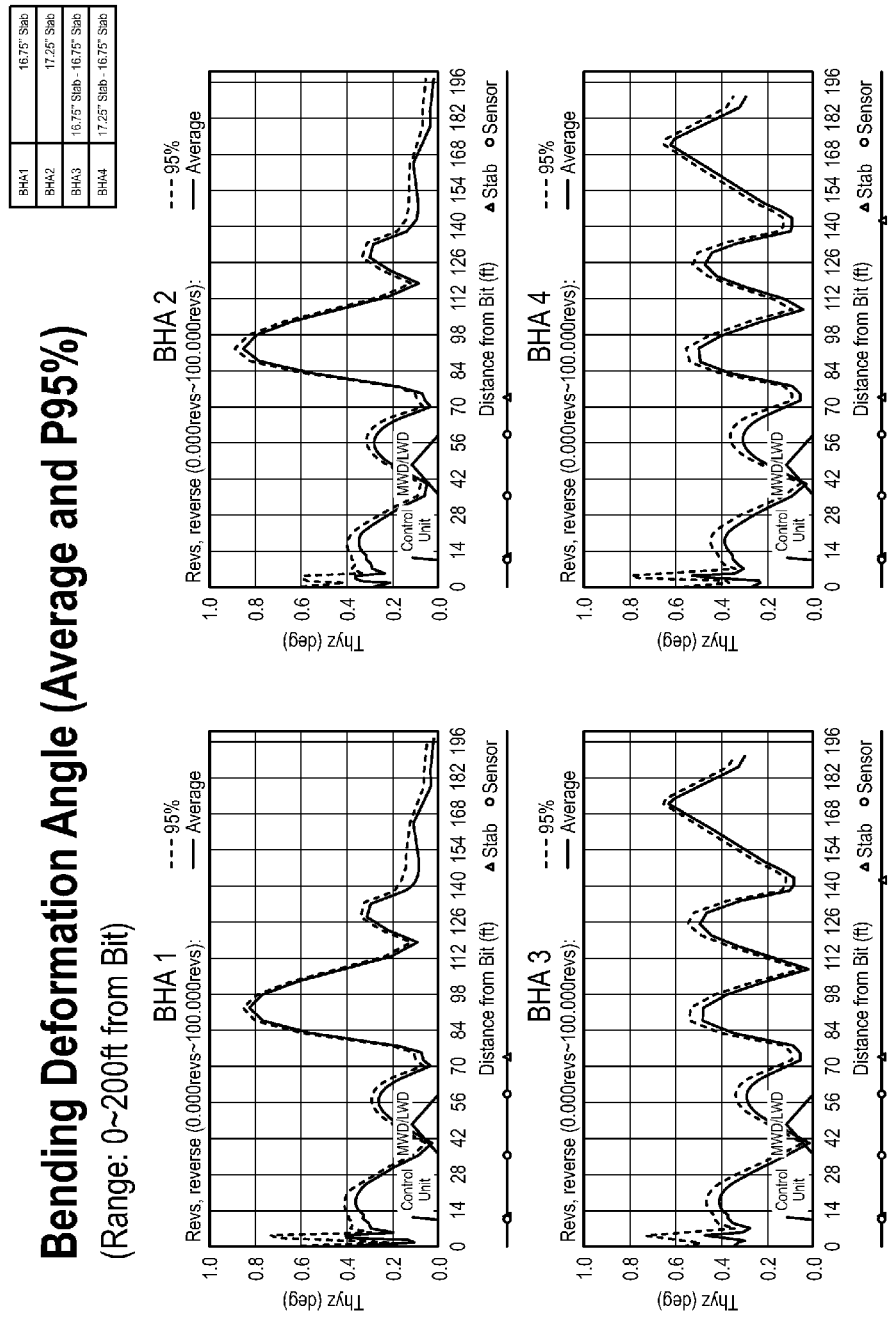

FIG. 12C illustrates the bending deformation angle along the length of the drill string (0-200 feet from the bit). Near the drill collar, this angle is referred to as the collar deflection angle. Ash shown in FIG. 12C, BHA2 has the lowest deflection angle (best for measurement quality), while BHA3 has a higher deflection angle.

Figure 12D:
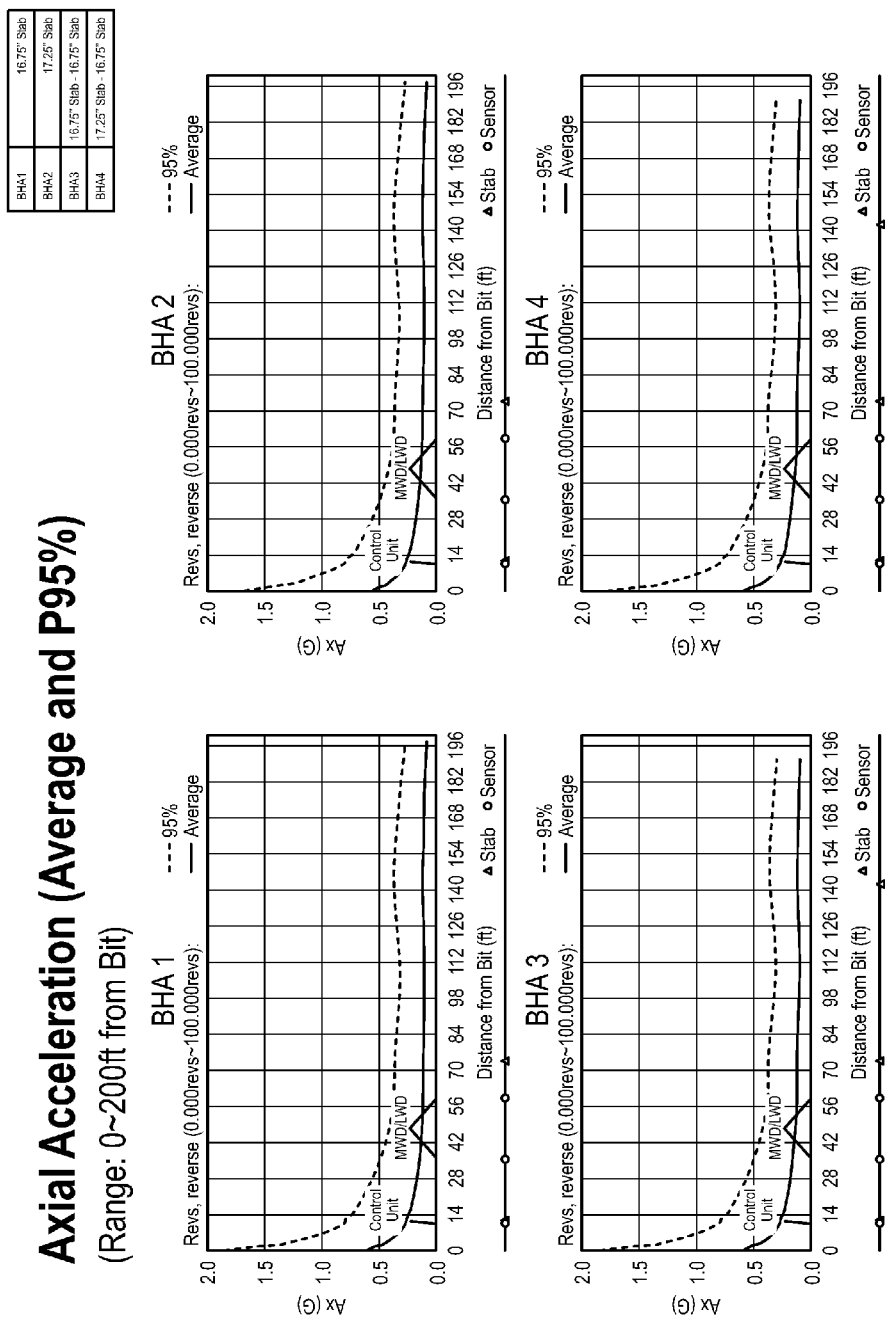

FIG. 12D illustrates the axial acceleration along the length of the drill string (0-200 feet from the bit). All of the BHA packages have similar profiles, and show a relatively low axial acceleration at the bit.

Figure 12E:
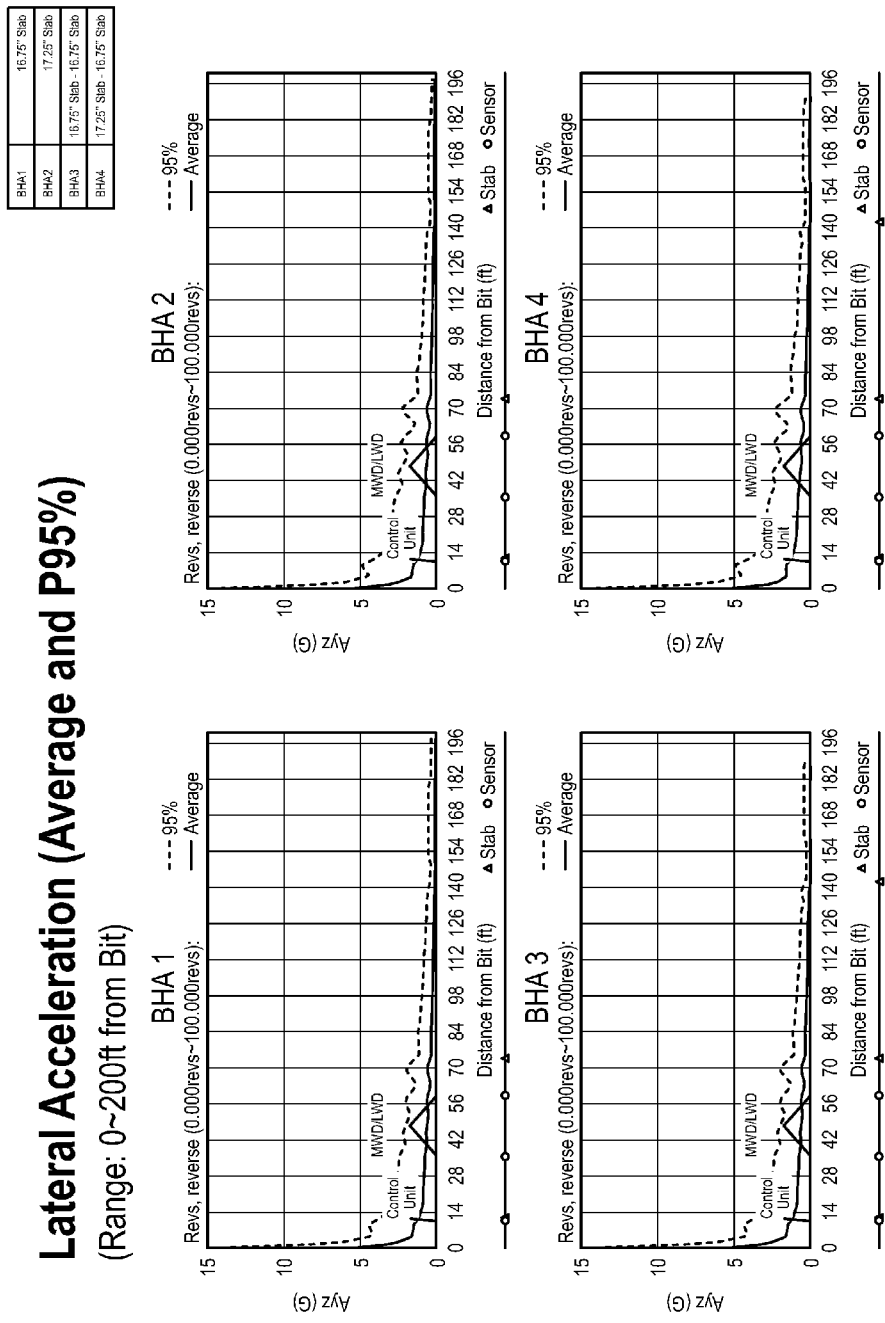

FIG. 12E illustrates the lateral acceleration along the length of the drill string (0-200 feet from the bit). As in FIG. 12D, all of the BHA packages have similar profiles, but show a relatively high lateral acceleration at the bit.

FIG. 12F illustrates the torque along the length of the drill string (0-200 feet from the bit). All of the BHA packages have similar profiles.

Figure 12G:
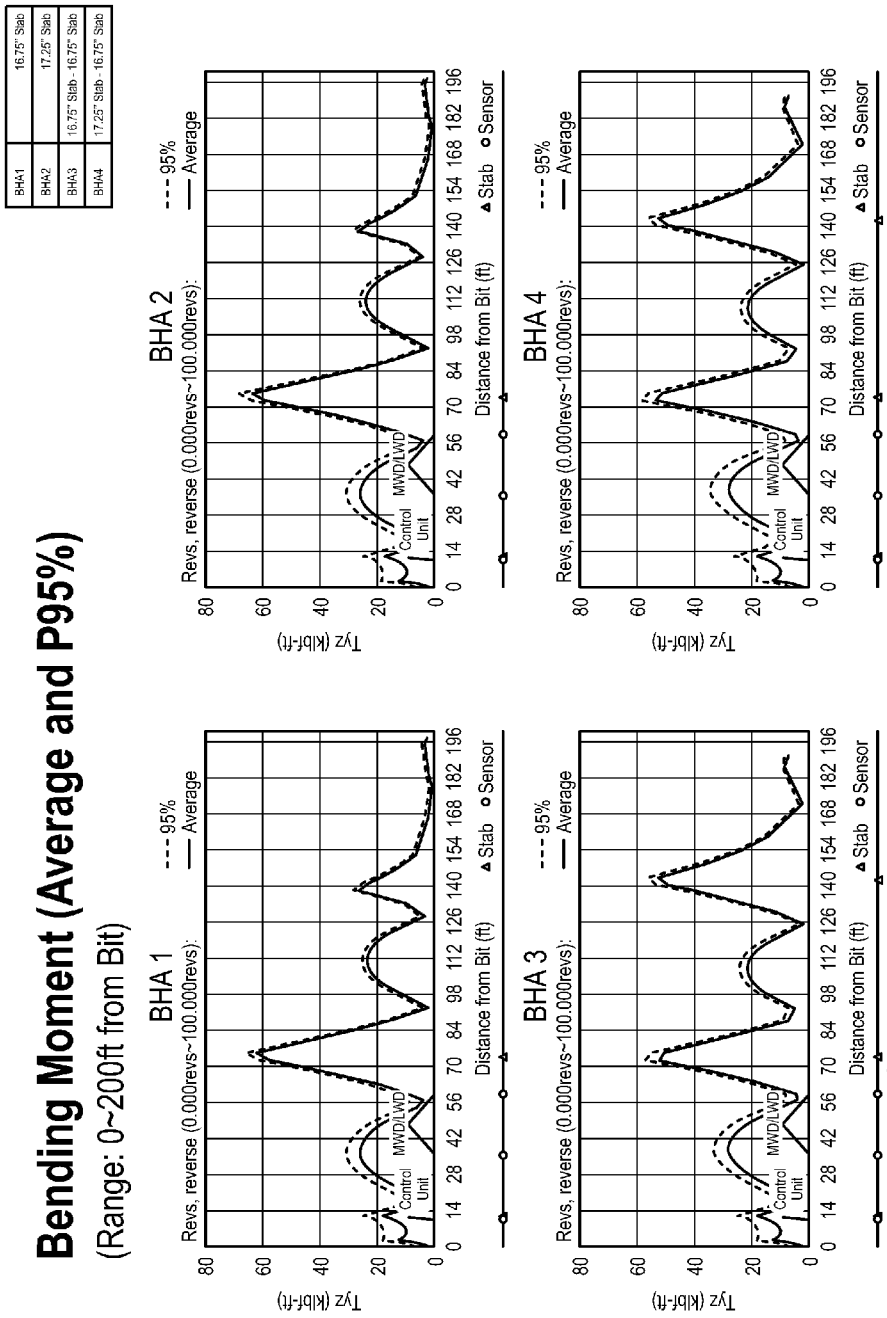

FIG. 12G illustrates the bending moment along the length of the drill string (0-200 feet from the bit). Cross checking these results against the BHA component locations can determine which components have stress peaks, and, therefore, which components are more likely to fail.

Figure 12H:
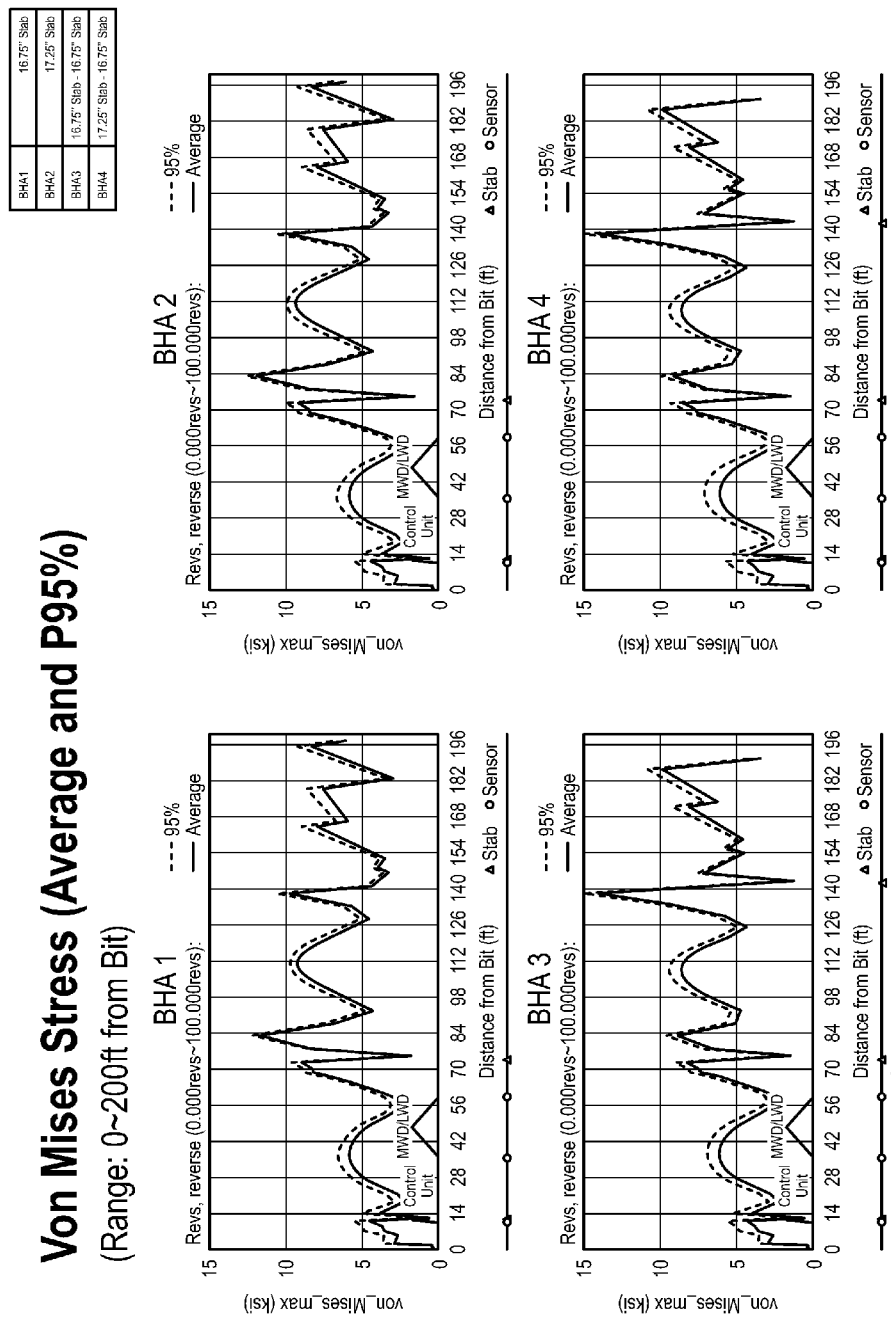
Figure 121:
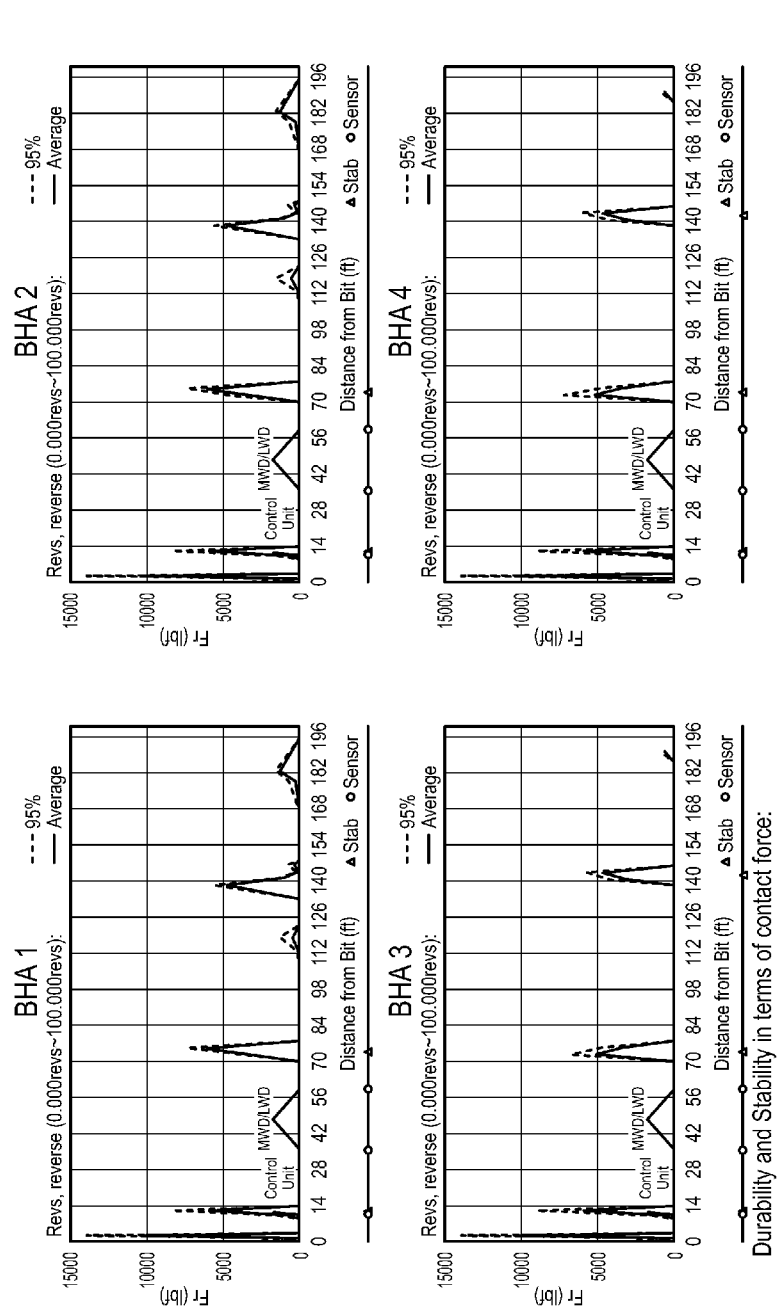

FIG. 12H illustrates the Von Mises stress along the length of the drill string (0-200 feet from the bit). In FIG. 12H, BHA3 and BHA4 show substantially higher stress profiles, particularly near the second stab (around 140 feet from the bit).

FIG. 12I illustrates the contact force along the length of the drill string (0-200 feet from the bit). BHA1 and BHA2 show a slightly higher contact force at the second stab (around 140 feet from the bit) than either BHA3 or BHA4.

Figure 12J:
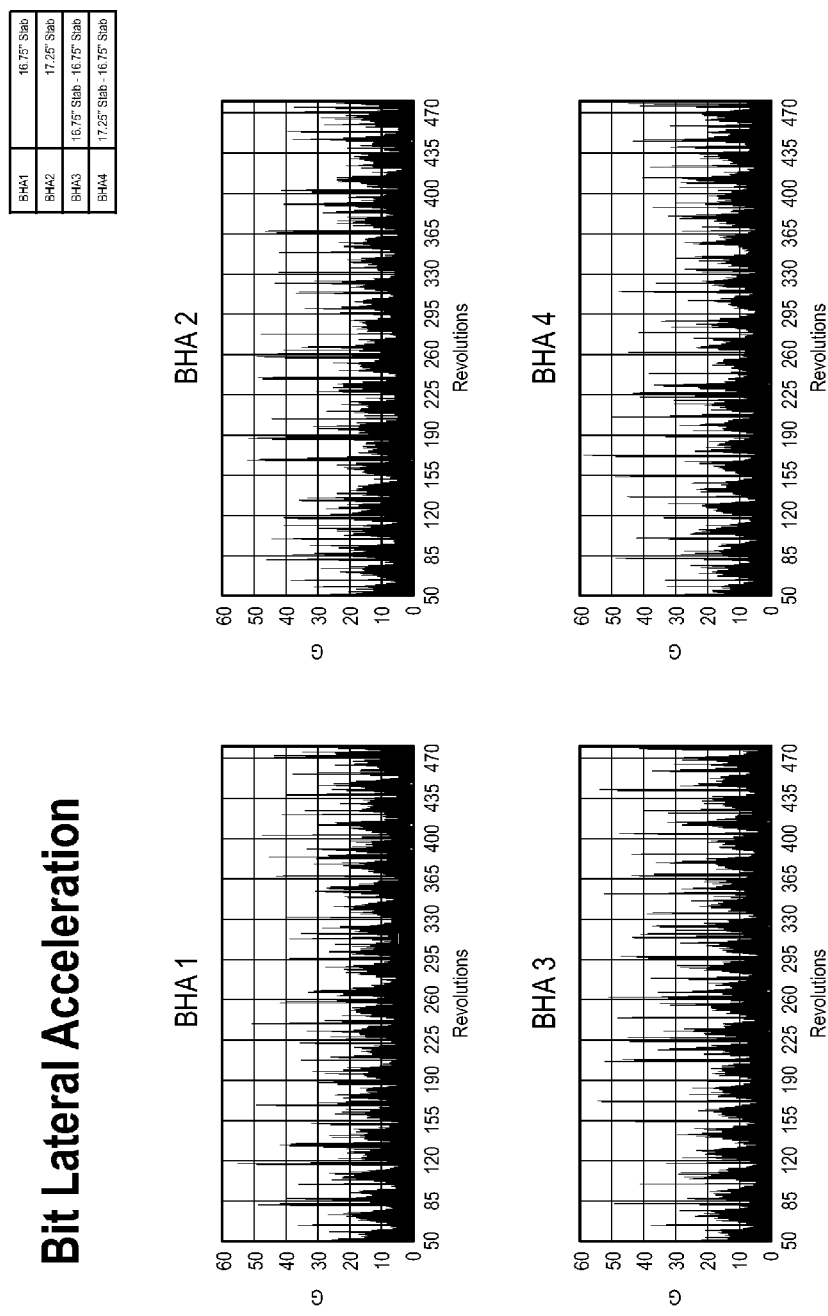

FIG. 12J illustrates the bit lateral acceleration as a function of revolutions. All of the BHA packages show a similar bit lateral acceleration profile.

FIG. 12K illustrates the bit RPM's as a function of the number of revolutions. While all of the BHA packages show a similar profile, the profile is indicative of high stick-slip (as shown by the large variations in magnitude).

Figure 12L:
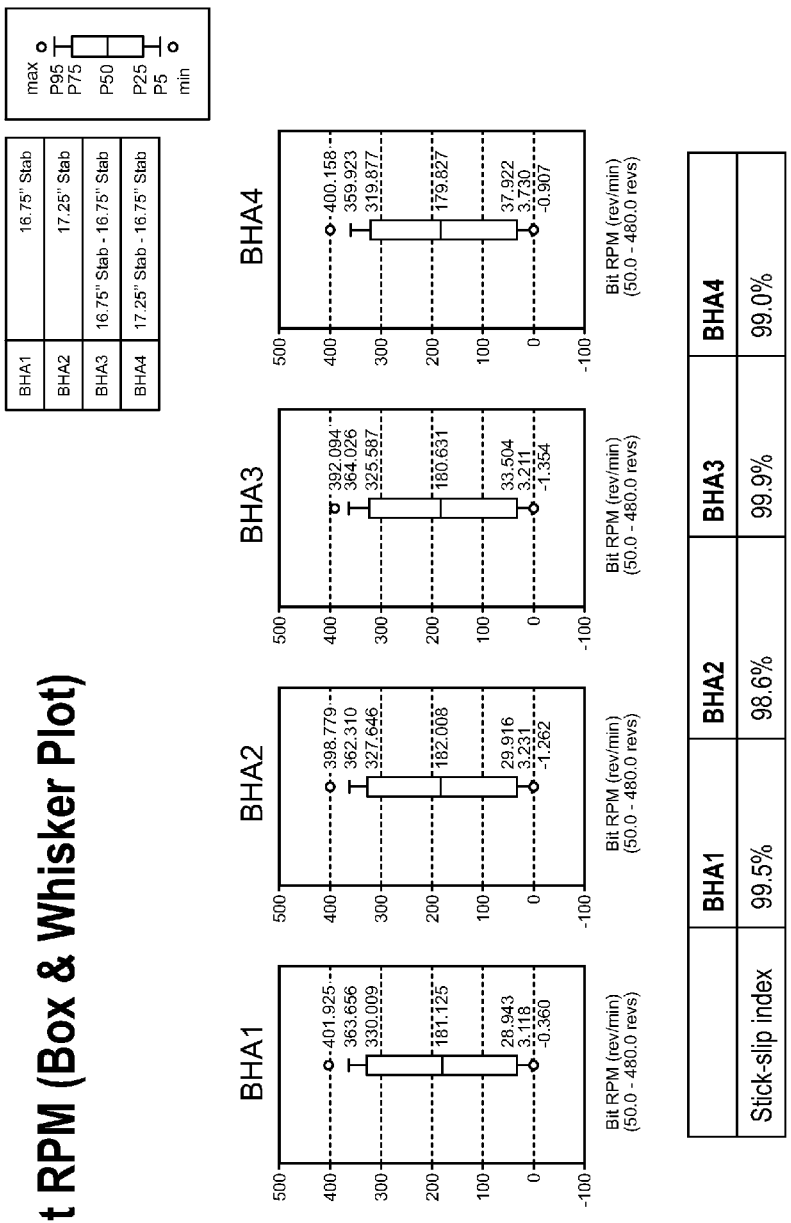

FIG. 12L is a Box and Whisker plot of the data from FIG. 12K, and is used to calculate a stick-slip index, as discussed above. All of the BHA packages have similar (high) stick-slip.

FIG. 12M illustrates the surface torque occurring as a function of the number of revolutions. All of the BHA packages show similar surface torque variations.

FIG. 13 and the associated figures illustrate the effects of simulation 6, which pertains to a high well friction case. As noted above, a number of factors can affect the friction of the well, such as formation type, (i.e., sandstone usually has higher friction than shale), lost of circulation, poor hole cleaning, micro doglegs, ledges, hole diameter changes (non smooth hole).

FIG. 13A illustrates the lateral displacement along the length of the drill string (0-200 feet from the bit). In FIG. 13A, all of the BHA packages show a similar lateral displacement profile.

Figure 13B:
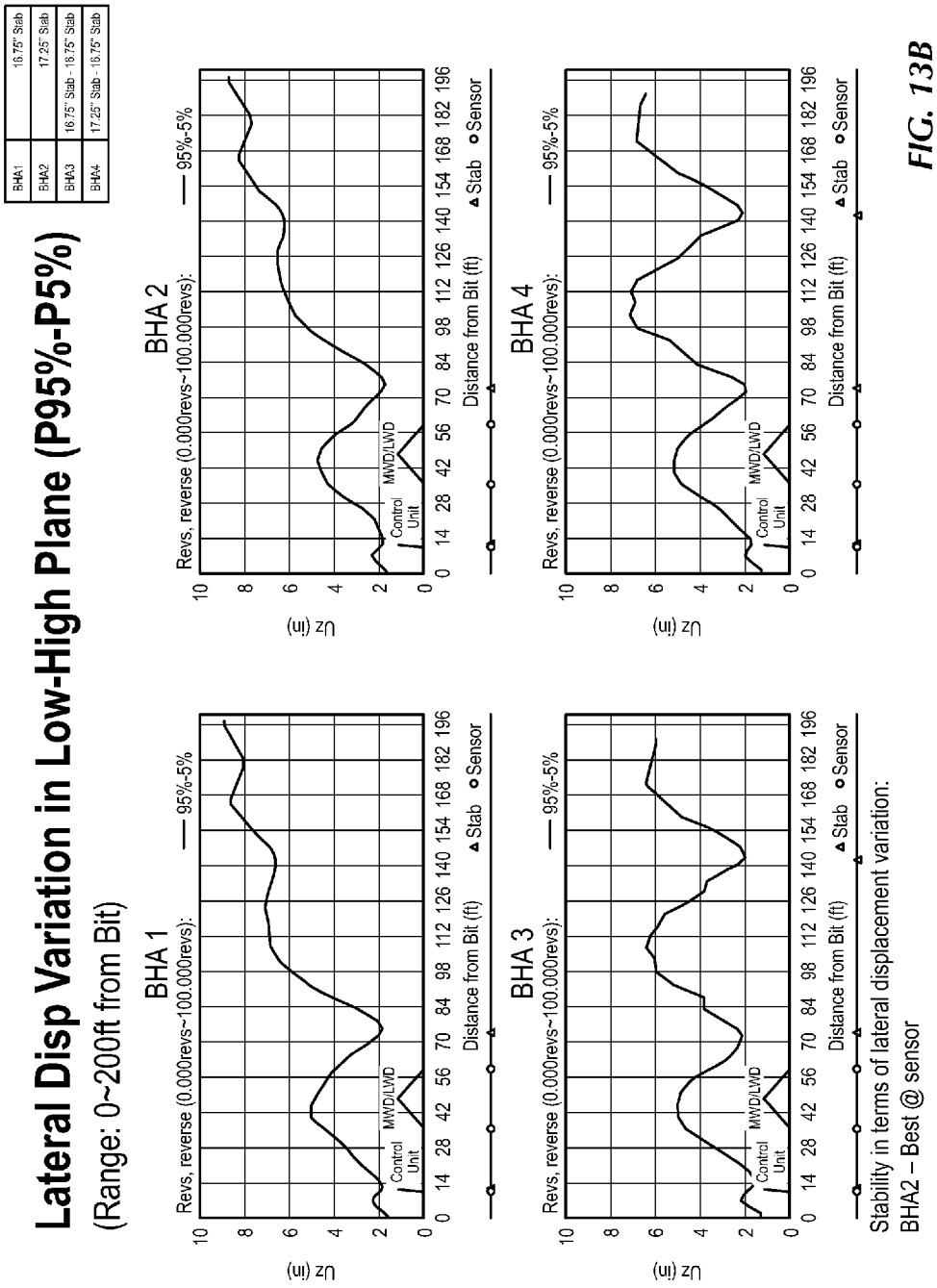

FIG. 13B illustrates the lateral displacement variation along the length of the drill string (0-200 feet from the bit). FIG. 13B shows that BHA2 has a lower lateral displacement variation at the sensor location, while the remaining packages have similar lateral displacement variation.

Figure 13C:
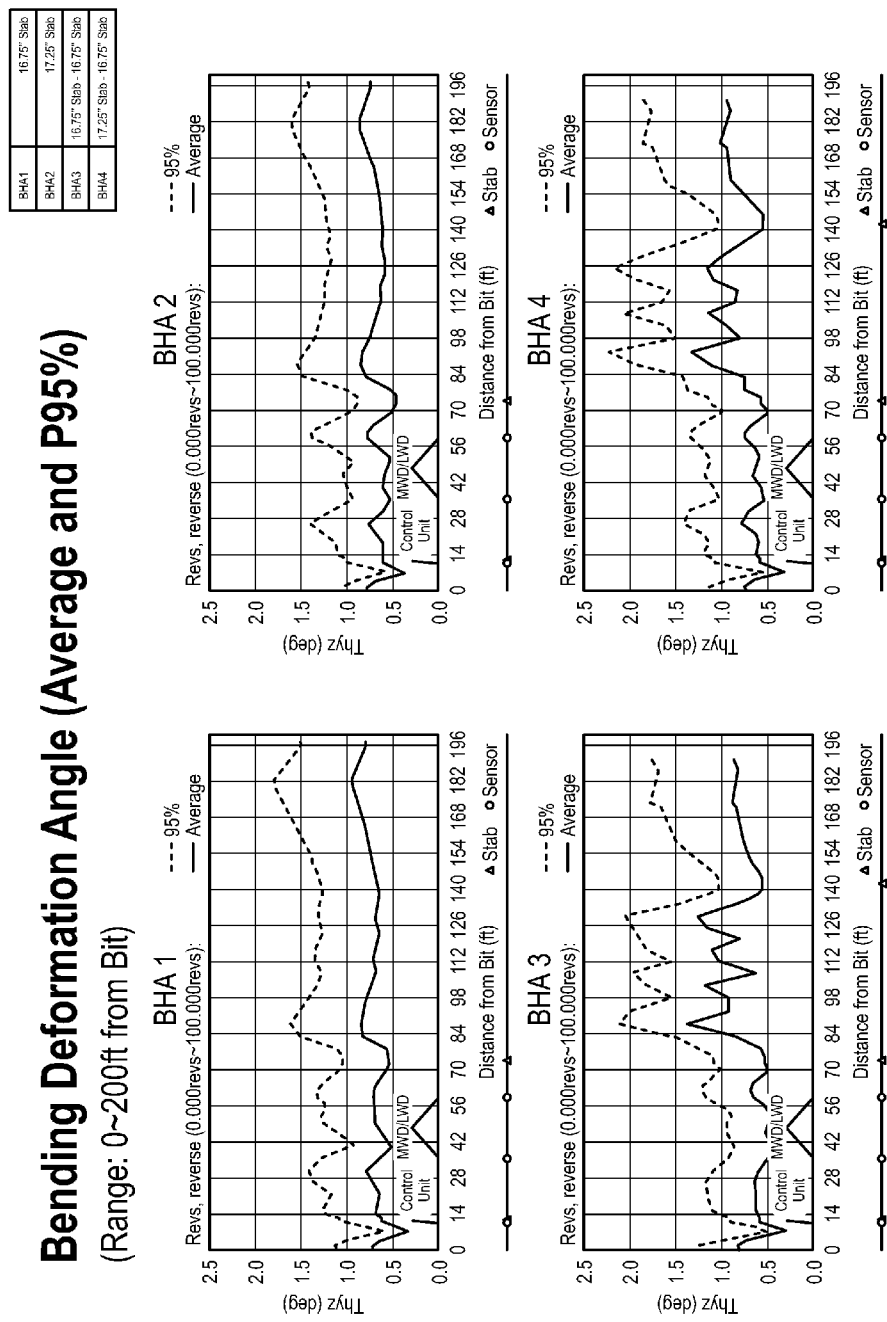

FIG. 13C illustrates the bending deformation angle along the length of the drill string (0-200 feet from the bit). FIG. 13C shows that, for this simulation, all of the BHA packages have similar bending deformation angles at the sensor, but have different profiles along the rest of the string.

Figure 13D:
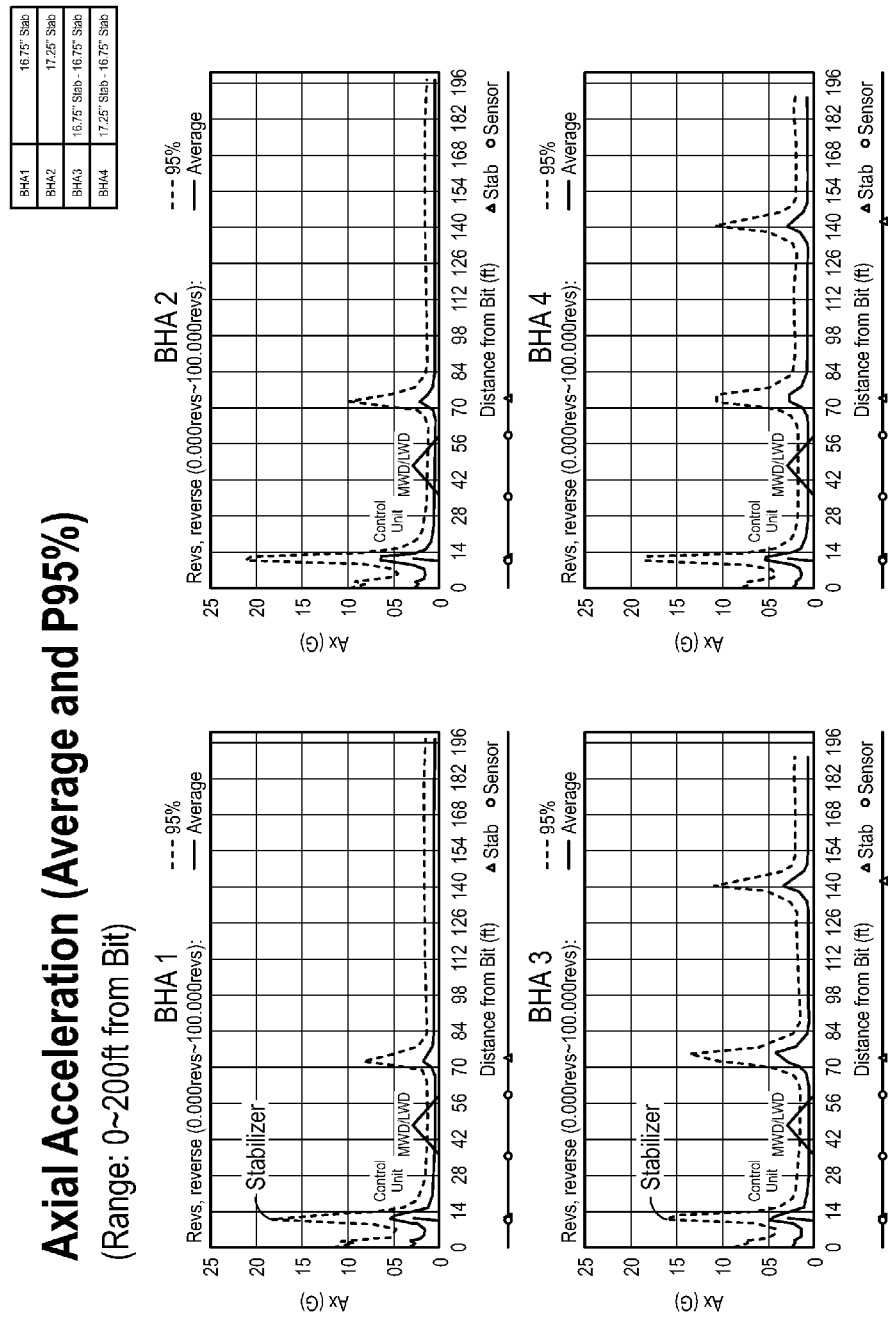

FIG. 13D illustrates the axial acceleration along the length of the drill string (0-200 feet from the bit). FIG. 13D illustrates that all of the BHA packages see high axial acceleration at the bit stabilizer (approximately 14 feet from the bit). BHA3 and BHA4 show additional high axial acceleration at the second stab (located 140 feet from the bit).

Figure 13E:
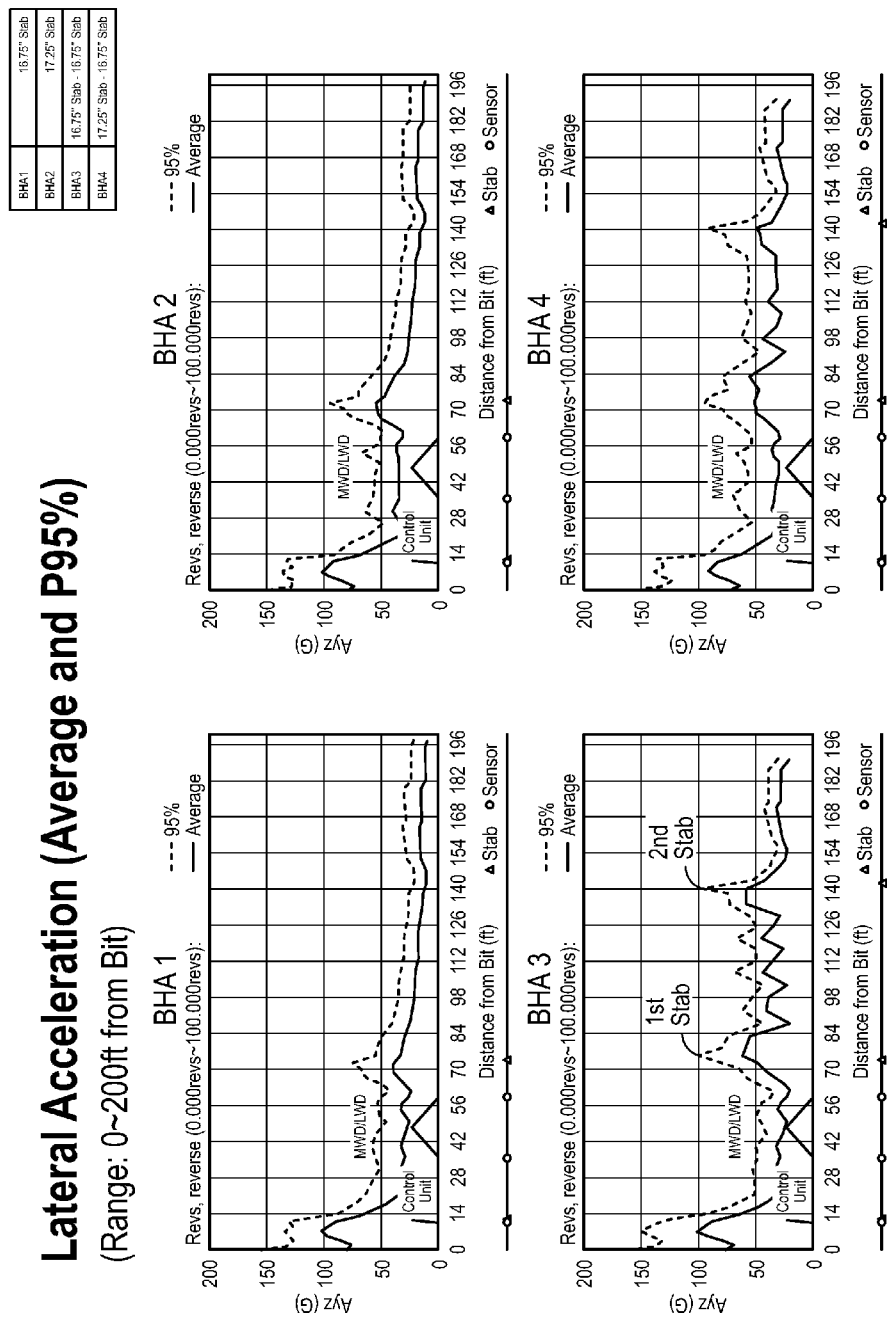

FIG. 13E illustrates the lateral acceleration along the length of the drill string (0-200 feet from the bit). In FIG. 13E, all of the BHA packages show high lateral acceleration until the first stab (at approximately 70 feet). BHA1 and BHA2 then show a decrease in lateral acceleration along the rest of the length, while BHA3 and BHA4 show a relatively high, flat, lateral acceleration pattern, in the presence of the second stab (located at approximately 140 feet from the bit).

Figure 13F:
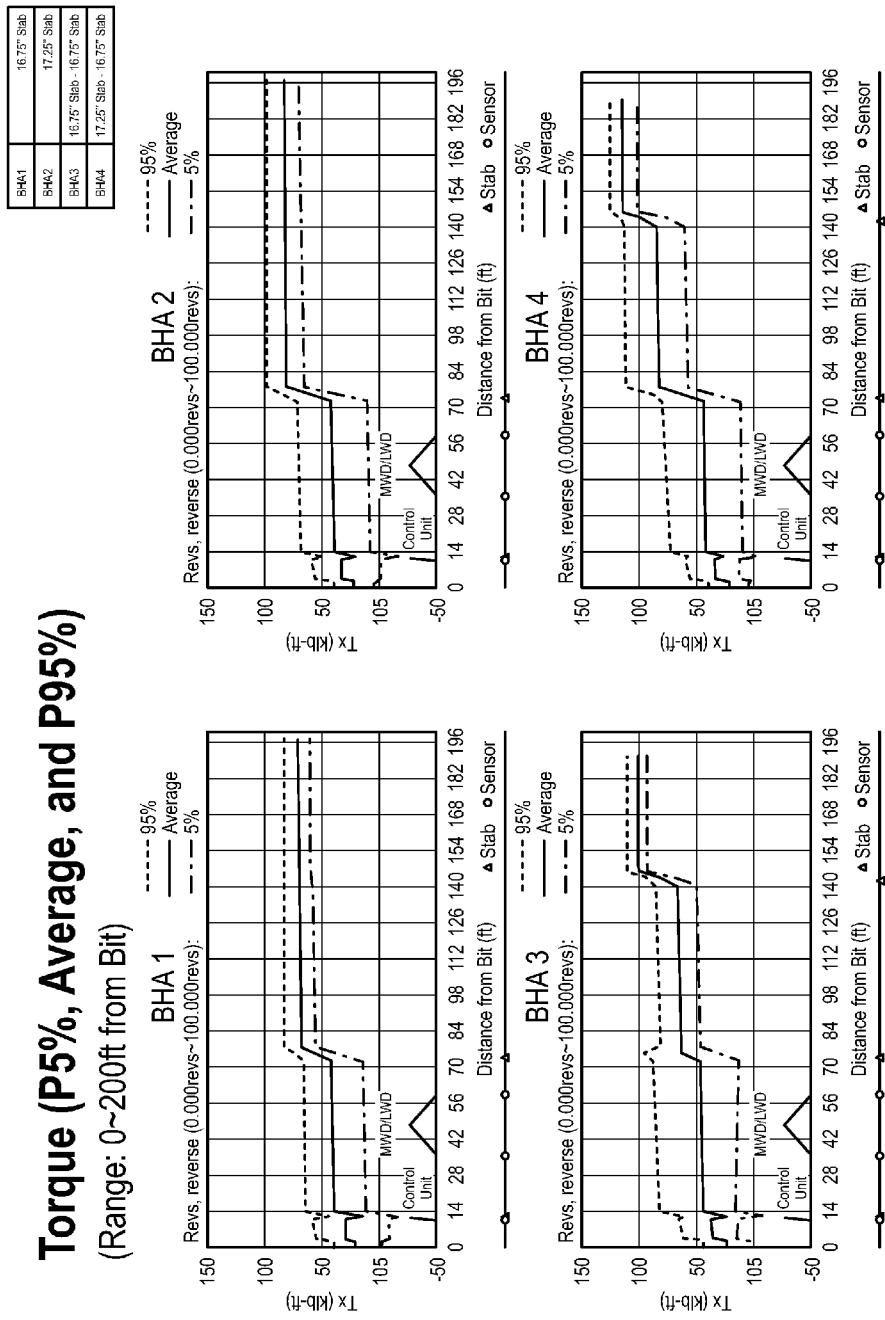

FIG. 13F illustrates the torque along the length of the drill string (0-200 feet from the bit). In FIG. 13F, all of the BHA packages have extremely high torque along the entire analyzed length, but the average torque is lowest in BHA1.

Figure 13G:
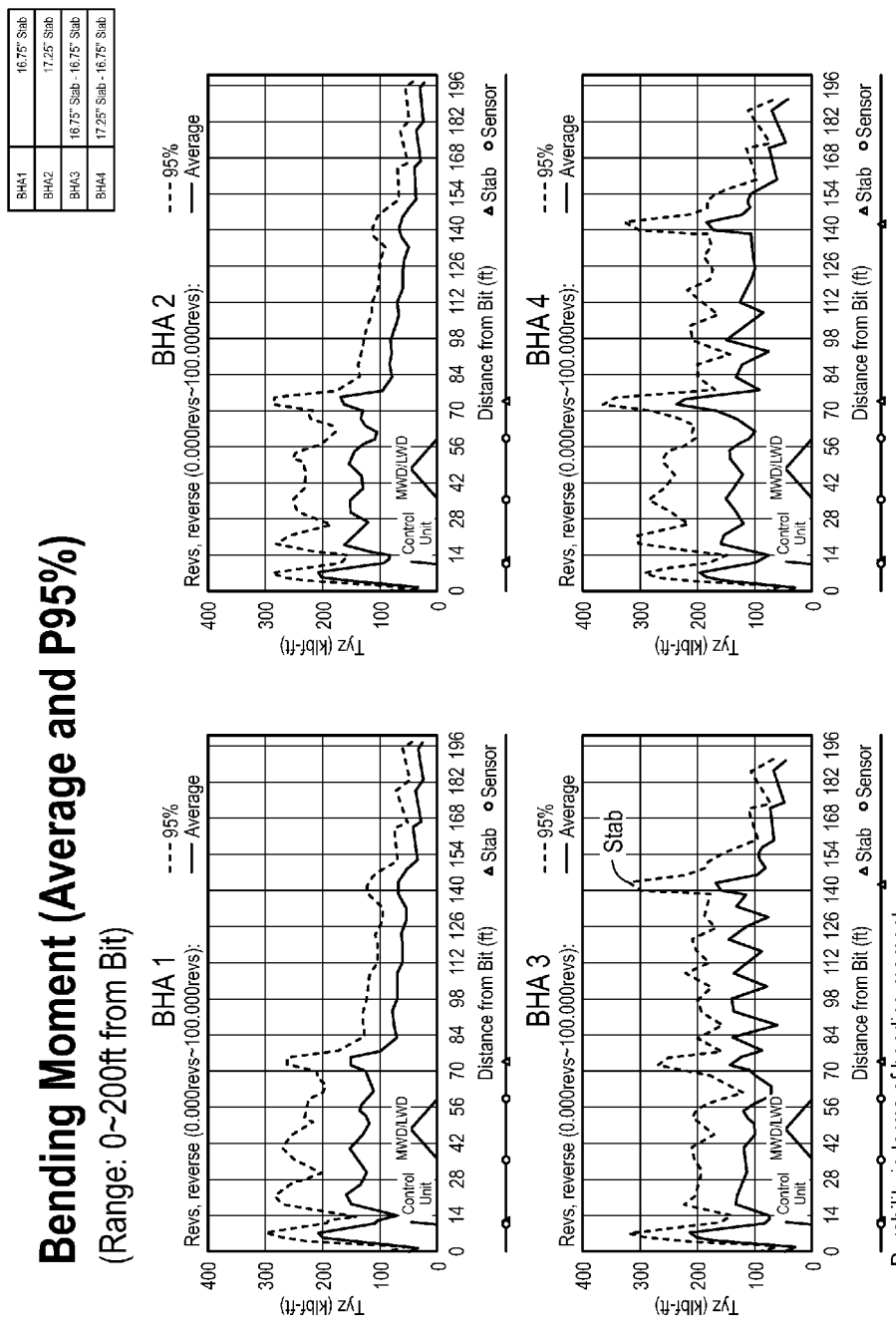

FIG. 13G illustrates the bending moment along the length of the drill string (0-200 feet from the bit). In FIG. 13G, all of the BHA packages have extremely high bending moments, which, as mentioned above, is a function of bit whirl. Bit whirl causes bending along the components of the drill string away from the bit, and can result in significant damage to various components.

Figure 13H:
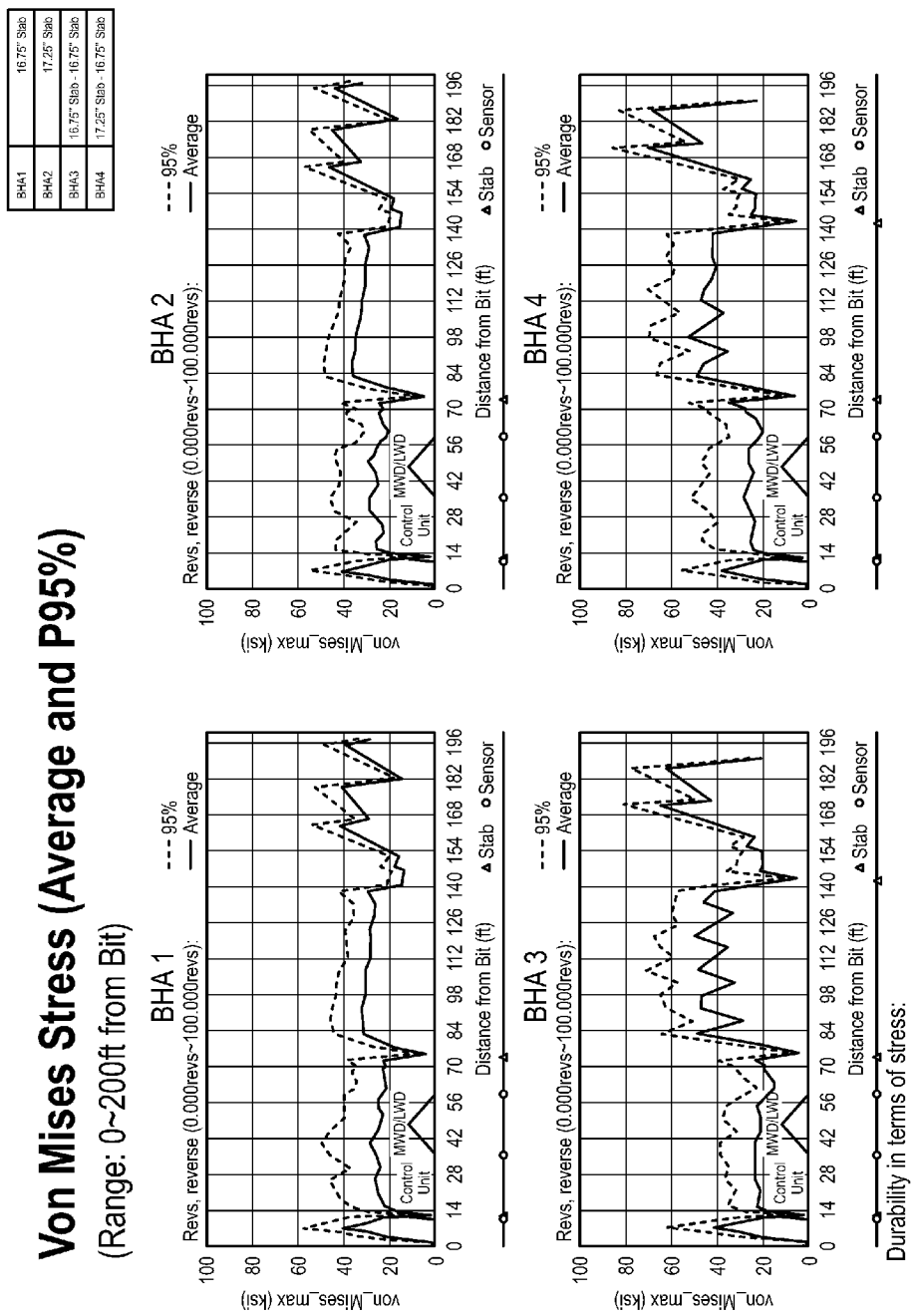

FIG. 13H illustrates the Von Mises stress along the length of the drill string (0-200 feet from the bit). FIG. 13H shows that very high stresses are found along the entire analyzed length for all of the BHA packages. This, in combination with the bending moment data, is indicative that fatigue failure may result along the drill string, during bit whirl. The presence of a secondary stab (found in BHA3 and BHA4 at approximately 140 feet) results in significantly increased stresses in the upper portions of the BHA (located beyond the secondary stab).

Figure 13I:
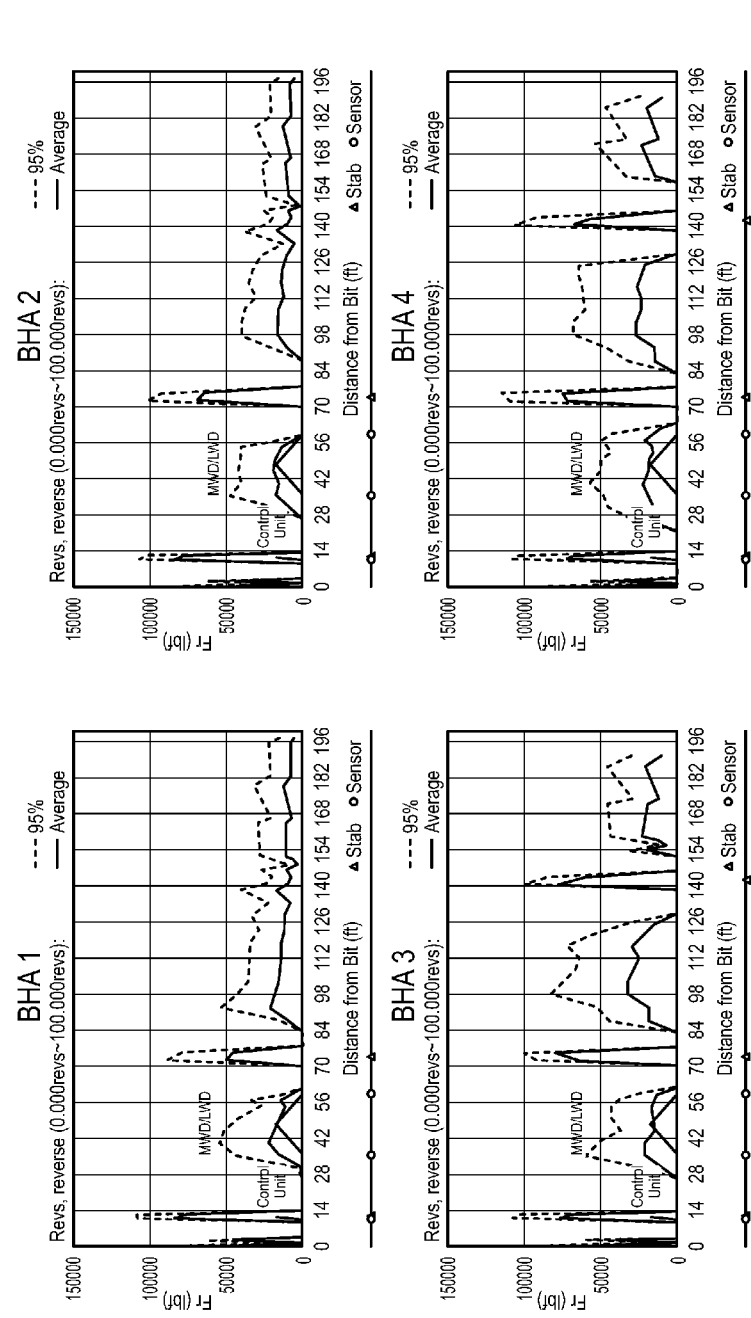

FIG. 13I illustrates the contact force along the length of the drill string (0-200 feet from the bit). As shown in FIG. 13I a significant contact force exists for all BHA packages at the stabilizer as well on the MWD/LWD collar. Overall BHA1 exhibits a lower contact force than BHA2, BH3, or BHA4.

Figure 13J:
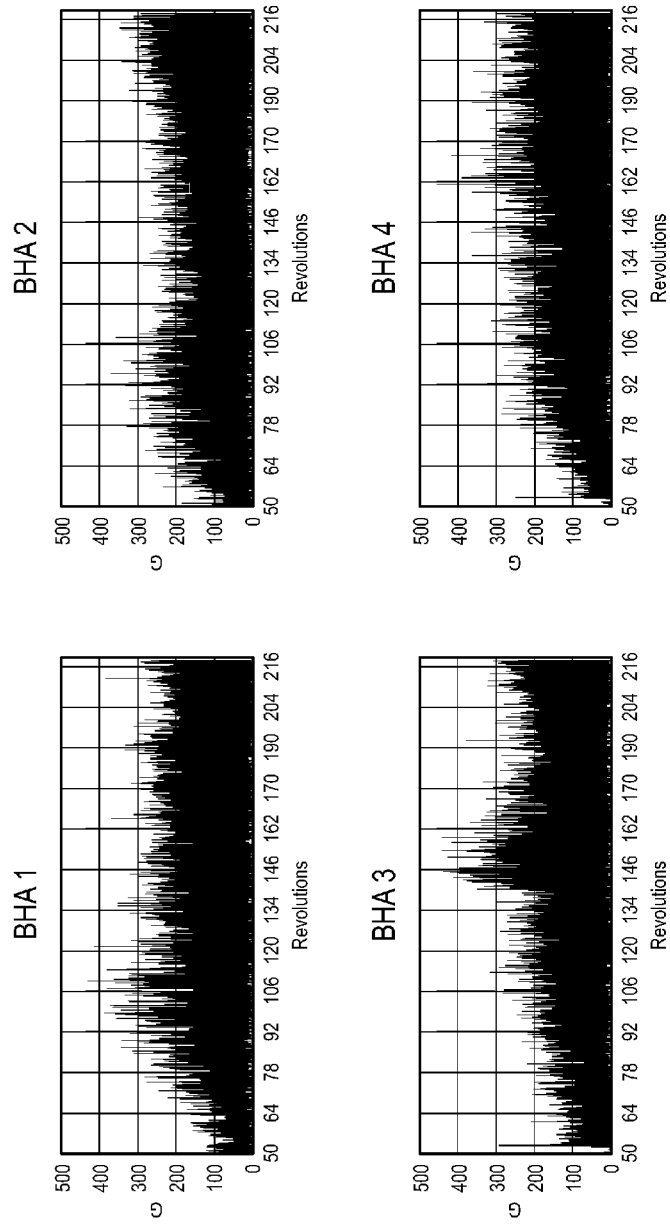

FIG. 13J illustrates the bit lateral acceleration as a function of the number of revolutions. As shown in FIG. 13J, all of the BHA packages show relatively high bit lateral accelerations over all of the revolutions.

Figure 13K:
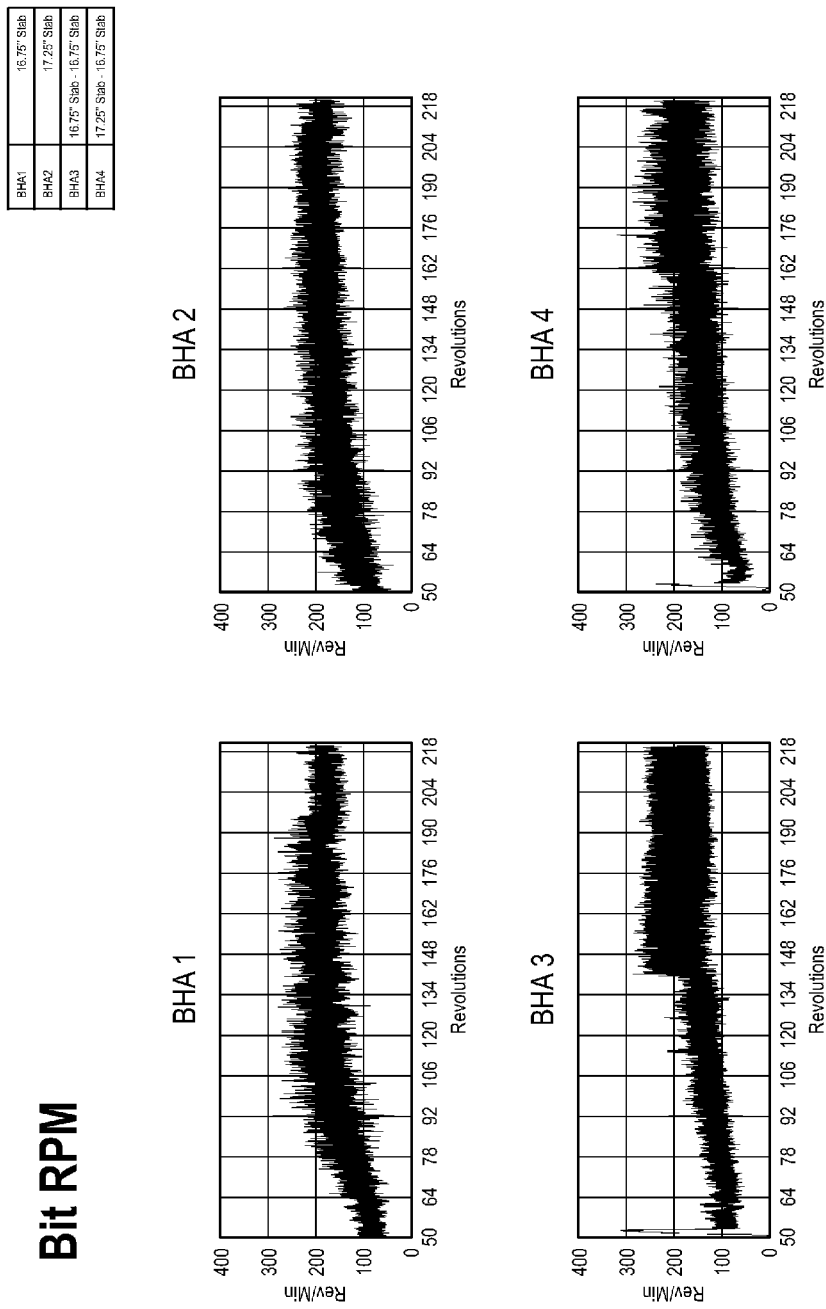

FIG. 13K illustrates the bit RPM's as function of the number of revolutions. As shown in FIG. 13K, the RPM variation is lower than in simulation 1 (normal drilling) for all of the BHA packages.

Figure 13L:
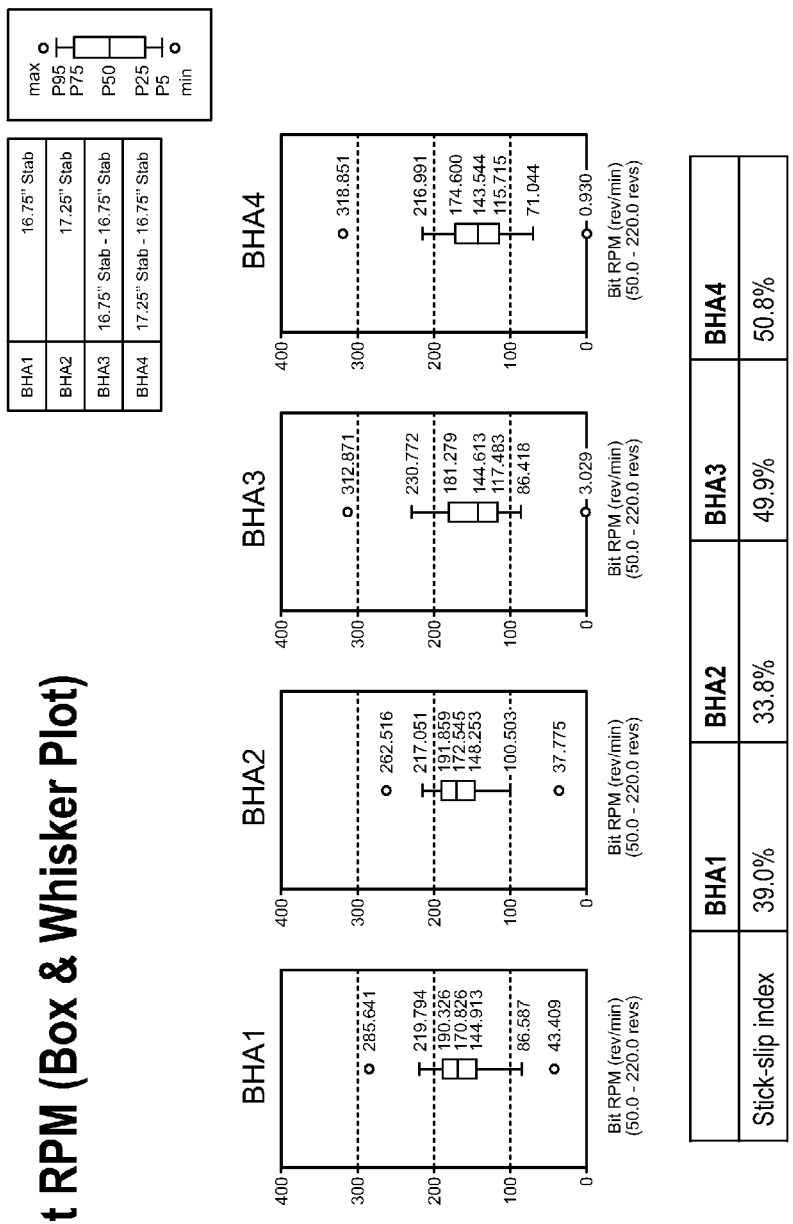

FIG. 13L shows a Box and Whisker plot of the data from FIG. 13K. The Box and Whisker plot is used to calculate a stick-slip index. As can be seen from the table in FIG. 13L, BHA1 and BHA2 have lower stick-slip indexes than BHA3 and BHA4.

Figure 13M:
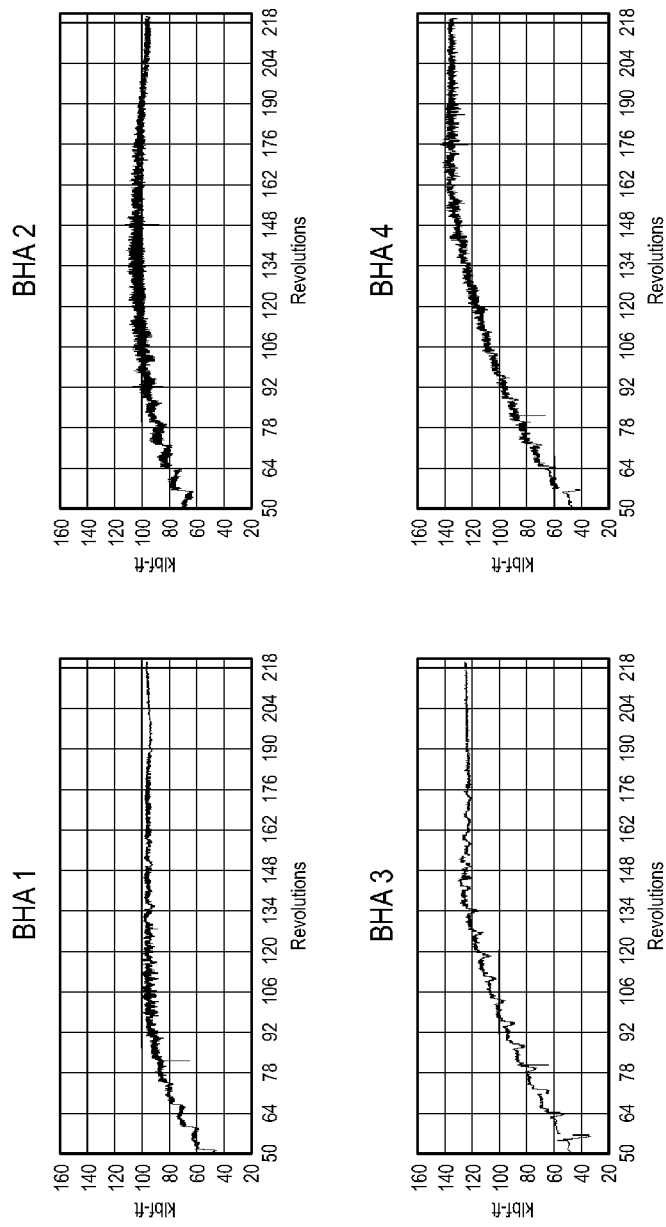

FIG. 13M illustrates the surface torque as a function of the number of bit revolutions for each of the four BHA packages. As can be seen from FIG. 13M, BHA1 and BHA2 have comparatively lower surface torques as compared to BHA3 and BHA4.

FIG. 14 and the associated figures illustrate the effect of eccentricity for each Due to application needs, some components will have eccentricity. For example, some LWD tool will have sensors located on one side of the tool on the BHA packages.

Figure 14A:
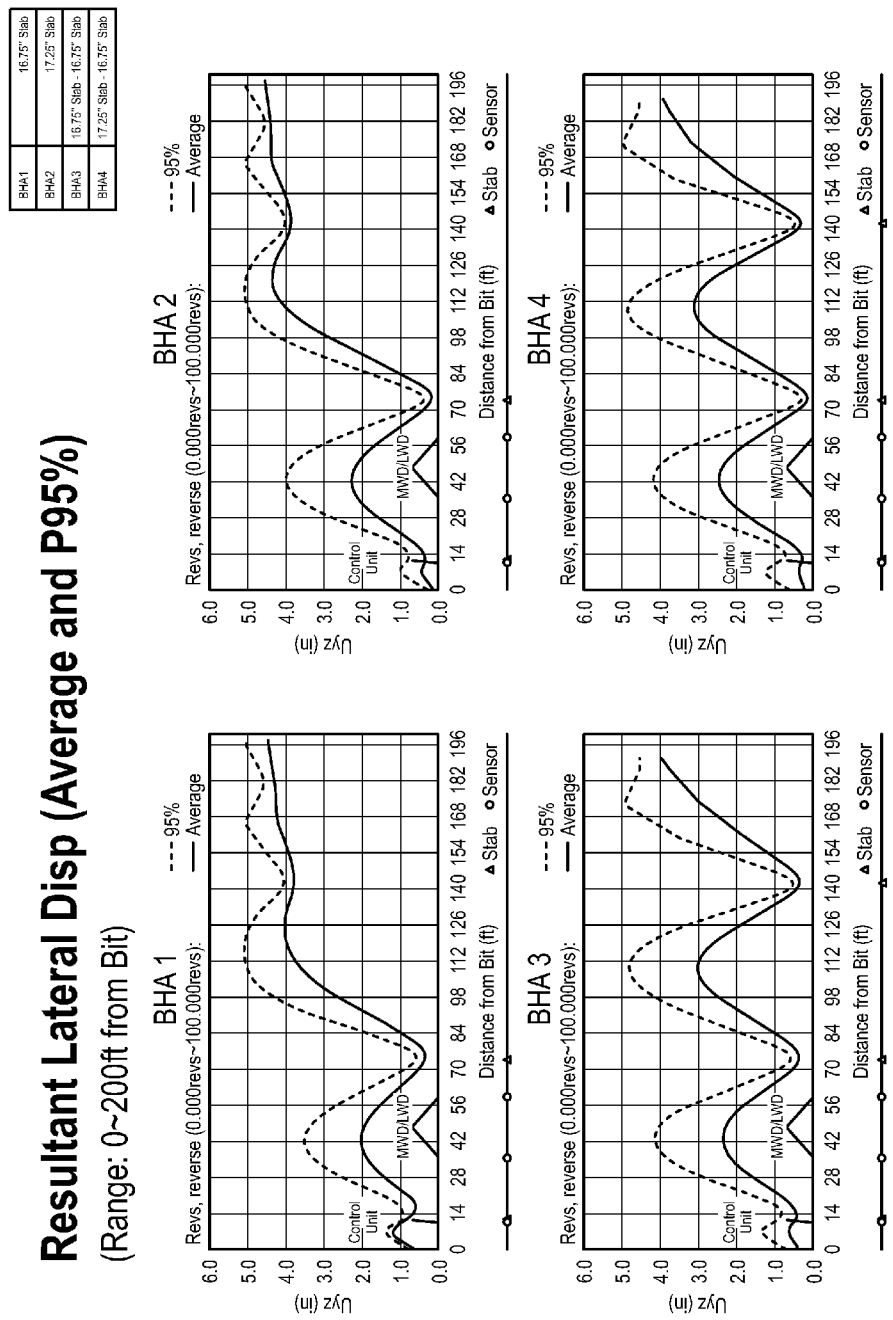
FIGS. 14A-14M show exemplary outputs for simulation scenario 7 in accordance with embodiments of the disclosure.

FIG. 14A illustrates the lateral displacement over the length of the drill string (0-200 feet from the bit). As can be seen from FIG. 14A, BHA1 has significantly less sag than BHA2, BHA3, or BHA4. As noted above, by reducing sag in the MWD/LWD sensor section, better measurement quality may be achieved.

Figure 14B:
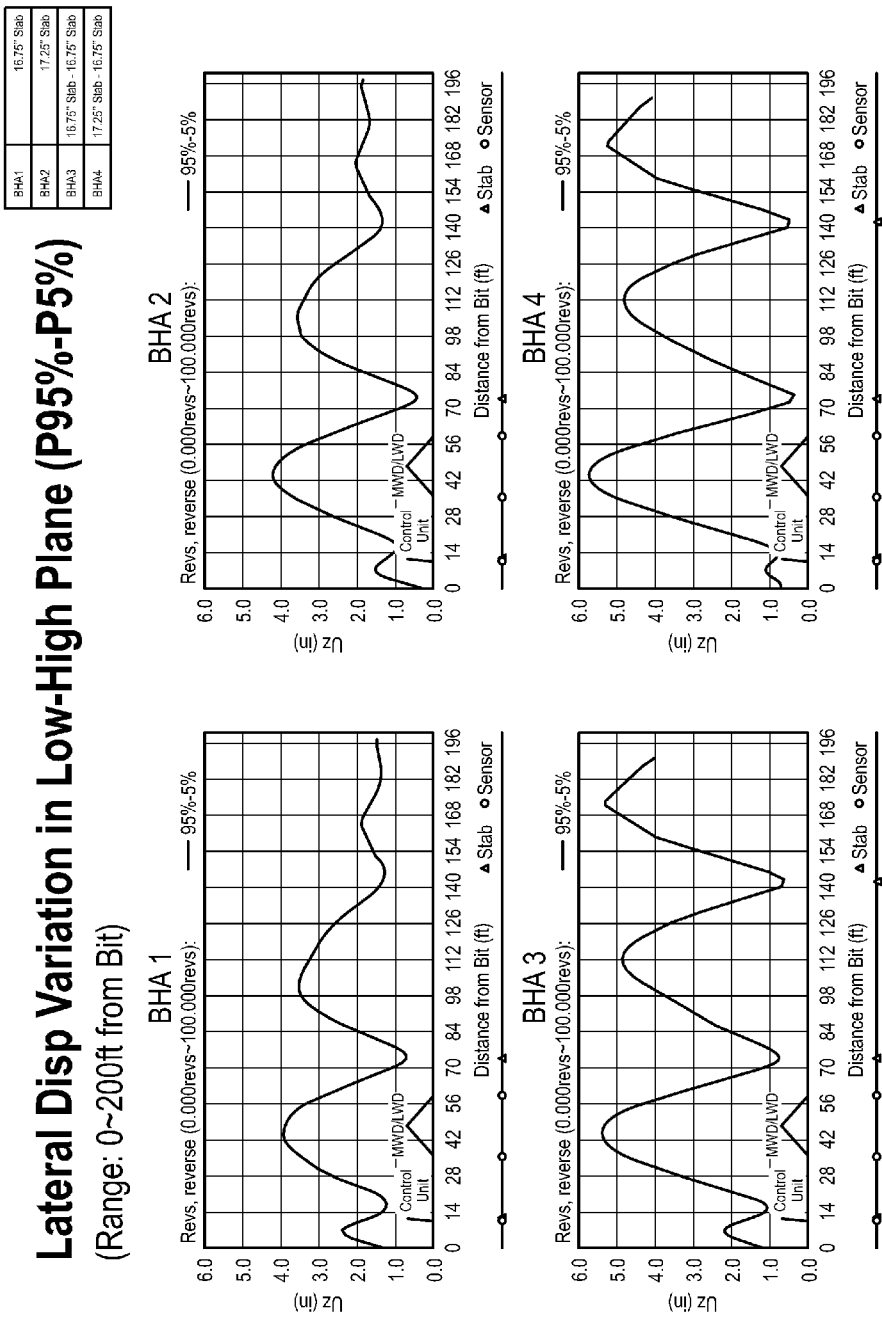

FIG. 14B illustrates the lateral displacement variation over the length of the drill string (0-200 feet from the bit). As shown in FIG. 14B, BHA1 has the lowest lateral displacement variation at the MWD/LWD sensor. Additionally, BHA3 and BHA4 show significant lateral displacement variation above the first stab (after approximately 70 feet from the bit).

Figure 14C:
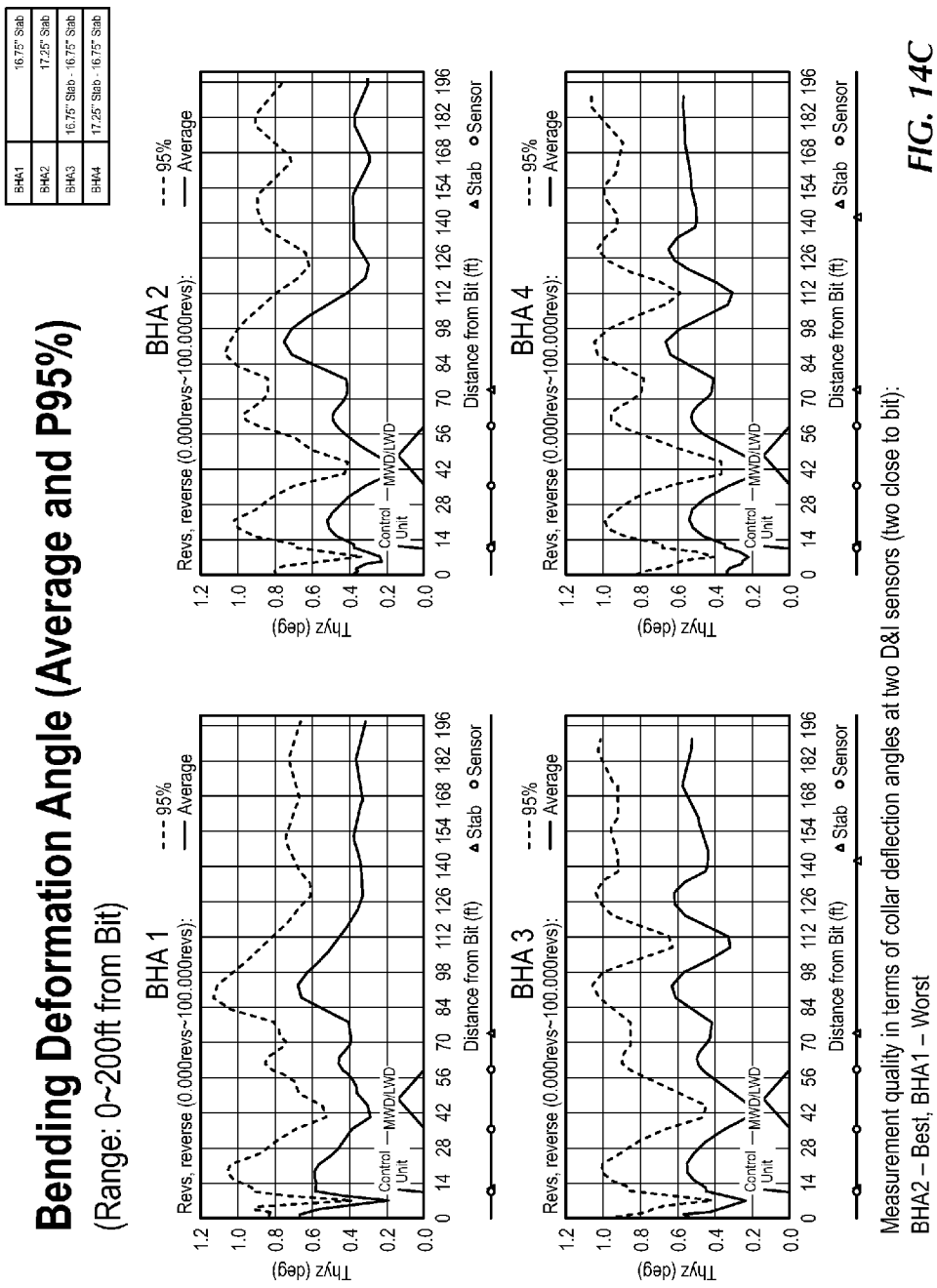

FIG. 14C illustrates the bending deformation angle over the length of the drill string (0-200 feet from the bit). As shown in FIG. 14C, BHA2 has the lowest deflection angle, and is, therefore, predicted to have the best measurement quality in terms of deformation angle.

Figure 14D:
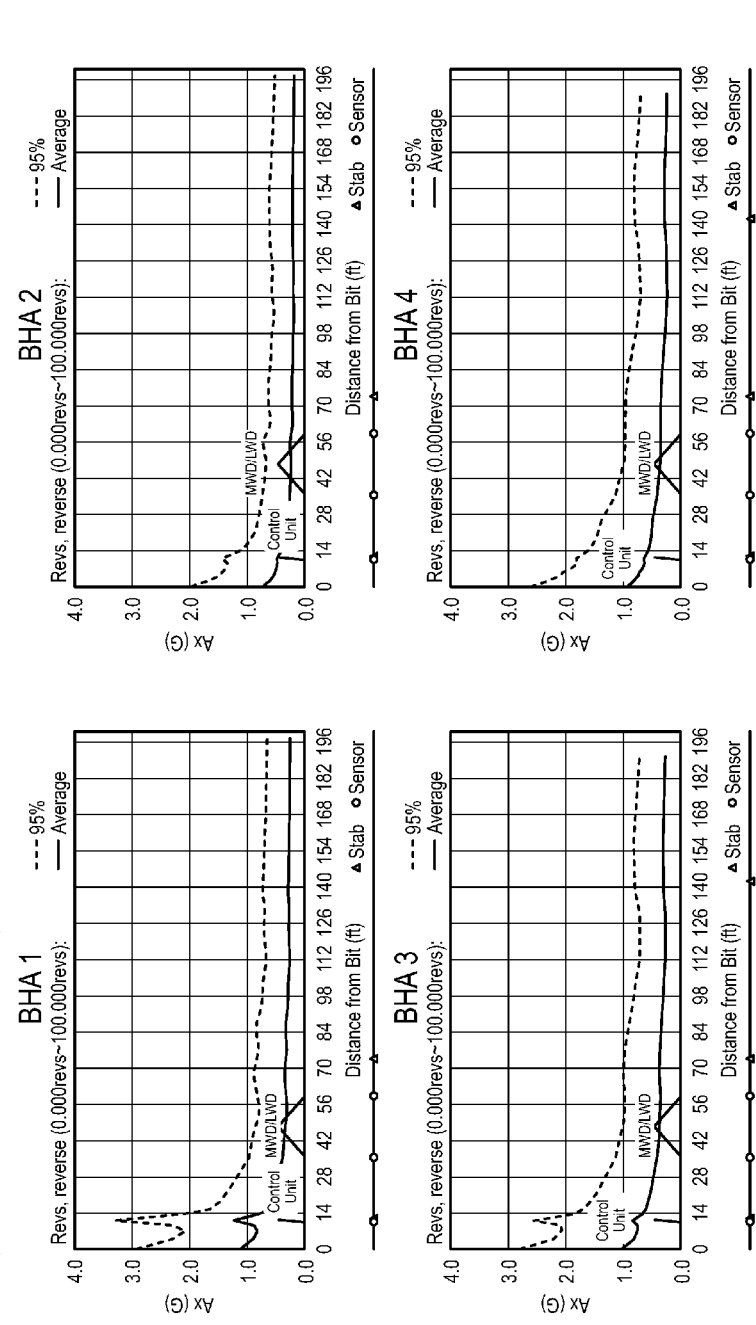

FIG. 14D illustrates the axial acceleration over the length of the drill string (0-200 feet from the bit). As shown in FIG. 14D, BHA2 is predicted to have the lowest axial acceleration, which is particularly noticeable at the bit. This is a comparison between the sizes of stabilizers used in different BHAs (FIG. 6A).

Figure 14E:
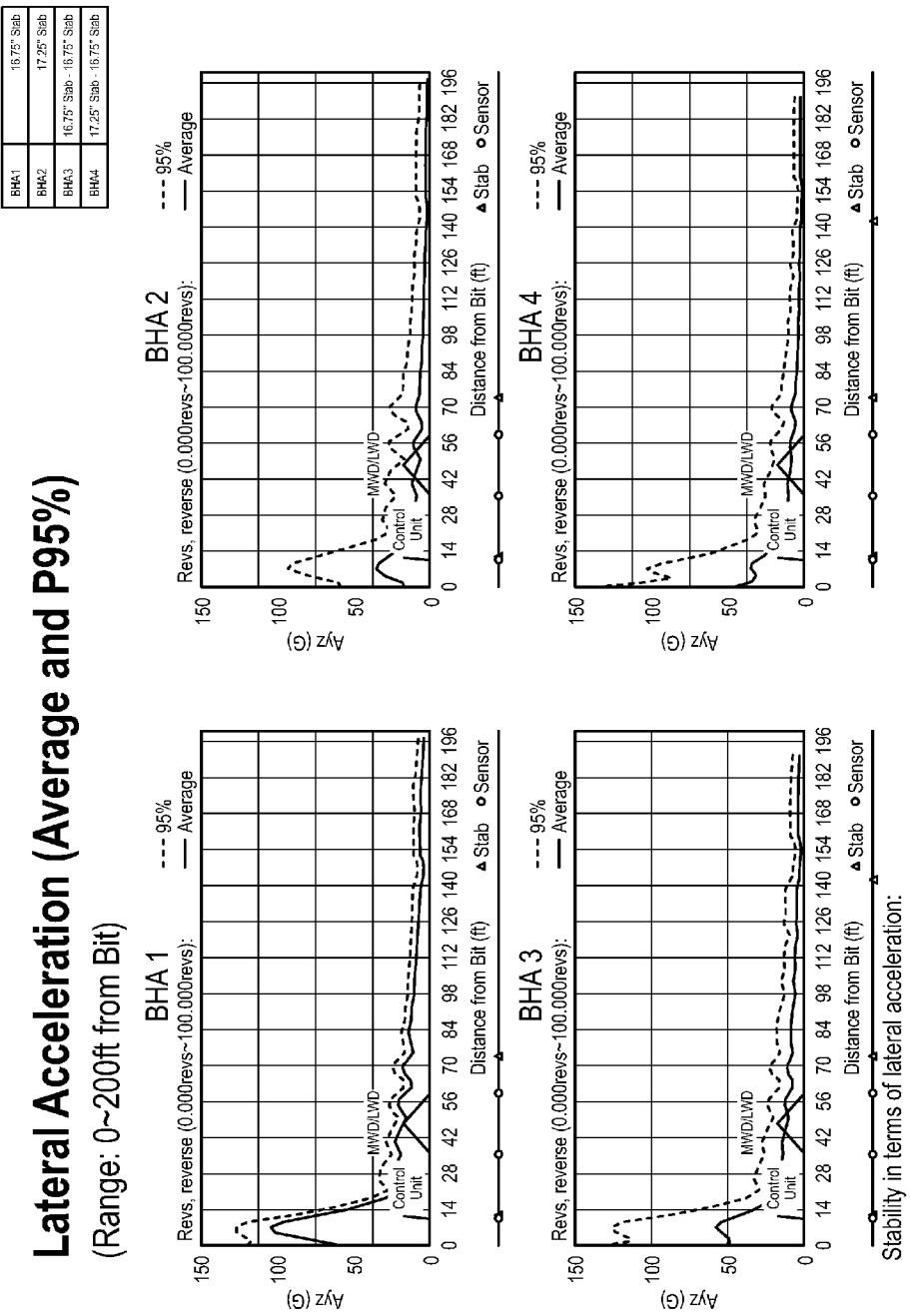

FIG. 14E illustrates the lateral acceleration over the length of the drill string (0-200 feet from the bit). As can be seen in FIG. 14E, BHA2 is predicted to have the lowest lateral acceleration at the bit.

Figure 14F:
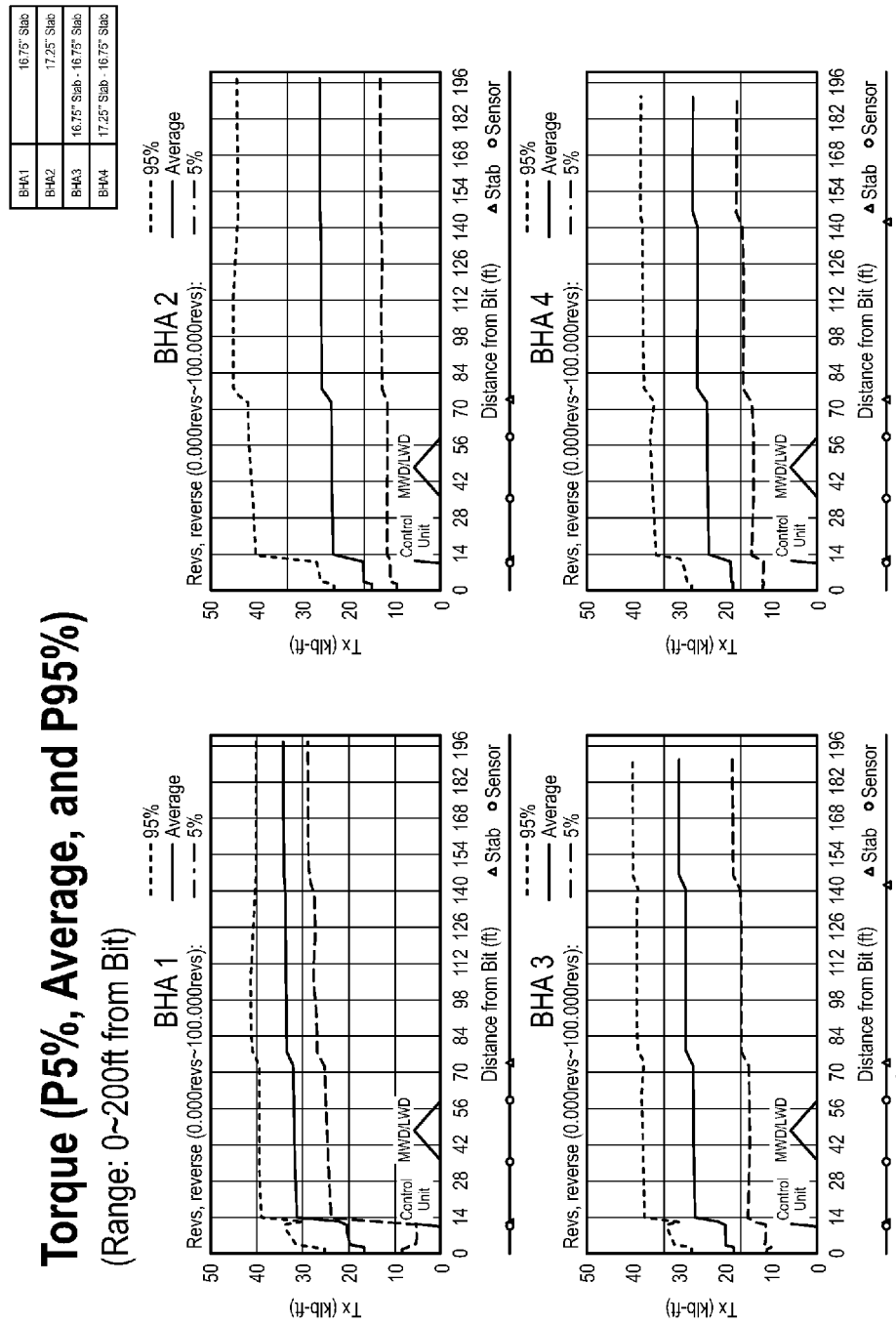

FIG. 14F illustrates the torque over the length of the drill string (0-200 feet from the bit). As shown in FIG. 14F, BHA1 has the highest average torque, while having the smallest torque variation. Average torque and torque variation amplitude both affect fatigue life of components and connections between the components. Lower average torque and lower variation are viewed as preferred (i.e., associated with lower failure rates).

Figure 14G:
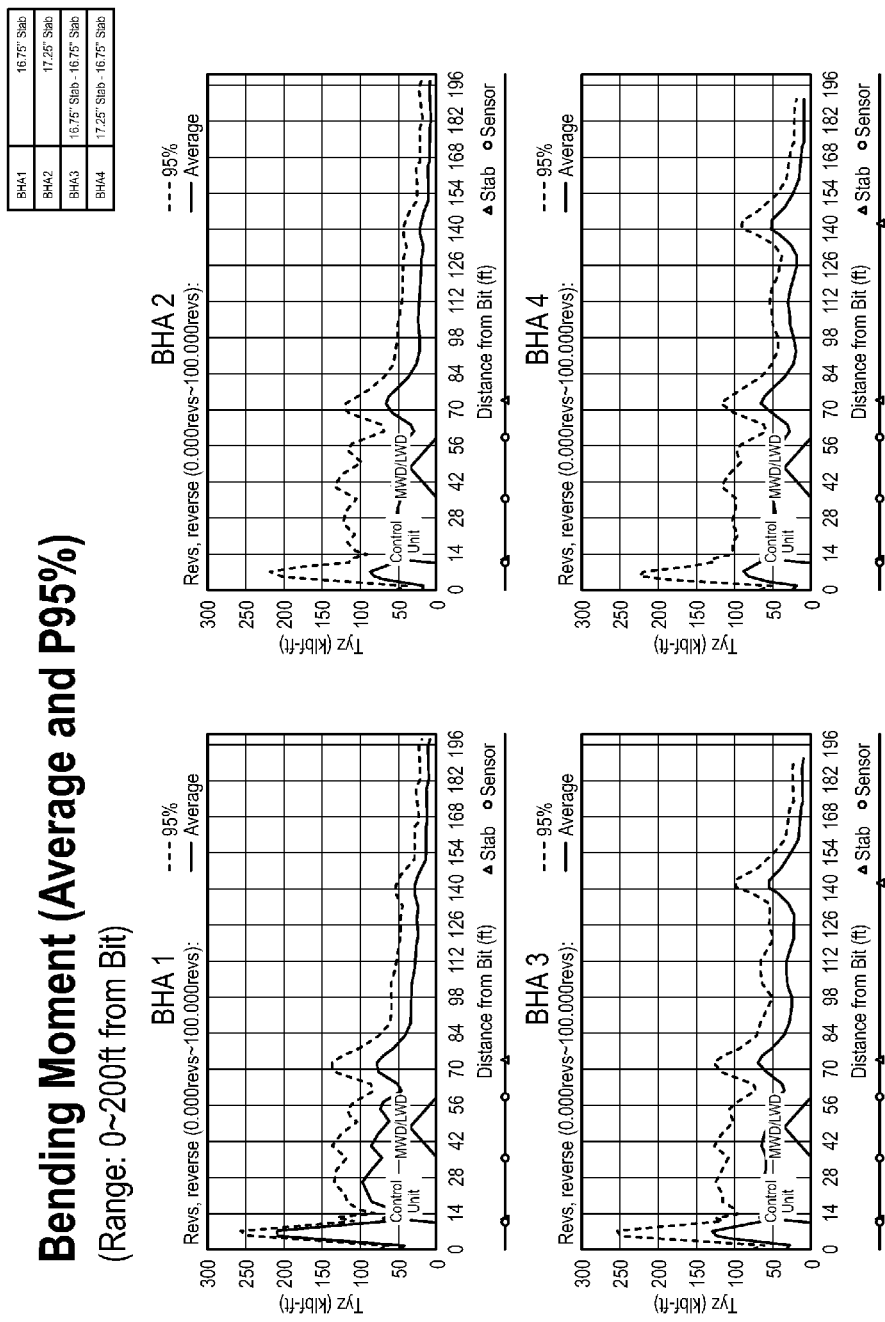

FIG. 14G illustrates the bending moment along the length of the drill string (0-200 feet from the bit). As shown in FIG. 14G, BHA2 is predicted to have the lowest bending moment, although all of the BHA's show relatively high bending moment between the bit and the first stab, which is an indicator that bit whirl may occur.

Figure 14H:
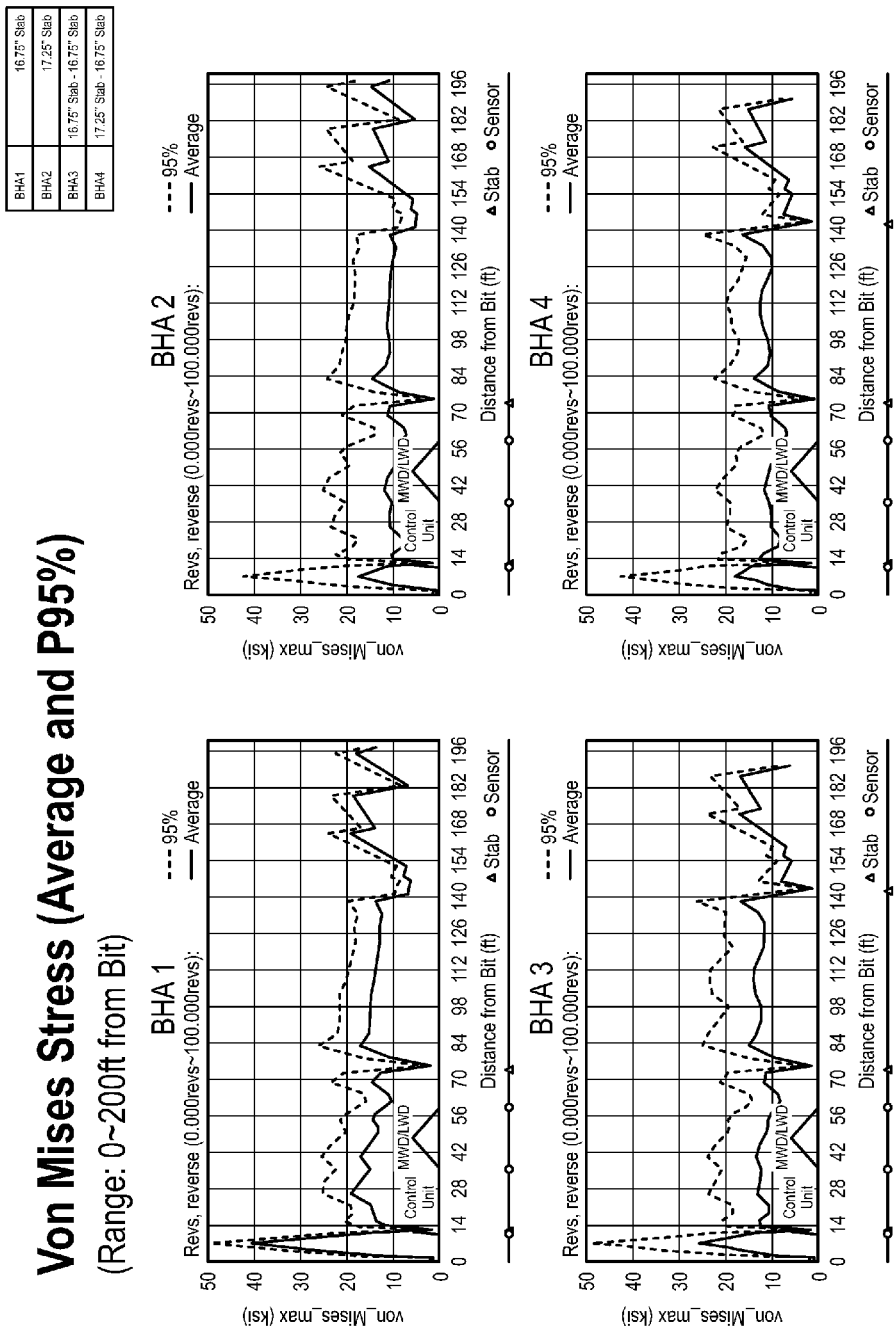

FIG. 14H illustrates the Von Mises stress along the length of the drill string (0-200 feet from the bit). As shown in FIG. 14H, BHA2 is predicted to have the lowest stress amongst the BHA packages, while BHA1 is predicted to have the highest stresses.

Figure 14I:
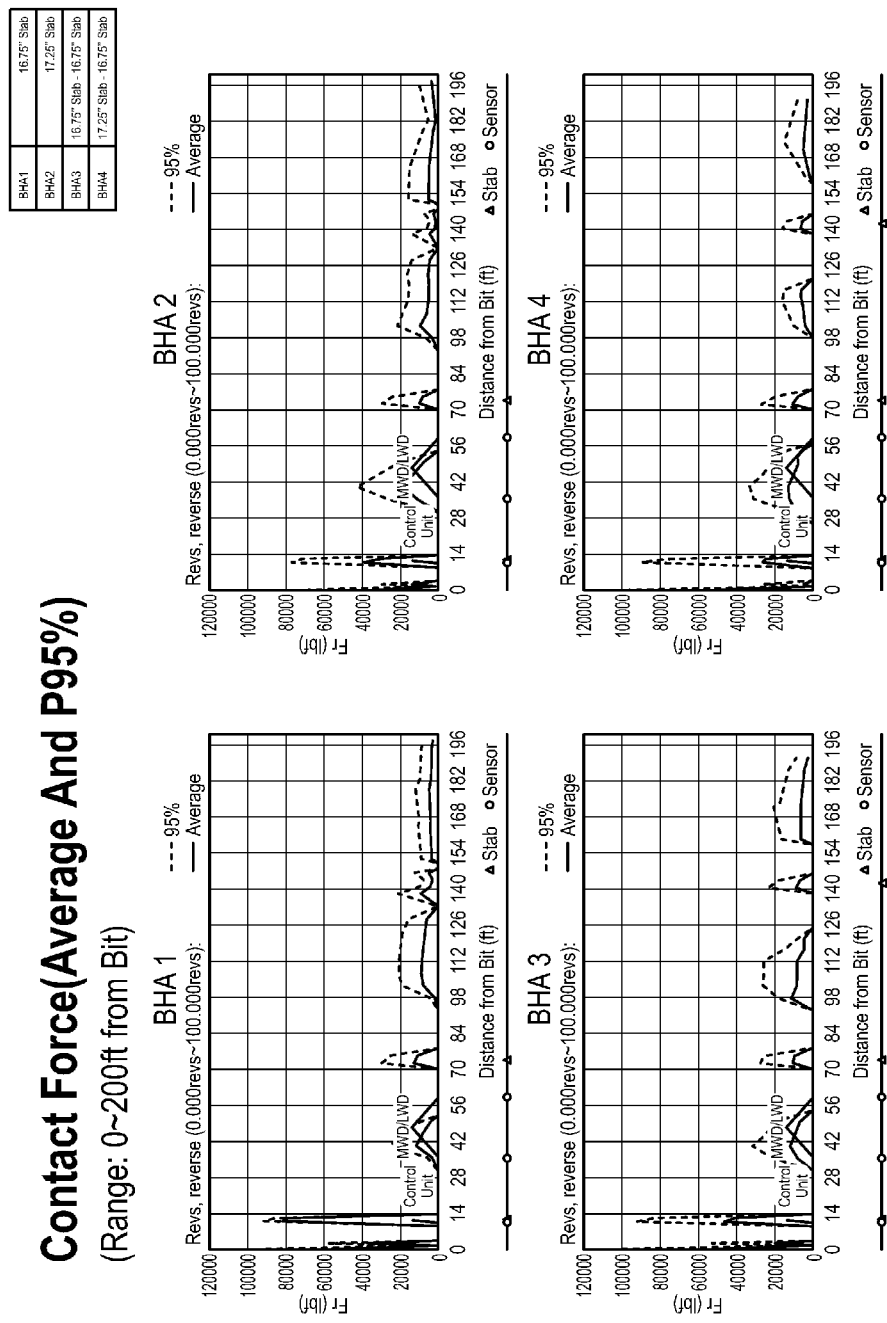

FIG. 14I illustrates the contact force along the length of the drill string (0-200 feet from the bit). As shown in FIG. 14I, BHA1 is predicted to have the highest contact force amongst the BHA packages.

Figure 14J:
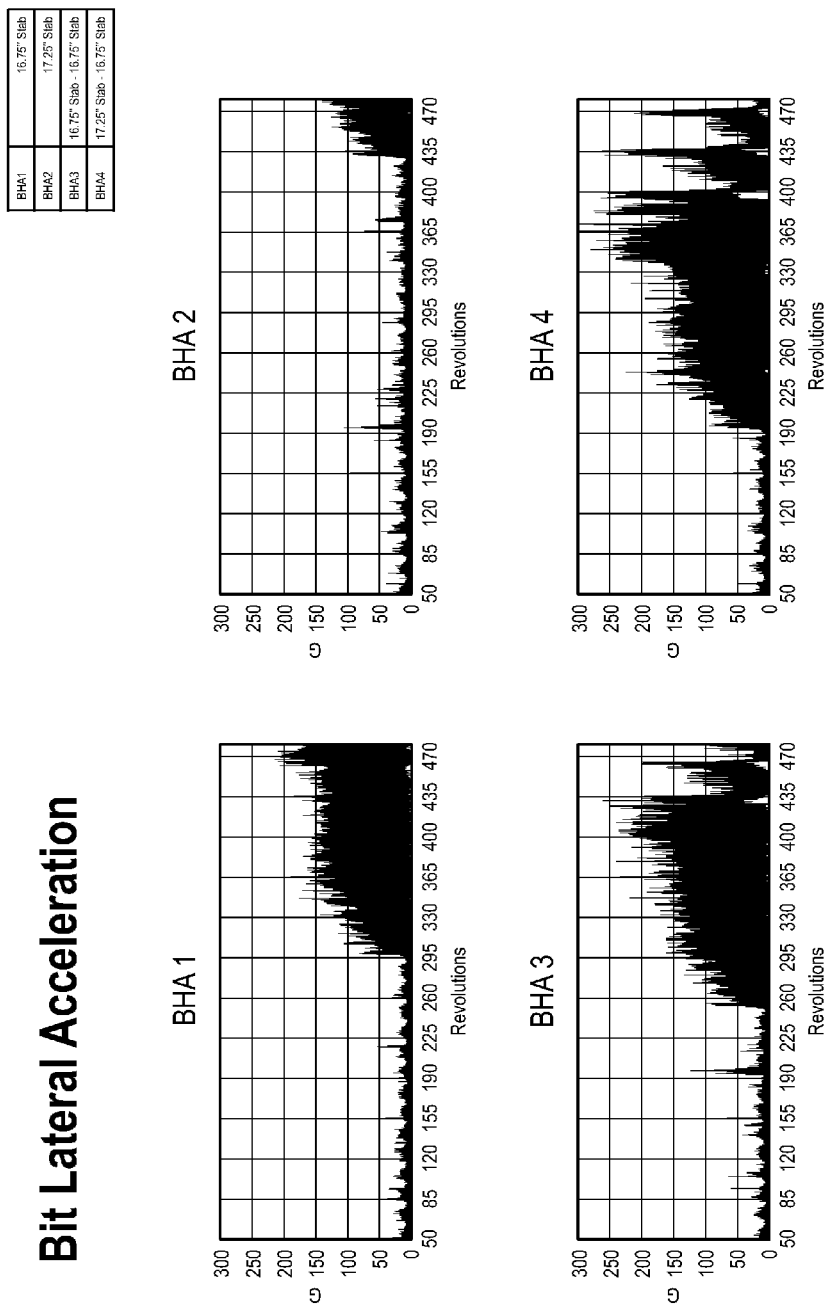

FIG. 14J illustrates the bit lateral acceleration as a function of bit revolutions. As shown in FIG. 14J, all of the BHA packages are predicted to enter into a whirling state, which leads to a dramatic rise in bit lateral acceleration, although BHA2 goes the most number of rotations prior to entering into a whirl state. Whirl is a dynamic motion caused by excitation, wellbore contact and friction, and needs a gap between the component and the wellbore. For this setup, eccentric force is one of the major excitation.

Figure 14K:
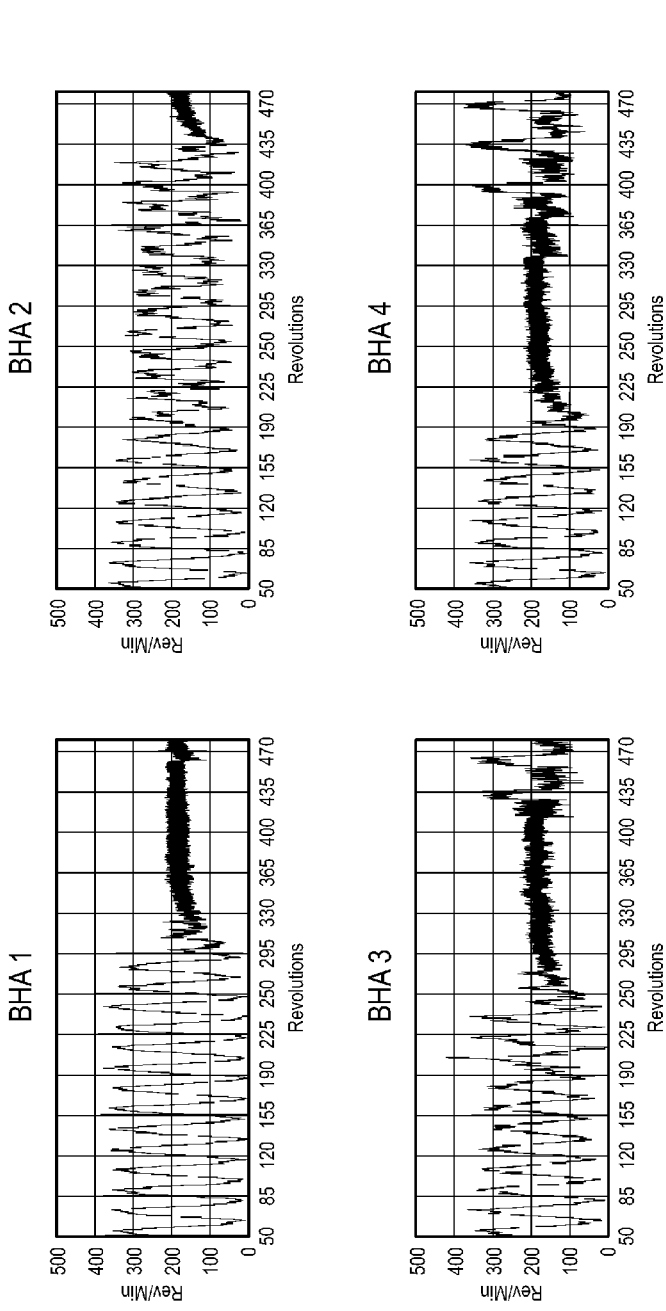

FIG. 14K illustrates the bit RPM's as a function of bit revolutions. This is the response of the system with the analyzed conditions. Initially, the BHA and bit has torsional oscillation. The RPM varies up and down. Then the system changes its motion. RPM variation is reduced, but the BHA and bit have more lateral vibration.

Figure 14L:
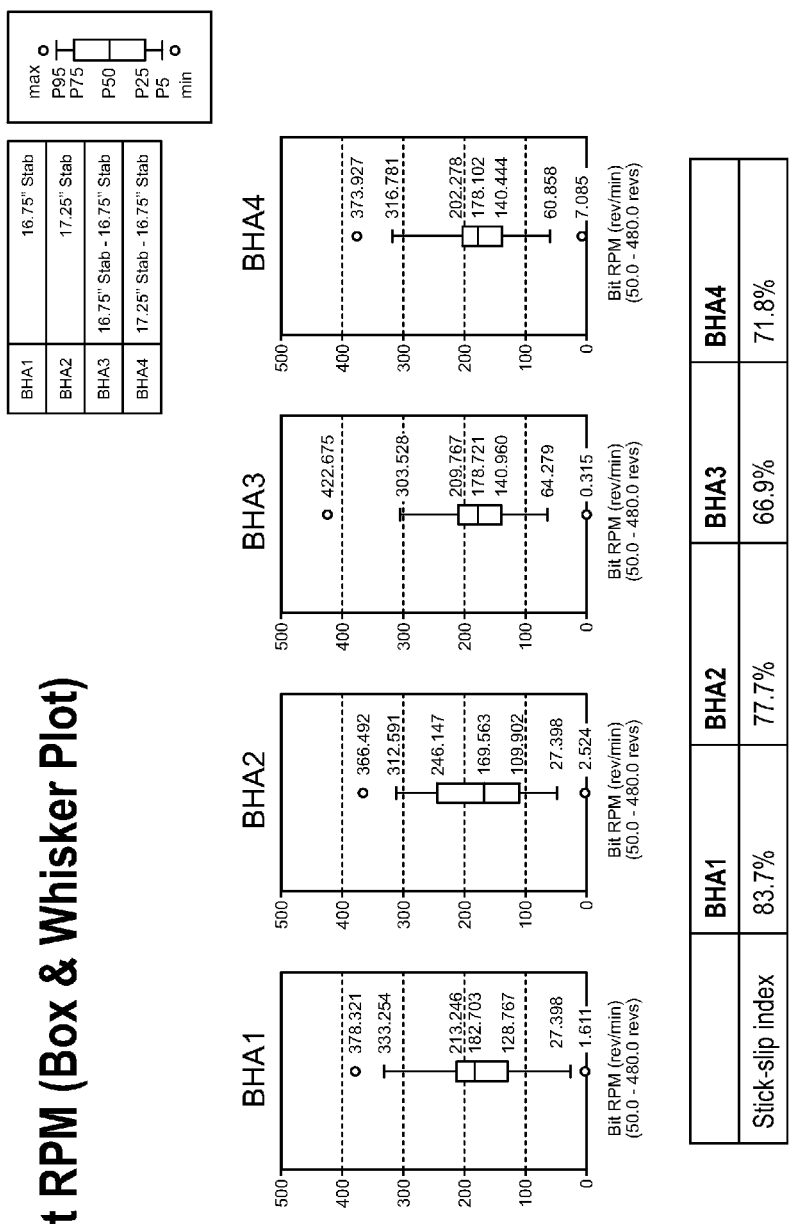

FIG. 14L is a Box and Whisker plot of the data of FIG. 14K. As with similar other figures, the Box and Whisker plot is used to create a stick-slip index. BHA3 is predicted to have the lowest stick-slip.

Figure 14M:
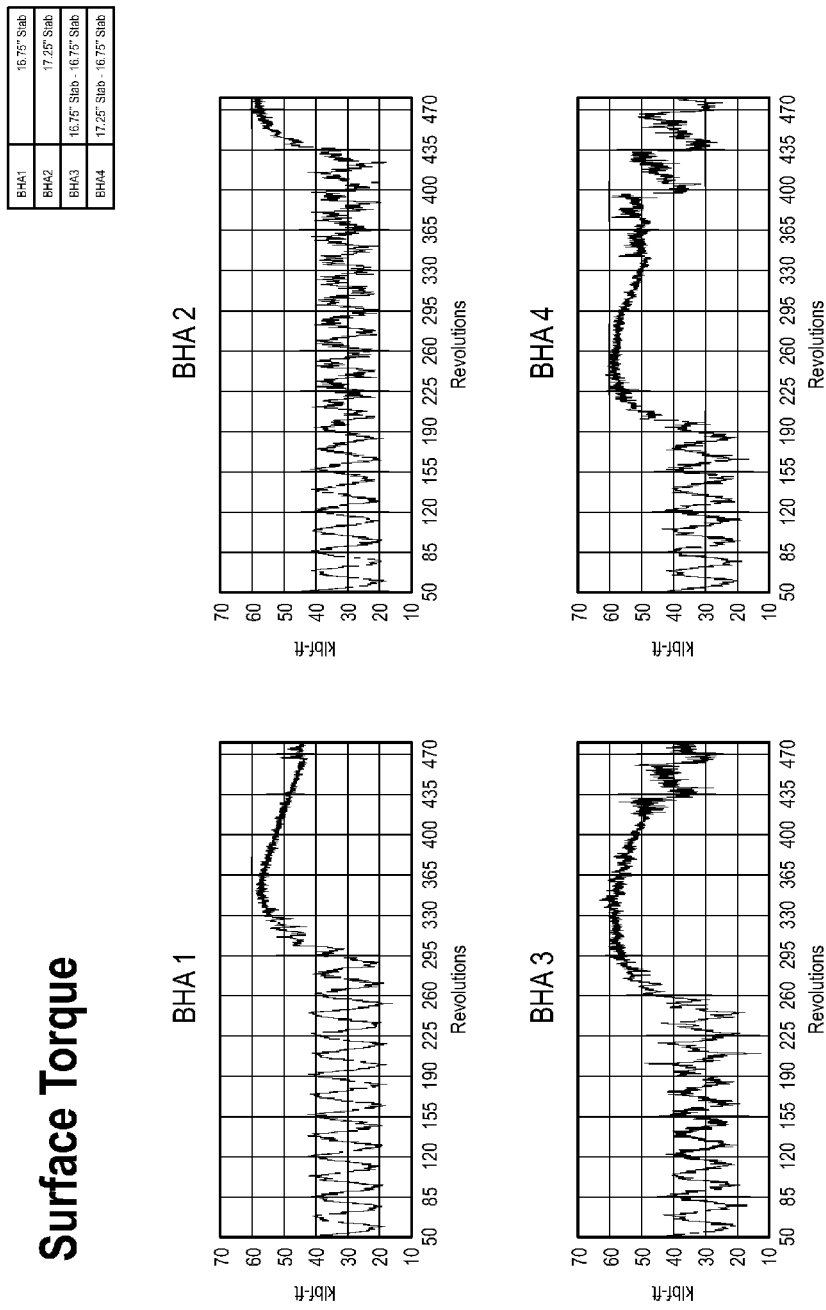

FIG. 14M is a plot of the surface torque as a function of bit revolutions. In FIG. 14M, the surface torque increases dramatically as the drilling becomes laterally unstable (i.e., once bit whirl begins).

FIG. 15 and the associated figures show the result of simulating the four BHA packages in simulation scenario 8, which predicts the performance of the packages in directional drilling applications.

Figure 15A:
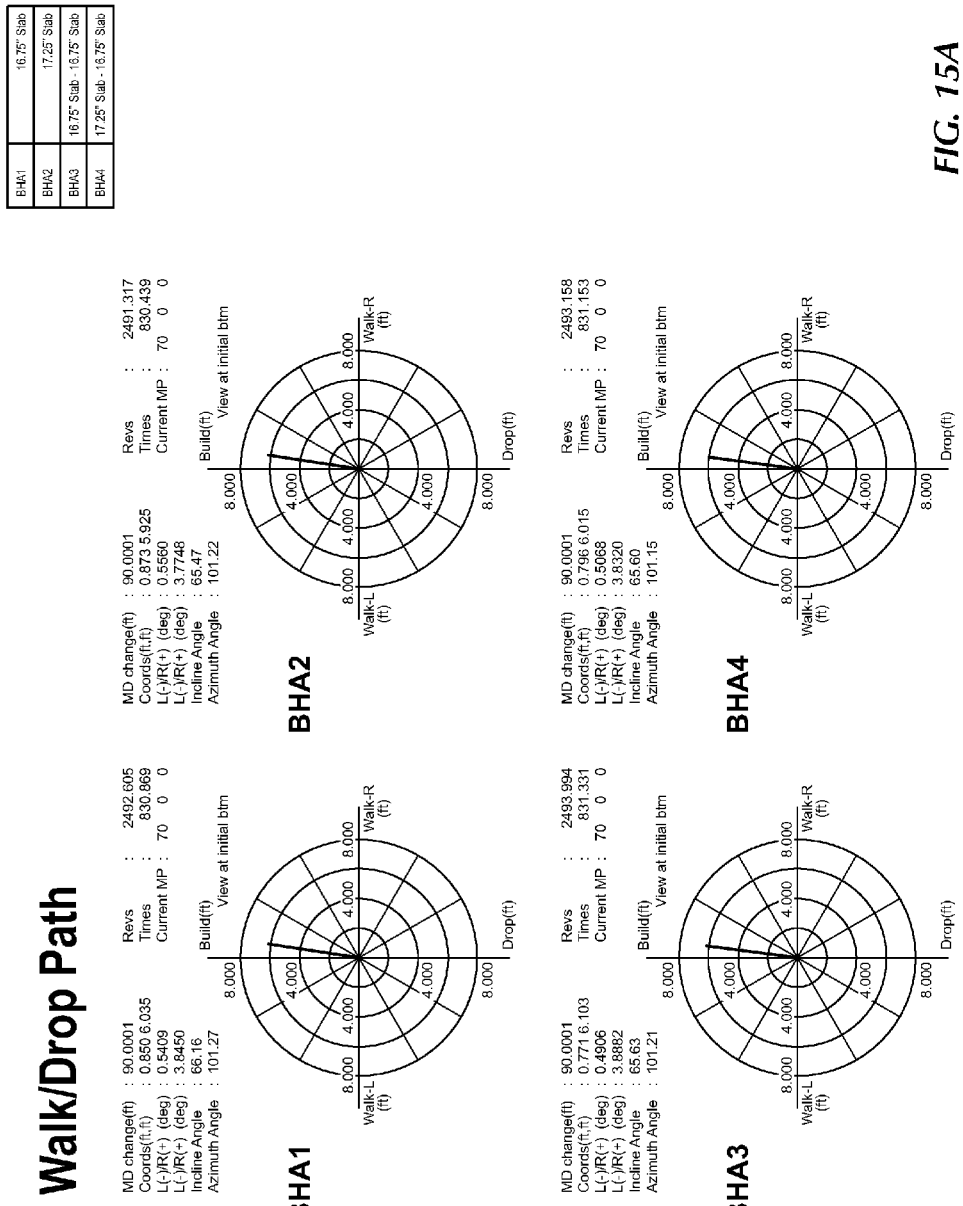

FIG. 15A shows the bit walk/drop path behavior for each of the four BHA packages. Outputs include the inclination angle and the azimuthal angle. All of the BHA's are shown has having similar bit walk tendencies.

Figure 15B:
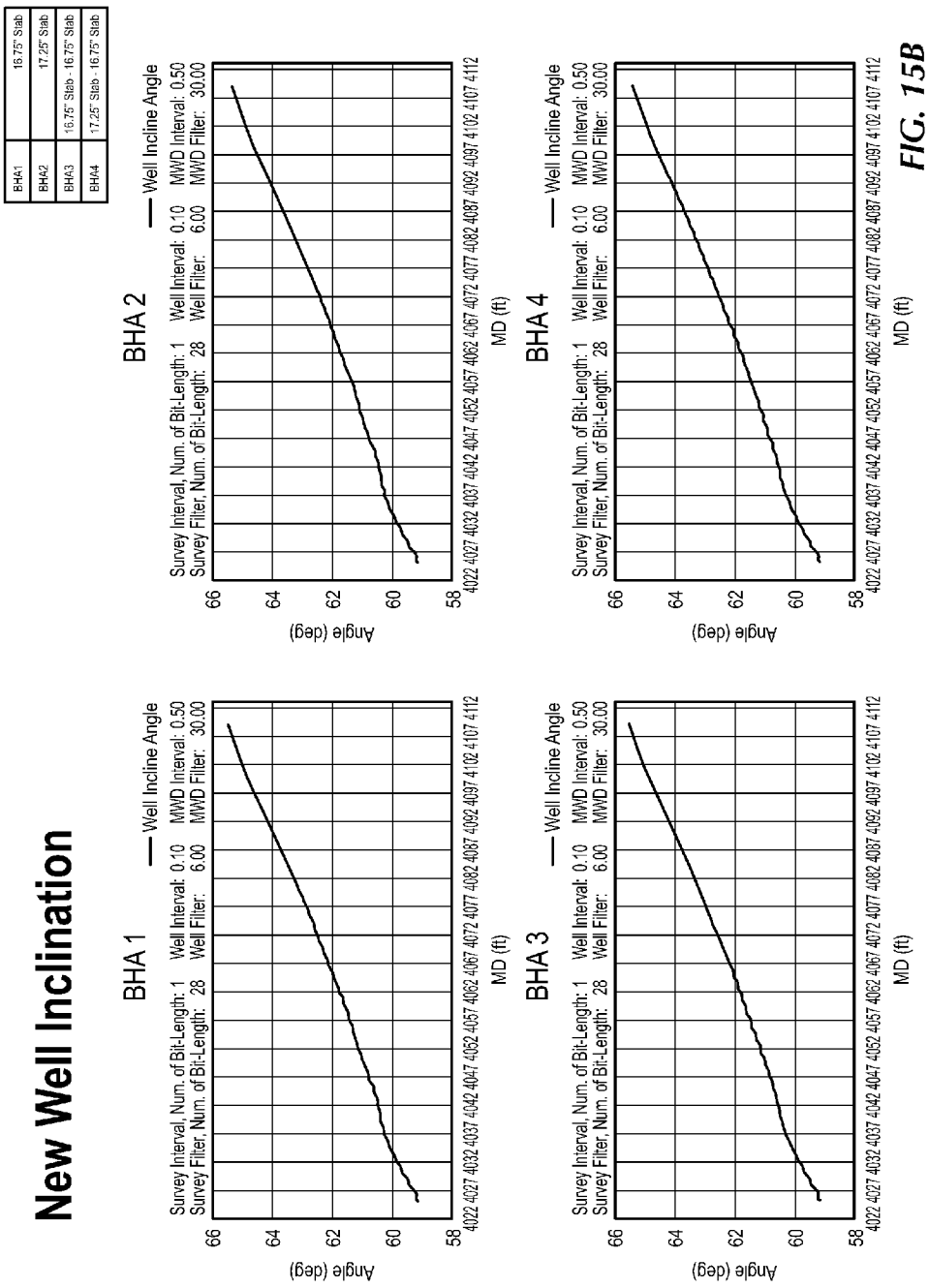

FIG. 15B shows the well inclination measured as a function of degrees versus the measured depth (MD). All of the BHA's show similar well inclinations.

FIG. 15C shows the well azimuth measured as a function of degrees versus the measured depth. Again, all of the BHA's show similar well azimuth.

Figure 15D:
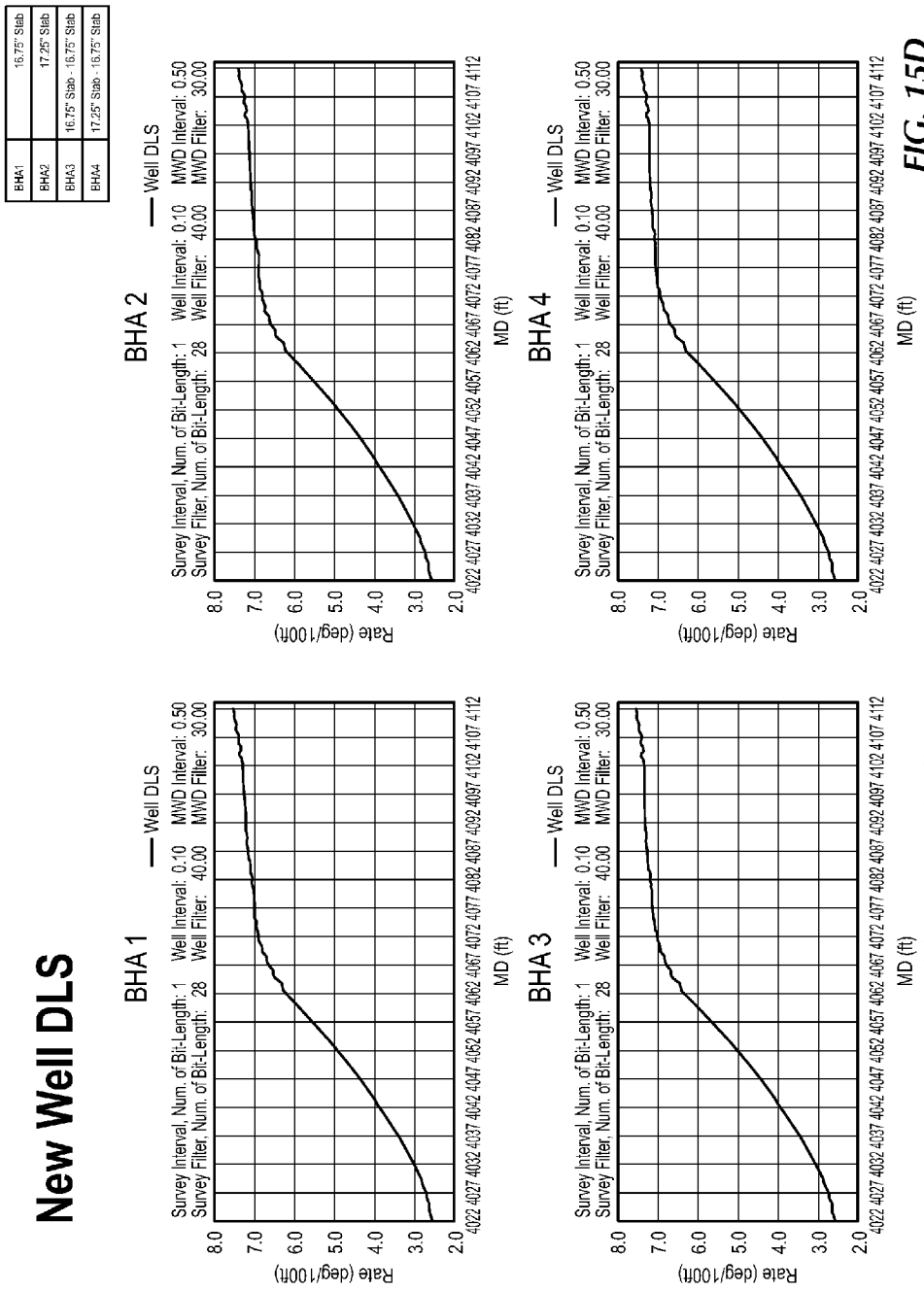

FIG. 15D shows the dogleg severity of the well, measured as a function of the rate (degrees per 100 ft) versus measured depth. All of the BHA's show approximately the same (roughly 7.5 degrees/100 ft) dogleg severity.

Figure 18:
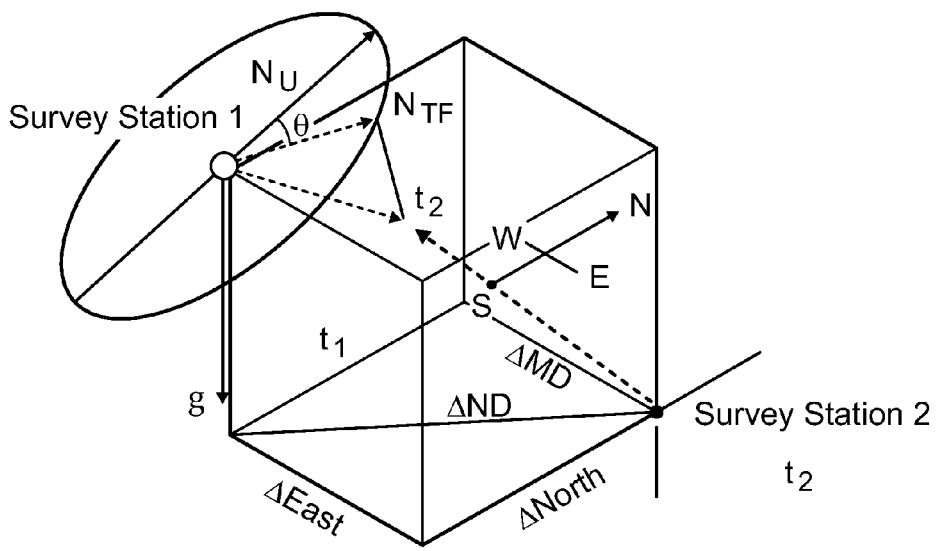
FIG. 18 shows how a tool face angle may be calculated in accordance with an embodiment of the present disclosure.

FIG. 15E shows the tool face angle, measured as a function of degrees versus measured depth. BHA1 and BHA2 show a higher tool face angle as compared to BHA3 and BHA4. A figure, depicting the well tool face angle is provided as FIG. 18.

FIG. 15F shows the build up rate, measured as a function of rate (degrees per 100 ft) versus measured depth. BHA1 and BHA3 show a slightly higher build up rate, which is due to the presence of a smaller stab (16.75" in BHA1 and BHA3 as compared to 17.25" in BHA2 and BHA4).

Figure 15G:
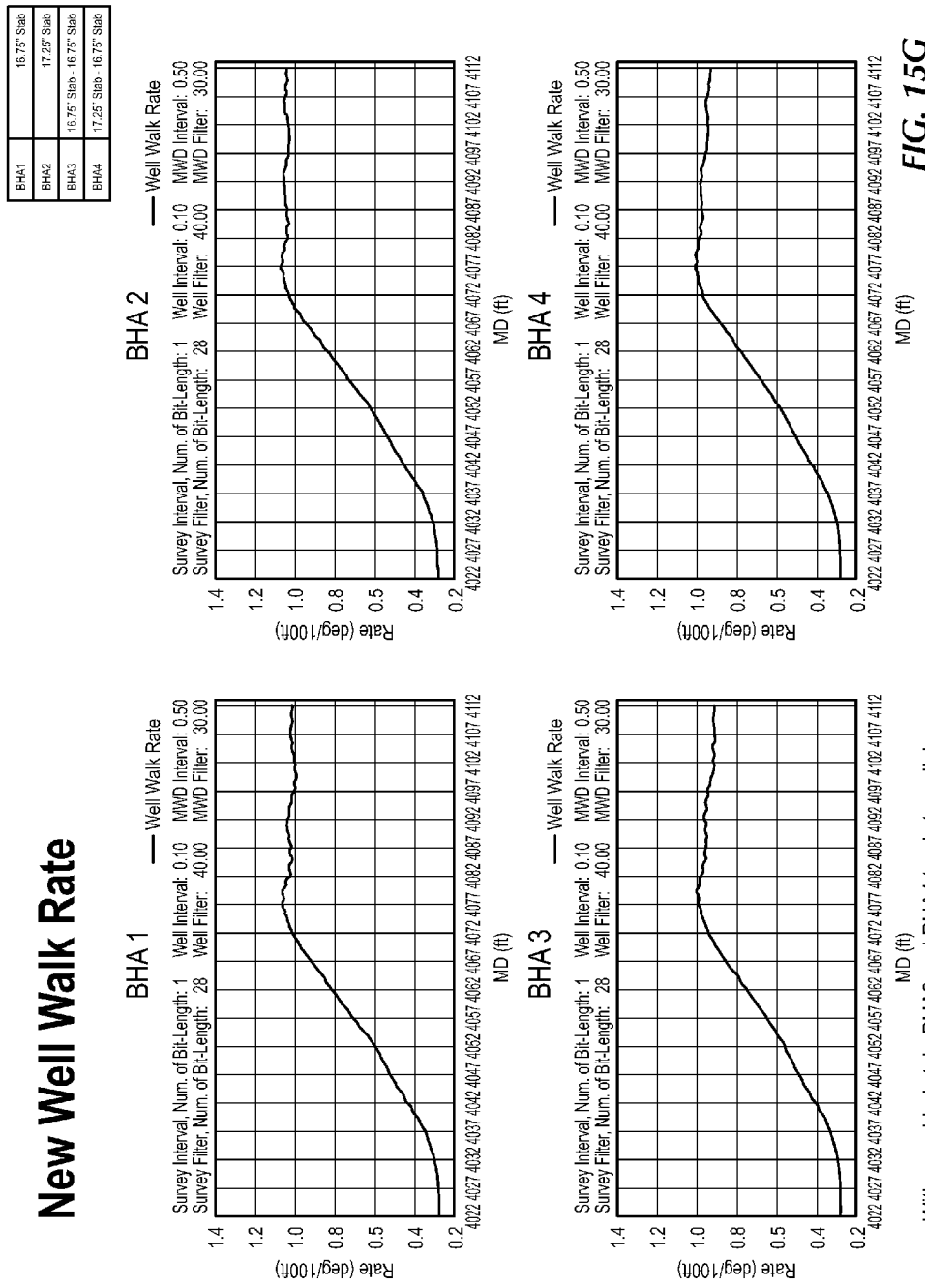

FIG. 15G shows the walk rate, measured as a function of rate (degrees per 100 feet) versus measured depth. BHA3 and BHA4, which possess a second stab tend to walk slightly less than BHA1 and BHA2.

By reviewing these plots, the BHA designer can select the appropriate BHA system depending on the desired application. For example, if BHA eccentricity or high well friction is expected, BHA2 would likely be selected. If for example, high sensor measurement quality is desired, BHA2 is also preferred. For directional drilling applications, BHA3 and BHA4, which have a higher build up rate and a slightly lower walk tendency, without increasing the dogleg severity, would be preferred. BHA1 and BHA2 tend to show the best stability and durability across all simulation scenarios.

Visual outputs that may be used in the present disclosure, in addition to those shown an described above, include any output shown or described in any of U.S. patent application Ser. No. 09/524,088 (now U.S. Pat. No. 6,516,293), Ser. No. 09/635,116 (now U.S. Pat. No. 6,873,947), Ser. Nos. 10/749,019, 09/689,299 (now U.S. Pat. No. 6,785,641), Ser. Nos. 10/852,574, 10/851,677, 10/888,358, 10/888,446, all of which are expressly incorporated by reference in their entirety.

Embodiments of the present disclosure, therefore, allow a BHA designer to compare and contrast performance characteristics of the BHA under various drilling scenarios. A different drilling scenario, as used herein, means that for a given BHA, a simulation is run under one of the seven drilling simulation scenarios discussed above (i.e., not a "normal" drilling condition). The performance of a given BHA may be run through all eight scenarios in certain embodiments, but in other embodiments, only a subset of the eight scenarios will be simulated. The above identified scenarios provide a suitable selection of drilling processes to allow a BHA designer to make an informed judgment as to the likely performance of a given BHA design.

In selected embodiments, the present disclosure allows a BHA designer to investigate the performance of multiple BHA's having a dynamic input. A dynamic input is an input that varies during the course of a simulation. For example, the RPM may be varied with the bit either drilling or not drilling, to determine a critical speed to be avoided during drilling. Similarly, the weight on bit may be varied over the course of the simulation from 0 to a selected value, or between two higher values. Similarly, the rate of penetration of the BHA may be entered as a dynamic input, and allowed to change over the course of the simulation. By having a dynamic input, selected embodiments of the present disclosure may allow a BHA designer to suggest operating parameters to be avoided, or to be used by a driller when actually drilling a well.

In selected embodiments, the present disclosure allows a BHA designer to review the performance of the BHA as a function of location along the BHA. By providing outputs that show performance as a function of length, the BHA designer can get information indicative of locations with high stress, high vibration, high accelerations, or other deleterious effects. The BHA designer can then add, remove, or move components on the BHA to improve, modify, or remove these deleterious effects. In addition, information about sensor performance can be predicted based on the outputs at at the sensor location. By allowing a designer to review locational information, the overall performance of the BHA may be improved.

Thus, by employing various drilling scenarios, a BHA designer can select the appropriate BHA package for a selected optimizing criteria, such as stability, durability, robustness, or measurement quality. If none of the packages have suitable performance, a designer may modify the location of certain pieces of the BHA package (as listed above), or add or remove pieces of the BHA package. Advantageously, therefore, selected embodiments provide for a method by which various BHA packages can be simulated and their performance predicted, prior to drilling a well. Given an optimizing criteria, multiple BHA packages can be quickly assessed to determine an optimal BHA package for a drilling application.

Figure 16:
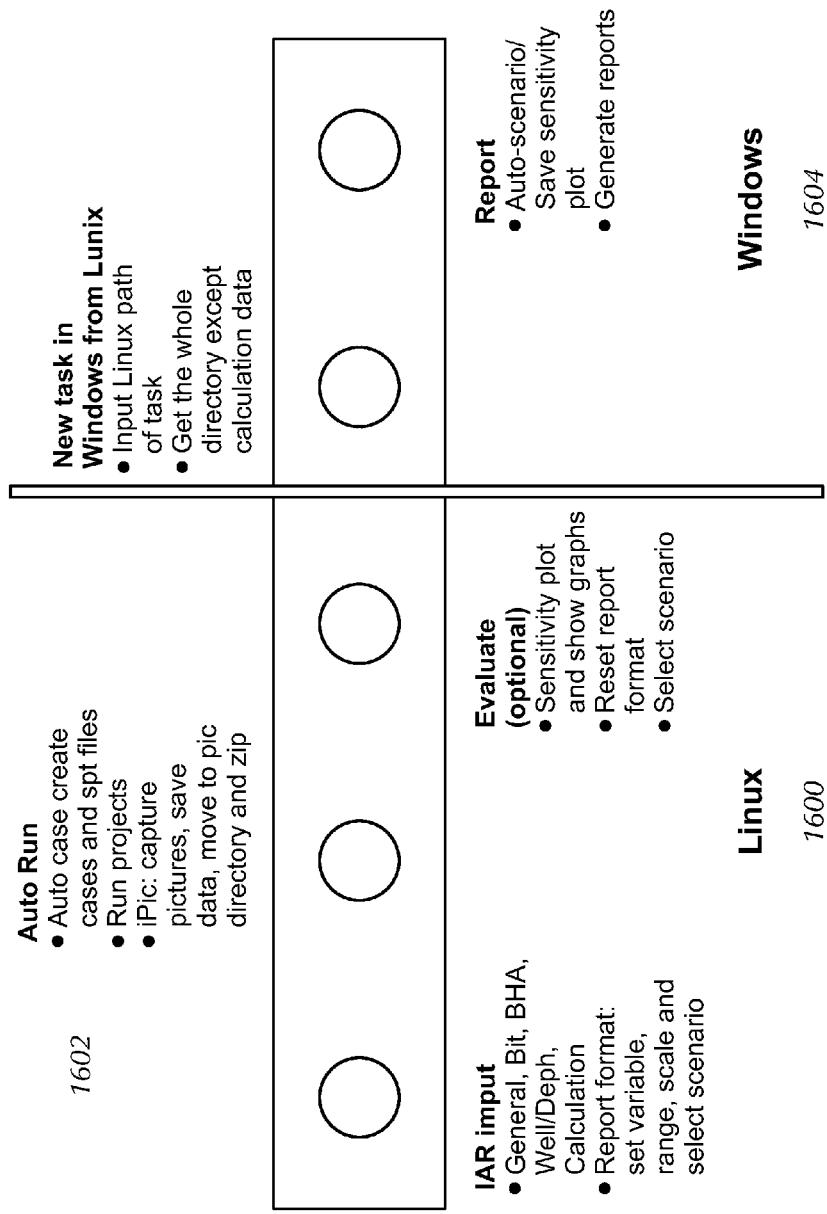
FIG. 16 shows an automated process for use with an embodiment of the present disclosure.

Because there are eight different scenarios in this embodiment, which are important to the BHA designer, in the interest of reducing time, the process may be automated. FIG. 16 illustrates a method for automating the analysis/recommendation process described above. Specifically, at step 1600 data is input into the system, along with setting a report format, and identifying a simulation scenario. At step 1602, a simulation scenario is run, generating data for each of the BHA designs input at step 1600. At step 1604, the data is output in a report that includes graphical displays along with a recommendation of BHA package.

Figure 19:
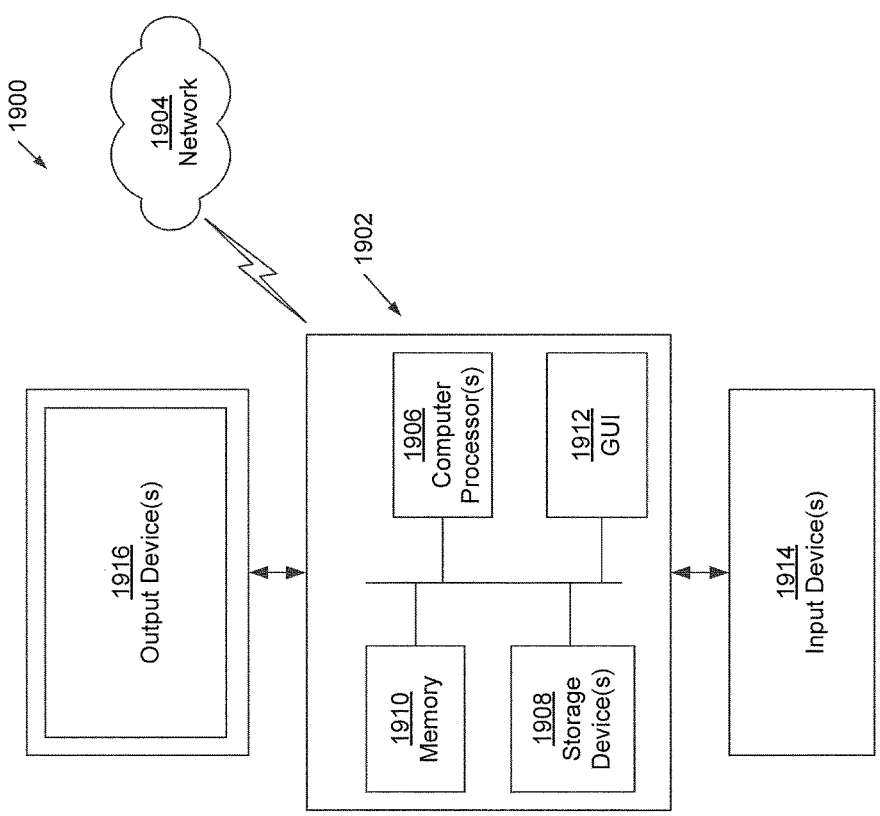
FIG. 19 depicts a system with which one or more embodiments of the present disclosure may be implemented.

FIG. 19 depicts a system with which one or more embodiments of the present disclosure may be implemented. In one or more embodiments, one or more of the modules and elements shown in FIG. 19 may be omitted, repeated, and/or substituted. Accordingly, embodiments of selecting a BHA, designing a BHA, or optimizing a BHA should not be considered limited to the specific arrangements of modules shown in FIG. 19.

In one or more embodiments, a BHA may be selected, designed, or optimized. Referring to FIG. 19, a system 1900 includes a computing device 1902 having one or more computing processors 1906, one or more storage devices 1908 (e.g., a hard disk, an optical drive such as a compact disk (CD) drive or digital versatile disk (DVD) drive, a flash memory stick, etc.), memory 1910 (e.g., random access memory (RAM), cache memory, flash memory, etc.), and a graphical user interface (GUI) 1912. The computing processor(s) 1906 may be an integrated circuit for processing instructions. For example, the computing processor(s) may be one or more cores, or micro-cores of a processor. The storage device(s) 1908 (and/or any information stored therein) may be a data store such as a database, a file system, one or more data structures (e.g., arrays, link lists, tables, hierarchical data structures, etc.) configured in a memory, an extensible markup language (XML) file, any other suitable medium for storing data, or any suitable combination thereof. The storage device(s) 1908 may be a device internal to the computing device 1902. Alternatively, the storage device(s) 1908 may be an external storage device operatively connected to the computing device 1902. Additionally, the computing device 1902 may include numerous other elements and functionalities.

The computing device 1902 may be communicatively coupled to a network 1904 (e.g., a local area network (LAN), a wide area network (WAN) such as the Internet, mobile network, or any other type of network) through wires, cables, fibers, optical connectors, a wireless connection, or a network interface connection (not shown).

The system 1900 may also include one or more input device(s) 1914, such as a touchscreen, keyboard, mouse, microphone, touchpad, electronic pen, or any other type of input device. Further, the system 1900 may include one or more output device(s) 1916, such as a screen (e.g., a liquid crystal display (LCD), a plasma display, touchscreen, cathode ray tube (CRT) monitor, projector, 2D display, 3D display, or other display device), a printer, external storage, or any other output device. One or more of the output device(s) 1916 may be the same or different from the input device(s). The input and output device(s) may be locally or remotely (e.g., via the network 1904) connected to the computer processor(s) 1906, memory 1910, storage device(s) 1908, and GUI 1912. Many different types of systems exist, and the aforementioned input and output device(s) may take other forms.

Further, one or more elements of the aforementioned system 1900 may be located at a remote location and connected to the other elements over a network 504. Further, embodiments of the disclosure may be implemented on a distributed system having a plurality of nodes, where each portion of the disclosure may be located on a different node within the distributed system. In one embodiment of the disclosure, the node corresponds to a distinct computing device. Alternatively, the node may correspond to a computer processor with associated physical memory. The node may alternatively correspond to a computer processor or micro-core of a computer processor with shared memory and/or resources.

The GUI 1912 may operated by a user (e.g., an engineer, a designer, an operator, an employee, or any other party) using one or more input devices 1914 and the GUI 1912 may be visualized one or more output devices 1916 coupled to the computing device 1902. The GUI 1912 may include one or more buttons (e.g., radio buttons), data fields (e.g., input fields), banners, menus (e.g., user input menus), boxes (e.g., input or output text boxes), tables (e.g., data summary tables), sections (e.g., informational sections or sections capable of minimizing/maximizing), screens (e.g., welcome screen or home screen), and/or user selection menus (e.g., drop down menus). In addition, the GUI 1912 may include one or more separate interfaces and may be usable in a web browser or as a standalone application.

Although the output device(s) 1916 is shown as being communicatively coupled to the computing device 1902, the output device(s) 1916 may also be a component of the computing device 1902.

In FIG. 19, the computing device 1902 is capable of simulating a BHA. The BHA to be simulated may be selected, by a user, from a pre-existing library of BHAs (not shown) or a BHA may be customized and/or modified, by the user, using the GUI 1912 of the computing device 1902. The user may customize the BHA by inputting or selecting a variety of drilling components (e.g., type of drill, number of cutters, material properties of the drill, or any other BHA or bit parameter known in the art or disclosed herein).

Additionally, the simulation may be customized by inputting or selecting a variety of well bore parameters and drilling operating parameters. To modify the BHA and/or customize the BHA or simulation, the user may access storage devices(s) 1908 using any input means known in the art (e.g., input device(s) 1914). The storage device(s) 1908 is capable of having data stored thereon and may include, for example, rock profiles, BHA parameters and components, and/or drilling operating parameter, among many others. Once the user customizes the BHA and other simulation parameters, the computing device 1902 may execute instructions on the computing processor(s) 1906 to perform a simulation based on the customized BHA and the parameters selected or input by the user.

In addition, the BHA may be selected for simulation or modified based on data input or selected by the user. The user may also modify a BHA based on particular drilling operating parameters, wellbore parameters, or any other conditions known in the art or disclosed herein. For example, a user may determine a preferred WOB or ROP and may modify the BHA accordingly taking into account the preferred WOB and/or ROP, among others using the GUI 1912.

Once the user customizes the BHA and other simulation parameters, the computing device 1902 may execute instructions on the computing processor(s) 1906 to perform a simulation based on the customized BHA and the parameters selected or input by the user. The drilling simulation may be performed using one or more of the methods set forth above. Executing the simulation generates a set of performance data. In some cases, the set of performance data generated may depend on the data selected or input by the user and may include instructions to generate specific performance data, as mentioned above. In other embodiments, performance criteria may be selected and/or generated by the executed simulation. Performance criteria may include one or more of stability, robustness, measurement quality, and steerability of the BHA package for example. Those of ordinary skill would appreciate that other performance criteria may be selected and/or generated.

After simulation, stability, robustness, measurement quality, and steerability or other performance factors may then be visualized by the GUI 1912 on the output device(s) 1916. In one embodiment, the visual outputs may include tabular data of one or more performance parameters. Additionally, the outputs may be in the form of graphs and may be represented as percentages or ratios. A graphical visualization of the borehole, drill bit, blades, and/or cutters may be output. The graphical visualization (e.g., 2-D, 3-D, or 4-D) may include a color scheme.

Once presented with the performance factors, the user may modify at least one BHA parameter, wellbore parameter, and/or drilling operating parameter. Modification may involve selecting a parameter from pre-existing values or inputting the parameter to obtain a modified BHA, wellbore, and/or drilling operation. The pre-existing values may depend on manufacturing capabilities or geometries of the components of the BHA and may depend on a given performance criteria. For example, a user may select one or more parameters to optimize or fall within a threshold of a selected criteria or desired performance.

After modification, a second simulation may be executed by the computing device 1902. The second simulation may include the modified parameter to be simulated. The simulation may be executed by the computing device 1902 using the processor(s) 1906 to generate a second set of performance data. The drilling simulation may be performed using one or more of the methods set forth above. Once generated, the initial set of data along with the second set of data may be presented using GUI 1912 and output device(s) 1916. The sets of data may be presented to the user for comparison and may be presented separately or combined. The sets of data may be presented or visualized using any tools known in the art, such as, for example, plots, graphs, charts, and logs.

Additionally, a second simulation may occur simultaneously with the first simulation. For example, an engineer may select a number of BHAs to operate in particular wellbore and drilling operating conditions. The engineer may then run a simulation of the number of BHAs in order to compare one BHA to another.

During implementation, data may be acquired and/or measured in the field. The obtained data may then be used to compare to one or more field acquired/measured parameters to one or more parameters generated by simulation. Additionally, obtained data may be used as input to a simulation, such that one or more performance parameters may be generated by simulations based on the obtained data. Thereafter, modifications to input parameters such as, for example, BHA or drilling operating parameters, may be made in order to optimize a BHA package.

Although only a few example embodiments have been described in detail above, those skilled in the art will readily appreciate that many modifications are possible in the example embodiments without materially departing from this disclosure. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed:

1. A system for selecting a bottomhole assembly (BHA), comprising:
    a computing device comprising a computing processor executing instructions to perform, prior to drilling:
        executing a first simulation of a first BHA that includes at least a drill bit, a measurement sensor, and a stabilizer, the first simulation generating a first set of performance data that includes at least a predicted measurement quality of the measurement sensor as a function of reproduceability, and
    the computing device comprising a graphical user interface executing on the computer processor with functionality to perform, prior to drilling:
        inputting a selected drilling criteria, the selected drilling criteria including at least a measurement quality criteria for the measurement sensor,
        presenting, on the graphical user interface, the first set of performance data from the first simulation, and
        selecting a BHA based on a comparison of the first set of performance data and the selected drilling criteria, the comparison including a comparison of the measurement quality criteria of the measurement sensor to the predicted measurement quality of the measurement sensor.

2. The system of claim 1, wherein generating the first set of performance data includes generating the predicted measurement quality as a function of at least one of a collar deflection angle and a lateral displacement at the measurement sensor location.

3. The system of claim 1, wherein the computing device further comprises the computing processor executing instructions to perform:
    executing a second simulation of a second BHA that includes at least one drill bit, a measurement sensor, and a stabilizer, the second simulation generating a second set of performance data, and
    wherein the computing device further comprises the graphical user interface executing on the computer processor with functionality to perform:
        modifying, based on the first set of performance data, at least one parameter selected from the group consisting of BHA parameters, wellbore parameters, and the drilling operating parameters, wherein modifying involves changing a value of the at least one parameter to obtain a modified parameter,
        presenting, on the graphical user interface, the second set of performance data from the second simulation, the second simulation based on the modified parameter, and selecting a BHA based on the first set of performance data, the second set of performance data, and the selected drilling criteria.

4. The system of claim 3, wherein presenting further comprises:
    visualizing, on the graphical user interface, at least one selected from the group consisting of the first set of performance data and the second set of performance data.

5. The system of claim 3, wherein the first and second sets of performance data comprise performance results of the first BHA indicative of at least one selected from the group consisting of a steerability of the BHA, stability of the BHA, and robustness of the BHA.

6. The system of claim 5, wherein steerability of the BHA comprises at least one selected from the group consisting of buildup rate and dogleg severity.

7. The system of claim 5, wherein stability of the BHA comprises at least one selected from the group consisting of axial, lateral, and rotational vibrations.

8. The system of claim 5, wherein robustness of the BHA comprises at least one selected from the group consisting of bending moments, torques, axial force, stress, vibrations, contact forces, and buckling.

9. The system of claim 1, wherein generating the first set of performance data includes determining the predicted measurement quality of the measurement sensor based on sag of the BHA at the measurement sensor location.

10. The system of claim 1, wherein generating the first set of performance data includes determining the predicted measurement quality of the measurement sensor based on drill string deformation at the measurement sensor location.

11. The system of claim 1, wherein generating the first set of performance data includes determining the predicted measurement quality of the measurement sensor based on drill string bending at the measurement sensor location.

12. The system of claim 1, wherein generating the first set of performance data includes determining the predicted measurement quality of the measurement sensor based on spacing from magnetic components.

13. The system of claim 1, wherein generating the first set of performance data includes determining the predicted measurement quality of the measurement sensor as a function of nearness to a borehole wall.

14. The system of claim 1, wherein generating the first set of performance data includes determining the predicted measurement quality of the measurement sensor in a static survey condition.

15. The system of claim 1, wherein generating the first set of performance data includes determining the predicted measurement quality of the measurement sensor in a real-time survey condition.

16. The method of claim 1, wherein inputting the selected drilling criteria comprises entering a rate of penetration as a dynamic input that is allowed vary to during at least the first simulation.

17. The method of claim 1, further comprising:
generating a model of the first BHA, wherein executing the first simulation of the first BHA comprises simulating drilling through a model of a subterranean formation using the first model of the first BHA; and
adjusting the model of the first BHA based on the first set of performance data from the first simulation, wherein selecting comprises selecting the first BHA after the adjustment to the model of the first BHA.

18. The method of claim 1, wherein presenting comprises displaying the first set of performance data at least partially as a function of length of the first BHA, wherein selecting comprises receiving an input to add, remove, or move one or more components of the BHA along the length of the BHA.

19. The method of claim 1, whereby the selected BHA is built and used to drill a well through a formation.

20. A system for selecting a bottomhole assembly (BHA), comprising:
a computing device comprising a computing processor executing instructions to perform:
executing a first simulation without drilling of a first BHA that includes at least a drill bit, a measurement sensor, and a stabilizer, the first simulation generating a first set of performance data that includes at least a predicted measurement quality of the measurement sensor of the first BHA as a function of reproduceability;
executing a second simulation without drilling of a second BHA that includes at least a drill bit, a measurement sensor, and a stabilizer, the second simulation generating a second set of performance data that includes at least a predicted measurement quality of the measurement sensor of the second BHA as a function of reproduceability, and
the computing device comprising a graphical user interface executing on the computer processor with functionality to perform:
receiving a selected drilling criteria;
presenting, on the graphical user interface, the first set of performance data from the first simulation;
presenting, on the graphical user interface, the second set of performance data from the second simulation; and
selecting the first BHA or the second BHA prior to drilling based on a comparison of the first set of performance data and the selected drilling criteria, the comparison including at least a comparison of the predicted measurement quality of the measurement sensor of the first BHA and the predicted measurement quality of the measurement sensor of the second BHA.

21. The system of claim 20, wherein generating the first and second sets of performance data includes determining predicted measurement quality based on at least one of BHA sag, drill string deformation, drill string bending, or spacing from magnetic components at the measurement sensor location.

22. The system of claim 20, wherein generating the first and second sets of performance data includes determining predicted measurement quality as a function of nearness to a borehole wall.

* * * * *